(12) United States Patent
Nishizeki et al.

(10) Patent No.: US 8,647,164 B2
(45) Date of Patent: Feb. 11, 2014

(54) ORGANIC ELECTROLUMINESCENT ELEMENT, PRODUCTION METHOD OF THE SAME, DISPLAY DEVICE, AND LIGHTING DEVICE

(75) Inventors: Masato Nishizeki, Hachioji (JP); Yoshiyuki Suzuri, Hino (JP)

(73) Assignee: Konica Minolta Holdings, Inc., Tokyo (JP)

( * ) Notice: Subject to any disclaimer, the term of this patent is extended or adjusted under 35 U.S.C. 154(b) by 181 days.

(21) Appl. No.: 13/472,202

(22) Filed: May 15, 2012

(65) Prior Publication Data

US 2012/0248972 A1 Oct. 4, 2012

Related U.S. Application Data

(62) Division of application No. 11/887,460, filed as application No. PCT/JP2006/307105 on Apr. 4, 2006, now Pat. No. 8,466,612.

(30) Foreign Application Priority Data

Apr. 6, 2005 (JP) .................. 2005-109551

(51) Int. Cl.
*H01J 9/24* (2006.01)
(52) U.S. Cl.
USPC ............................................. 445/24; 445/23

(58) Field of Classification Search
USPC ..................................................... 445/23, 24
See application file for complete search history.

(56) References Cited

U.S. PATENT DOCUMENTS

| | | | |
|---|---|---|---|
| 2002/0127877 A1 | 9/2002 | Shibata et al. |
| 2004/0135503 A1 | 7/2004 | Handa et al. |

FOREIGN PATENT DOCUMENTS

| | | | |
|---|---|---|---|
| JP | 03-269995 | A | 12/1991 |
| JP | 10-077467 | A | 3/1998 |
| JP | 11-273859 | A | 10/1999 |
| JP | 2004-247161 | A | 9/2004 |
| JP | 2004-281382 | A | 10/2004 |
| JP | 2004-342407 | A | 12/2004 |
| JP | 2005-038816 | A | 2/2005 |

*Primary Examiner* — Anh Mai
*Assistant Examiner* — Zachary J Snyder
(74) *Attorney, Agent, or Firm* — Holtz, Holtz, Goodman & Chick, PC

(57) ABSTRACT

An organic electroluminescent element includes a laminated body incorporating an anode substrate, an anode, at least one non-light emitting organic layer A exhibiting positive hole transportability, at least one light emitting organic layer B, at least one non-light emitting organic layer C exhibiting electron transportability, a cathode, and a cathode substrate in the sequence set forth. At least 80% by weight of the organic layer A and the organic layer C in the laminated body is formed via a wet process, and the laminated body is made with an adhesion process between the organic layer A and the organic layer B, or between the organic layer B and the organic layer C.

3 Claims, 25 Drawing Sheets

ORGANIC ELECTROLUMINESCENT ELEMENT, PRODUCTION METHOD OF THE SAME, DISPLAY DEVICE, AND LIGHTING DEVICE

This is a Divisional of U.S. application Ser. No. 11/887,460, filed Sep. 28, 2007, now U.S. Pat. No. 8,466,612 which is a U.S. National Phase Application of International Application PCT/JP2006/307105, filed Apr. 4, 2006, and claims the benefit of priority from Japanese Patent Application No. 2005-109551, filed Apr. 6, 2005, the entire contents of all of which are incorporated herein by reference.

TECHNICAL FIELD

The present invention relates to an organic electroluminescent element, a production method of the same, a display device, and a lighting device, and in more detail, to an organic electroluminescent element exhibiting high efficiency at low cost, a production method of the same, a display device, and a lighting device.

BACKGROUND

In recent years, the use of organic electroluminescent (EL) elements has been investigated in display devices such as a flat display and light sources in electrophotographic copiers and printers.

The above organic EL elements are electric current driving type light emitting elements in which a very thin film of fluorescent organic compounds is sandwiched between an anode and a cathode, and light is emitted due to flow of the electric current. Generally, organic materials are insulators, but it is possible to inject an electric current when the thickness of the organic layer is markedly decreased, whereby it is possible to drive it as an organic EL element. Further, at a low voltage of at most 10 V, it is possibly to achieve driving. Due to that, it is possible to realize highly efficient light emission, whereby attention has been paid as a future display.

Specifically, S. R. Forrest et al. have recently discovered a phosphorescence emitting organic EL element utilizing an excited triplet state, realizing an efficiency, which significantly exceeds that of conventional organic EL element utilizing a singlet state (Appl. Phys. Lett. (1999), 75(1), 4-6). Further, as reported by Adachi et al. (J. Appl. Phys., 90, 5048 (2001)), luminous efficiency reached even 60 lm/W and the resulting element is expected to be applicable not only to display but also for applications as lighting sources.

When lighting devices employing an organic EL elements are produced, it is essential to consider the following aspects.

At present, organic EL materials are of low molecular weight based types and also polymer based types. Production of organic EL elements employing low molecular weight materials are carried out via evaporation under high vacuum. Low molecular weight materials are easily purified due to capability of sublimation purification, whereby it is possible to employ highly pure organic EL materials. Further, since it is easy to realize a laminated layer structure, whereby excellent efficiency and shelf life are realized.

However, since vapor deposition is carried out under high vacuum of at most $10^{-4}$ Pa, operation becomes complex, resulting in an increase in cost, whereby preference is not always realized in terms of production. Specifically, for lighting applications, it is essential to form an organic EL element of a large area, whereby vapor deposition becomes a difficult production process. Further, in regard to a phosphorescent dopant which is employed in phosphorescence emitting organic EL elements, it is difficult to introduce, to an organic EL element, a plurality of uniform dopants of a large area via vapor deposition. Consequently, in terms of cost and technology, such process is currently considered to be very difficult.

Contrary to the above, in regard to polymer based materials, for their production, it is possible to employ wet processes such as spin coating or ink-jet printing. Namely, since it is possible to carry out production under atmospheric pressure, advantages result in which cost is lowered. Further, since a thin film is produced employing a previously prepared solution, features result in which dopants are easily regulated and non-uniformity tend to not result even in a large area. It may be stated that the above features are very advantageous in the aspect of cost and production technologies for lighting use of organic EL elements.

However, when the wet process is employed in the polymer based materials, it is difficult to realize a laminated layer structure. When a second layer is laminated onto a first layer, the polymer materials are dissolved in solvents of the second layer to result in blending of the first and second layers. Due to that, compared to production of elements employing low molecular weight materials, production efficiency is commonly degraded.

Polymer based organic EL elements are commonly produced via a spin coating method, an ink-jet method or printing.

The spin coating method is only applicable to sheets, making it impossible to achieve continuous production. The ink-jet method is very useful for production of the display via a three-color light emitting system, but is not preferable, in terms of productivity, for production of light emitting devices such as displays for lighting or via a color exchange system, in which one side is subjected to light emission of the same color.

Consequently, production employing a printing method, has been proposed (refer, for example, to Patent Documents 1-3). The printing method is a useful film forming method due to its high simplicity and is a method of forming layers one by one. Consequently, if formation of a multi-layered structure is demanded, it is necessary that after making one layer, the following layer be formed. Due to that, productivity is low, and further, the apparatus is large and the number of processes increase, whereby the resulting cost increases. Further, when polymers, which are soluble in organic solvents, are laminated, a problem occurs in which two adjacent layers are blended.

Patent Document 1: Japanese Patent Publication Open to Public Inspection (hereinafter referred to as JP-A) No. 3-269995

Patent Document 2: JP-A No. 10-77467

Patent Document 3: JP-A No. 11-273859

DISCLOSURE OF THE INVENTION

Problems to be Solved by the Invention

An object of the present invention is to provide an organic EL element exhibiting high light emitting "efficiency", a highly efficient production method of an organic EL element of employing a wet process, a display device, and a lighting device.

Means to Solve the Problems

The above object of the present invention was achieved employing the following embodiments.

1. In an organic electroluminescent element composed of a laminated body incorporating an anode substrate, an anode, at least one non-light emitting organic layer A exhibiting positive hole transportability, at least one light emitting organic layer B, at least one non-light emitting organic layer C exhibiting electron transportability, a cathode, and a cathode substrate in the stated order, an organic electroluminescent element wherein in the aforesaid laminated body, at least 80% by weight of the organic layer constituting aforesaid organic layer A and aforesaid organic layer C is formed via a wet process, and an adhesion structure between aforesaid organic layer A and aforesaid organic layer B, or between aforesaid organic layer B and aforesaid organic layer C is formed.

2. The organic electroluminescent element, described in 1. above, wherein aforesaid organic layer B is formed via a transfer method.

3. The organic electroluminescent element, described in 1. or 2. above, wherein the aforesaid anode substrate or cathode substrate is composed of flexible materials.

4. In a production method of an organic electroluminescent element composed of a laminated body incorporating an anode substrate, an anode, at least one non-light emitting organic layer A exhibiting positive hole transportability, at least one light emitting organic layer B, at least one non-light emitting organic layer C exhibiting electron transportability, a cathode, and a cathode substrate in the stated order, a production method of an organic electroluminescent element, composed of: (a-1) a process which laminates, on an anode substrate, a partially laminated body incorporating the aforesaid anode substrate, anode, and organic layer A in the stated order; (a-2) a process which laminates, on the cathode substrate, a partially laminated body incorporating the aforesaid cathode substrate, cathode and organic layer C; (a-3) a process in which aforesaid organic layer B is formed on a temporary support; (b) a process in which aforesaid organic layer B is transferred onto the organic layer side of the partially laminated body on the aforesaid anode substrate or the partially laminated body on the cathode substrate by facing and laminating the organic layer B side of the partially laminated body on the aforesaid anode substrate or the partially laminated body on the cathode substrate with organic layer B side on the aforesaid temporary support, followed by at least a heat treatment or a pressure treatment; (c) a process which forms a laminated body by facing the organic layer B side of the substrate to which aforesaid organic layer B has been transferred with the organic layer side of the partially laminated body on another substrate to which aforesaid organic layer B has not been transferred, followed by at least a heat treatment or a pressure treatment; and (d) a process in which the entire periphery of the side of the aforesaid laminated body is sealed via an adhesive.

5. The production method of an organic electroluminescent element, described in 4. above, incorporating a process in which at least one organic layer B formed on the aforesaid temporary support incorporates a process in which B, G, and R three-color light emitting pixels are subjected to patterning.

6. An organic electroluminescent element, wherein production is achieved employing the production method of an organic electroluminescent element described in 4. or 5. above.

7. The organic electroluminescent element, described in any one of 1.-3. and 6., wherein light emission is due to phosphorescence.

8. A display device incorporating the organic electroluminescent element described in any one of 1.-3., 6., and 7. above.

9. A lighting device incorporating the organic electroluminescent element described in any one of 1.-3., 6., and 7. above.

Effects of the Invention

The present invention enables to provide an organic EL element exhibiting high light emission luminance, a production method of an organic EL element resulting in high production efficiency by employing a wet process, a display device and a lighting device.

Figure 1:
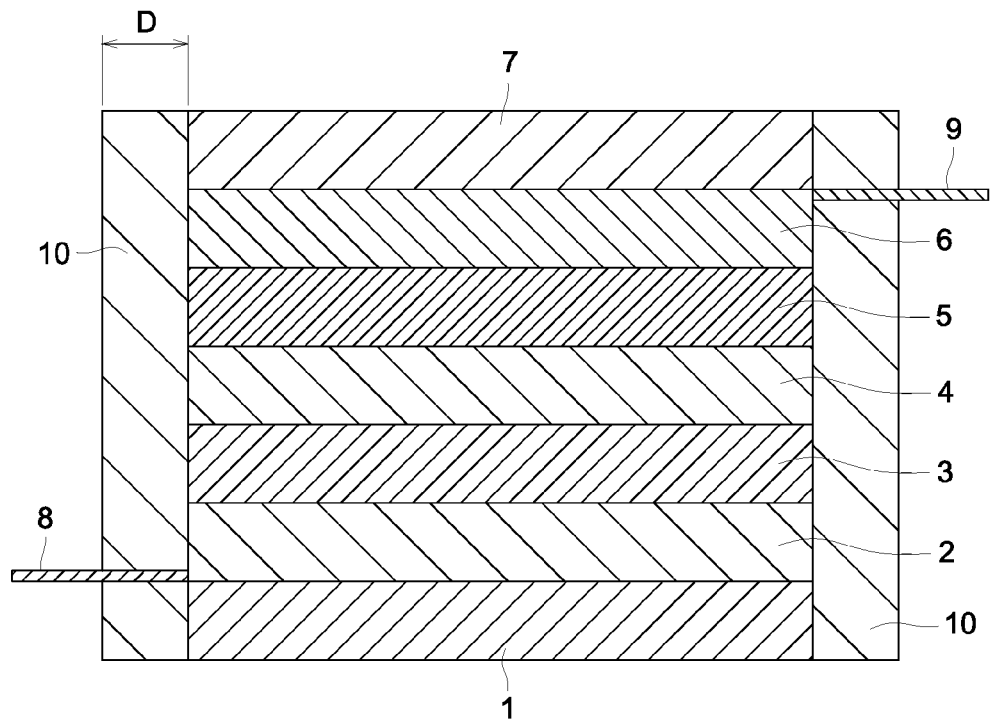
FIG. 1 is a sectional view showing one example of the layer configuration of the organic EL element of the present invention.

DESCRIPTION OF DESIGNATIONS 1 anode substrate
2 anode
3 non-light emitting organic layer exhibiting positive hole transportability
4 light emitting organic layer
5 non-light emitting organic layer exhibiting electron transportability
6 cathode
7 cathode substrate
8 anode lead
9 cathode lead
10 adhesive agent layer
11 moisture and oxygen absorbing layer
101 coating apparatus (coating means)
101A applicator roller
101B metering roller
102 primary transfer sheet
103 pressing plate
103A projection of pressing plate
104 drying apparatus (drying means)
105 transfer apparatus (transfer means)
106 transfer zone
107 substrate supporting base
110 transfer sheet
120 feeding roller
130 winding roller
M mask
MA aperture section
P pattern material

BEST MODE FOR CARRYING OUT THE INVENTION

By structuring the organic electroluminescent element of the present invention, as specified by any one of claims 1-3, claim 6, and claim 7, it was possible to provide an organic EL element exhibiting high luminance "efficiency", a production method of an organic EL element resulting in high production efficiency by employing a wet process, a display device and a lighting device.

Further, the inventors of the present invention conducted diligent investigations and achieved the present invention by discovering that it was possible to prepare an organic EL element composed of a multilayer at low cost when the constituting layer of the organic EL element was divided into a plurality of sections, each of which was prepared via a method in which primarily a wet process was mainly employed and integration was carried out via transfer and adhesion of each of the sections.

Further, the inventors of the present invention achieved the present invention by discovering that it was possible to produce a high performance organic EL element while increasing productivity via an increase in the degree of parallel of production processes by setting a division position between the non-light emitting organic layer exhibiting positive hole transportability and the light emitting organic layer, and between the light emitting organic layer and the non-light emitting organic layer exhibiting electron transportability when the structural layer of the organic EL element was divided into a plurality of sections.

Still further, the inventors of the present invention achieved the present invention by discovering that it was possible to prepare a high performance organic EL element while enhancing productivity due to an increase in the process yield in such a manner that when the structural layer of the organic EL element was prepared via division to a plurality of sections, at least one substrate was employed as one composed of flexible materials, whereby it was possible to retard formation of defects of the adhesion plane when the structural layer of the organic EL element was adhered.

Still further, the inventors of the present invention achieved the present invention by discovering that it was possible to prepare a high performance organic EL element while enhancing productivity due to an increase in the process yield in such a manner that when the structural layer of the organic EL element was prepared via division to a plurality of parts, and subsequently, integration was carried out via transfer and adhesion, during the initial transfer, the resulting structural layer and the light emitting layer were adhered onto a substrate, composed of flexible materials, whereby it is possible to reduce formation of defects on the adhesion plane.

The present invention will now be detailed.

(Layer Configuration)

A laminated body structuring the organic EL element of the present invention has a layer configuration composed of at least an anode substrate and an anode, a non-light emitting organic layer A incorporating at least one layer exhibiting positive hole transportability, organic layer B incorporating at least one layer exhibiting light emission, non-light emitting organic layer C incorporating at least one layer exhibiting electron transportability, a cathode, and a cathode substrate. Other than these, it is preferable to incorporate a moisture absorption layer and/or an oxygen absorption layer (hereinafter referred to as a moisture-oxygen absorption layer). It is preferable that non-light emitting organic layer A, which incorporates at least one layer exhibiting positive hole transportability, further incorporates a positive hole injecting layer and an electron blocking layer in addition to at least one positive hole transporting layer. It is preferable that non-light emitting organic layer C, which incorporates at least one layer exhibiting electron transportability, incorporates an electron injecting layer and a positive hole blocking layer in addition to at least one electron transporting layer. When the moisture-oxygen absorption layer is incorporated, the preferable layer configuration is: anode substrate/anode/organic layer/cathode/moisture-oxygen absorption layer/cathode substrate.

Preferable specific examples of the layer configuration of the organic EL element of the present invention are shown below; however, the present invention is not limited thereto.

(1) anode/positive hole transporting layer/electron transporting type light emitting layer/electron transporting layer/cathode
(2) anode/positive hole transporting layer/positive hole transporting type light emitting layer/electron transporting layer/cathode
(3) anode/positive hole injecting layer/electron transporting type light emitting layer/electron transporting layer/cathode
(4) anode/positive hole injecting layer/positive hole transporting type light emitting layer/electron transporting layer/cathode
(5) anode/positive hole injecting layer/positive hole transporting layer/electron transporting type light emitting layer/electron transporting layer/cathode
(6) anode/positive hole injecting layer/positive hole transporting layer/positive hole transporting type light emitting layer/electron transporting layer/cathode
(7) anode/positive hole transporting layer/electron transporting type light emitting layer/electron transporting layer/electron injecting layer/cathode
(8) anode/positive hole transporting layer/positive hole transporting type light emitting layer/electron transporting layer/electron injecting layer/cathode
(9) anode/positive hole injecting layer/positive hole transporting layer/electron transporting type light emitting layer/electron transporting layer/electron injecting layer/cathode
(10) anode/positive hole injection layer/positive hole transporting layer/positive hole transporting type light emitting layer/electron transporting layer/electron injecting layer/cathode Each of FIGS. 1-6 is a sectional view showing one example of the layer configuration of the organic EL element of the present invention.

In FIGS. 1-6, numeral 1 represents an anode substrate, 2 represents an anode, 3 represents a non-light emitting organic layer exhibiting positive hole transportability, 4 represents a light emitting organic layer, 5 represents a non-light emitting organic layer exhibiting electron transportability, 6 represents a cathode, 7 represents a cathode substrate, 8 represents an anode lead, 9 represents a cathode lead, 10 represents an adhesive layer, and 11 represents a moisture-oxygen absorbing layer.

FIG. 1 shows an example in which anode substrate 1 and cathode substrate 7 are of the same size, both of which are adhered without any shifting. The adhesion positions are between non-light emitting organic layer 3 exhibiting positive hole transportability and light emitting organic layer 4, as well as between light emitting organic layer 4 and non-light emitting organic layer 5 exhibiting electron transportability. Adhesive layer 10 covers the periphery of anode substrate 1, anode 2, non-light emitting organic layer 3 exhibiting positive hole transportability, light emitting organic layer 4, non-light emitting organic layer 5 exhibiting electron transportability, cathode 6, and cathode substrate 7.

Figure 2:
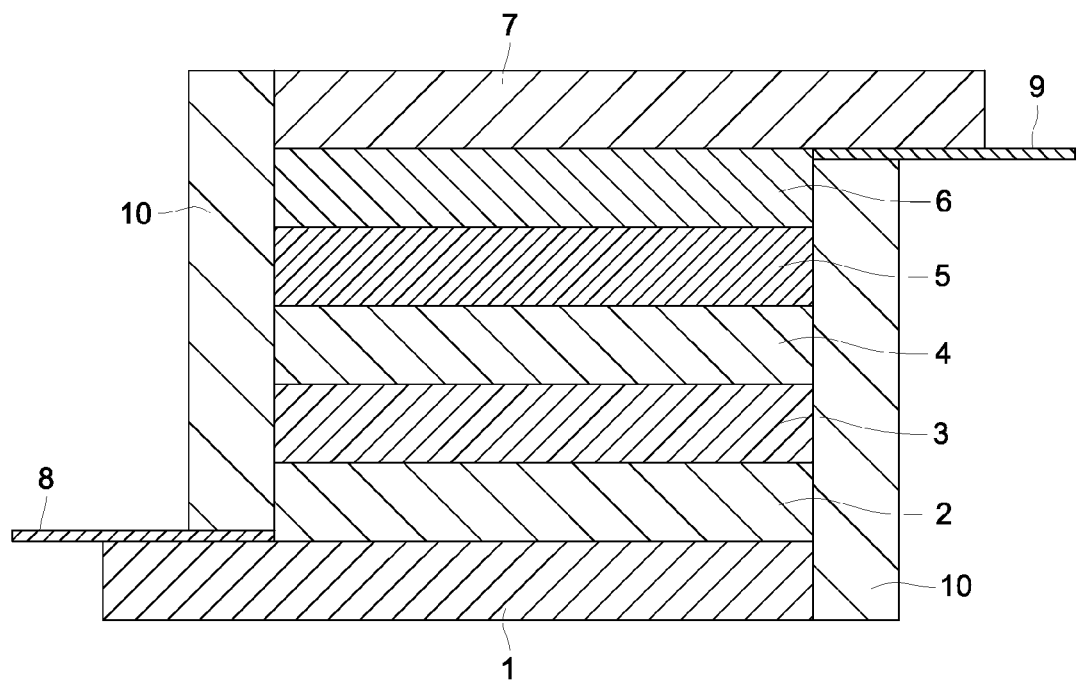
FIG. 2 is a sectional view showing another example of the layer configuration of the organic EL element of the present invention.

FIG. 2 shows an example in which anode substrate 1 and cathode substrate 7 are larger than anode 2 and cathode 6, respectively, and adhesion is carried out by shifting anode substrate 1 and cathode substrate 7. The adhesion positions may be the same as the examples shown in FIG. 1. Adhesive layer 10 covers the entire periphery of anode 2, non-light emitting organic layer 3 exhibiting positive hole transportability, light emitting organic layer 4, non-light emitting organic layer 5 exhibiting electron transportability, and cathode 6, and further covers the side of anode substrate 1 along the side of anode 2 and the side of cathode substrate 7 along with cathode 6.

Figure 3:
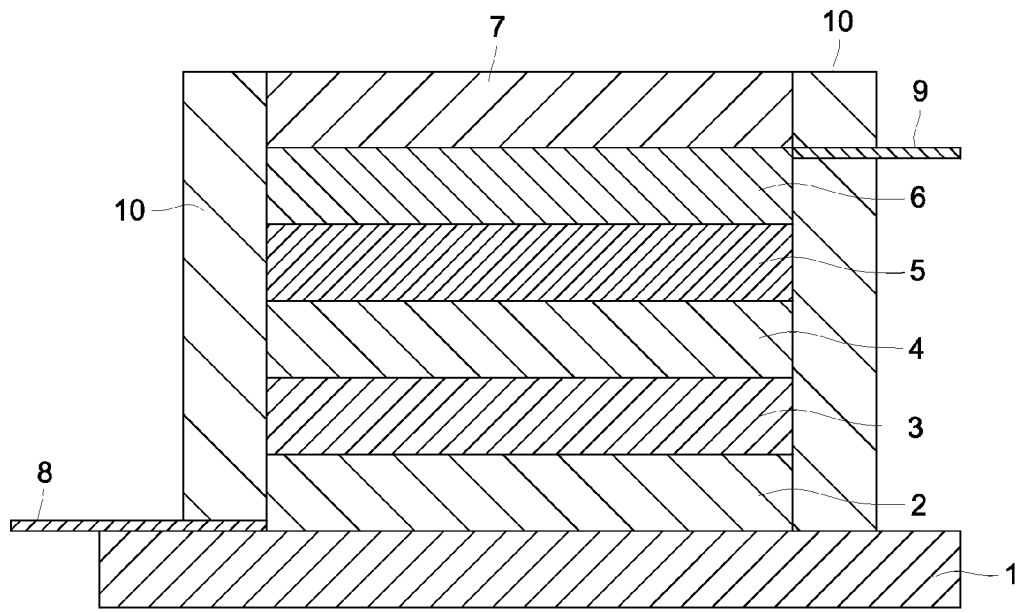
FIG. 3 is a sectional view showing yet another example of the layer configuration of the organic EL element of the present invention.

FIG. 3 shows an example in which anode substrate 7, which is in the same size as cathode 6, is adhered to anode substrate 1 which is larger than anode 2. The adhesion position may be the same as the example shown in FIG. 1. Adhesive layer 10 covers the entire periphery of anode 2, non-light emitting organic layer 3 exhibiting positive hole transportability, light emitting organic layer 4, non-light omitting organic layer exhibiting electrons transportability, cathode 6, and cathode substrate 7.

Figure 4:
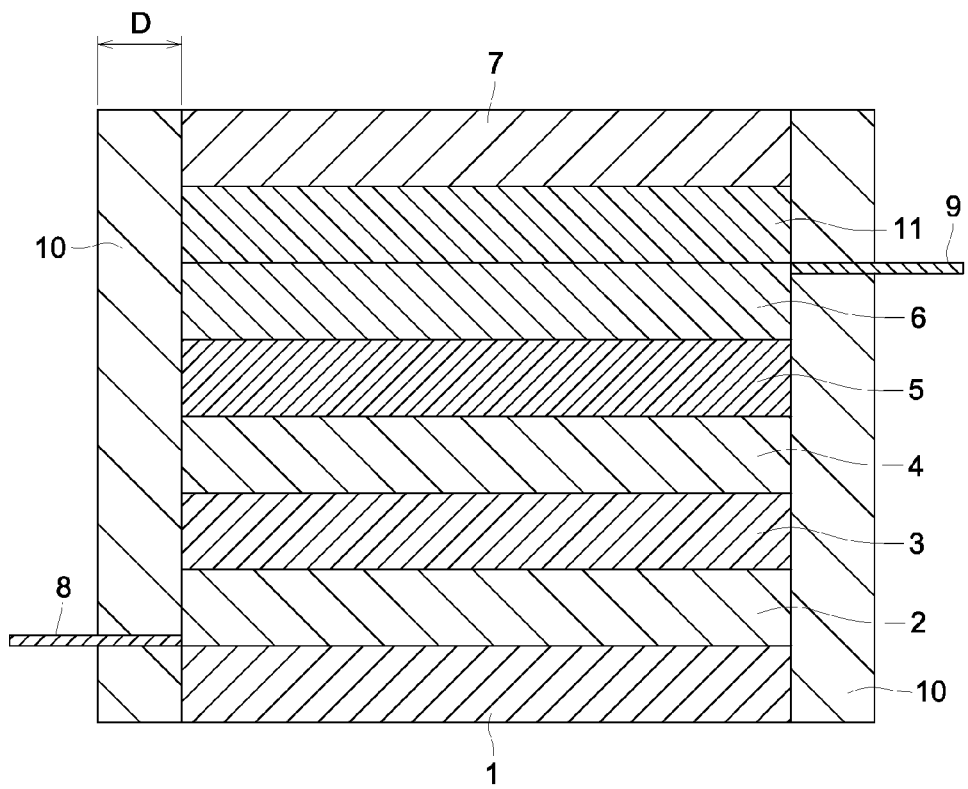
FIG. 4 is a sectional view showing one more example of the layer configuration of the organic EL element of the present invention.

FIG. 4 shows the constitution in which a moisture-oxygen absorbing layer is further added to the constitution of FIG. 1.

Figure 5:
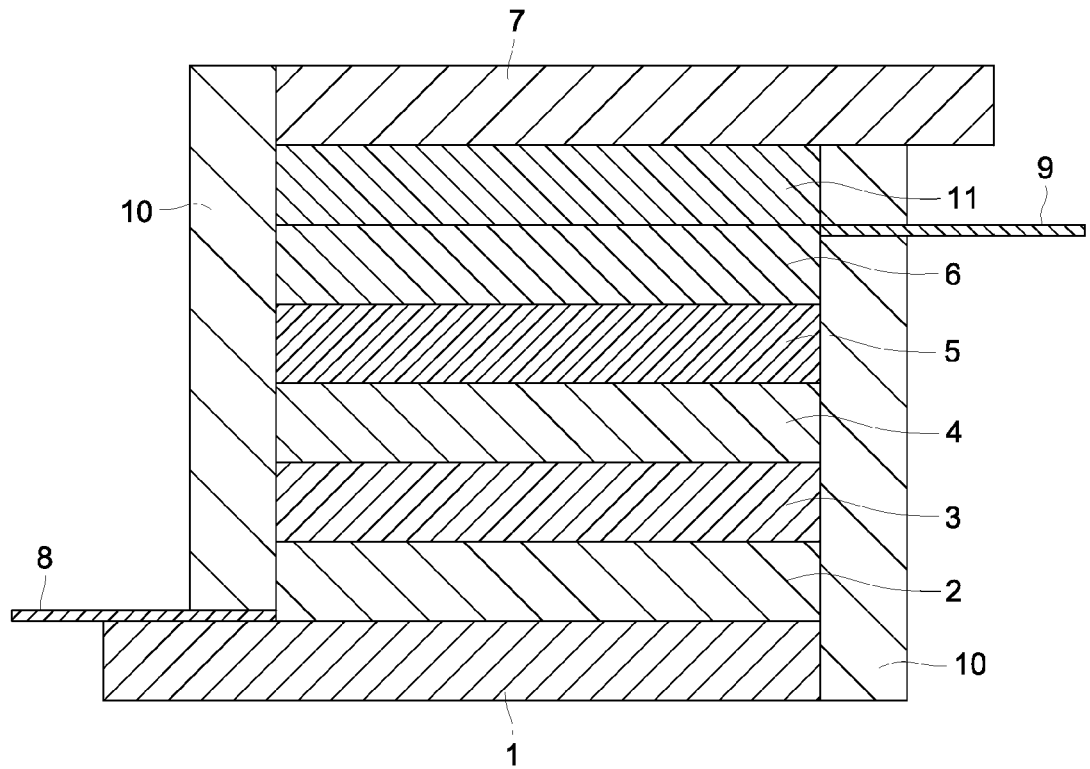
FIG. 5 is a sectional view showing a further example of the layer configuration of the organic EL element of the present invention.

FIG. 5 shows the constitution in which a moisture-oxygen absorbing layer is further added to the constitution of FIG. 2.

Figure 6:
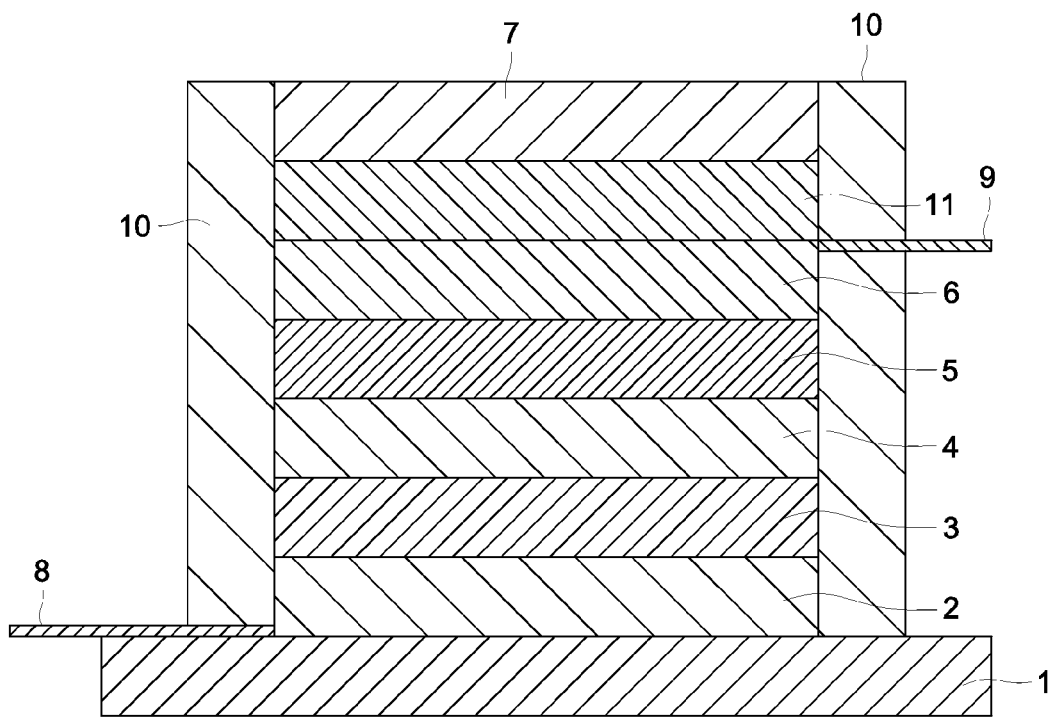
FIG. 6 is a sectional view showing yet one more example of the layer configuration of the organic EL element of the present invention.

FIG. 6 shows the constitution in which a moisture-oxygen absorbing layer is further added to the constitution of FIG. 3.

(Production Method)

The production method of the organic EL element of the present invention includes processes: (a-1) layer formation of an anode and at least one non-light emitting organic layer exhibiting electron transportability on an anode substrate, (a-2) layer formation of a cathode and at least one non-light emitting organic layer exhibiting electron transportability on a cathode substrate, and (a-3) layer formation of at least one light emitting organic layer on a temporary support, (b) transfer of the above light emitting layer to the organic layer on the above anode or cathode substrate in such a manner that the organic layer on the anode or cathode substrate is faced and overlapped with the light emitting layer and followed by at least one of a heating process or a pressing process, (c) after adhesion of mutual organic layers in such a manner that the organic layer on the anode or cathode substrate, which was not subjected to transfer of the light emitting layer is faced and overlapped with the light emitting layer, followed by at least one of a heating process and a pressing process, and (d) sealing the side of the resulting laminated body employing adhesives.

By employing an adhesion method, advantages are realized in which no extra sealing space is formed in the adhered interface to enhance durability and in addition, it is possible to efficiently prepare organic EL elements of a large area at lower cost. Adhesion methods include those in which adhesion is carried out via close contact, pressure adhesion, and fusion of the interface between two layers. During adhesion, it is preferable to apply heating and/or pressurization. Heating and pressurization may be carried out individually or in combination.

Usable heating means include common methods such as use of a laminator, an infrared heater, a roller heater, a heater, laser, or thermal head. When large area adhesion is performed, planar heating means are more preferred, which include laminators, infrared heaters, and roller heaters. Adhesion temperature is not particularly limited, which is variable depending on materials of organic layers and heating members. It is preferably 40-250° C., is more preferably 50-200° C., but is most preferably 60-280° C. However, the adhesion temperature relates to heating members, materials, and heat resistance of substrates, whereby it varies depending on enhancement of the heat resistance.

Pressurization means are not particularly limited. However, when substrates such as glass are employed, which are easily destroyed due to distortion, preferred are those which result in uniform pressurization. For example, it is preferable to employ a pair of rollers one of which is a rubber roller, or both of which are rubber rollers. Specifically, it is possible to employ laminators (for example, FAST LAMINATOR VA-400III, produced by Taisei Laminator Co., Ltd.) and thermal heads for thermal transfer printing.

(Adhesive Agents)

Adhesive agents employed in the organic EL elements of the present invention are not particularly limited, and usable examples include ultraviolet radiation curable resins, heat curable resins, double liquid type curable resins, moisture curable resins, anaerobic curable resins, hot-melt type resins. Of these, preferred are epoxy based adhesive agents which exhibit minimal moisture permeability and minimal oxygen permeability, and any of these which are of the ultraviolet radiation curable type, the heat curable and the double liquid curable type are preferred. Further, in view of the decrease in the number of processes and easiness, ultraviolet radiation curable types are preferred.

Coating methods of adhesive agents are not particularly limited, but the dispense method is preferably employed. The coated amount of adhesive agents is not particularly limited. When ultraviolet radiation curable type adhesive agents are employed, coating may be carried out so that the resulting film thickness is sufficient to absorb ultraviolet radiation. Further, when the double liquid mixing type is employed, its amount is not particularly limited as long as two liquids are sufficiently blended. In order to assure durability of organic EL elements, thickness D (refer to FIG. 1) of adhesive agents is preferably 0.1-5 mm.

Adhesive agents are applied onto the entire periphery of the side of a laminated body. Entire periphery of the side, as described herein, refers to the entire side of the laminated body composed of an anode substrate, an anode, an organic layer, a cathode, and a cathode substrate when the entire edge results in a uniform plane, as shown in Fig. (a). On the other hand, as shown in FIGS. 2(b) and 3, when the anode substrate or the cathode substrate is larger, it refers to the entire side of the laminated body excluding the larger substrate(s).

(Materials of Each Layer)

Materials which constitute each of the layers of the organic EL element of the present invention will now be detailed.

(a) Anode Substrate

Specific examples of the anode substrates employed in the present invention include inorganic materials such as zirconia-stabilized yttrium (YSZ) or glass, as well as organic materials such as polyesters including polyethylene terephthalate, polybutylene terephthalate, polyethylene naphthalate, and polystyrene, polycarbonate, polyether sulfone, polyallylate, polyimide, polycycloolefin, norbornene resins, poly(chlorotrifluoroethylene), or polyimide. It is preferable that employed organic materials exhibit excellent heat resistance, dimensional stability, solvent resistance, electrical insulation, and machinability.

Shapes, structures, and sizes of the anode substrate are not particularly limited. They may be appropriately selected based on their application and purposes. Commonly, the above shape is plate-like. The above structure may be of a single layer or a laminated layer. Further, the above substrate may be composed of a single material or at least two materials.

An anode substrate may be transparent and colorless or opaque. It is possible to provide a moisture permeation inhibiting layer (being a gas barrier layer) on the surface or rear surface (being on the anode side) of the anode substrate. Suitably employed as materials of the above moisture permeation inhibiting layer (being the gas barrier layer) are inorganic compounds such as silicon nitride or silicon oxide. It is possible to form the above moisture permeation inhibiting layer (being the gas barrier layer) employing methods such as a high frequency sputtering method.

If desired, a hard-coat layer and an under-coat layer may further be applied onto the anode substrate. The thermal linear expansion coefficient of the anode substrate is preferably at most 20 ppm/°C. The thermal linear expansion coefficient is determined by the method in which a sample is heated at a constant rate and the resulting variation of length is recorded, and determined mainly by the TMA method. When the thermal linear expansion coefficient exceeds 20 ppm/°C., during the adhesion process and use, electrodes and organic layers peel off due to heat, resulting in degradation of durability.

The water vapor permeability of the anode substrate, determined based on method of JIS K 7129-1992, is commonly at most 0.1 g/(m$^2$·24 hours) (25±0.5°C., and relative humidity (90±2)%), is preferably at most 0.05 g/(m$^2$·24 hours), is more preferably at most 0.01 g/(m$^2$·24 hours), but is most preferably at most 1×10$^{-3}$ g/(m$^2$·24 hours).

Further, oxygen permeability determined based on the method of JIS K 7126-1987 is commonly at most 0.1 ml/(m$^2$·24 hours·MPa), is preferably at most 0.05 ml/(m$^2$·24 hours·MPa), is more preferably at most 0.01 ml/(m$^2$·24 hours·MPa), but is most preferably at most 1×10$^{-3}$ ml/(m$^2$·24 hours·MPa).

By achieving the above regulation, it is possible to minimize penetration, into the interior of the organic EL element, of moisture and oxygen which result in degradation of durability.

(b) Anode

The above anode is commonly usable when it exhibits a function which supplies positive holes to the organic layer. The shapes, structures, and sizes are not particularly limited. Further, they may be appropriately selected based on the use and application of organic ELs.

Examples of suitable materials of the above anode include metals, alloys, metal oxides, electrically conductive organic compounds, and mixtures thereof. Materials which exhibit a work function of at least 4.0 eV are preferred. Specific examples include semiconductive metal oxides such as tin oxide (ATO and FTC) doped with antimony and fluorine, tin oxide, zinc oxide, indium oxide, indium tin oxide (ITO), zinc indium oxide (IZO); metals such as gold, silver, chromium, or nickel; mixtures or laminated materials of those metals with electrically conductive metal oxides; electrically conductive inorganic compounds such as copper iodide or copper sulfide; dispersions of the above semiconductive metal oxides or metal compounds, electrically conductive organic materials such as polyaniline, polythiophene, or polypyrrole, and laminated materials of these with ITO.

It is possible to form the above anode on a substrate or an organic layer, employing the method selected from chemical systems such as a vacuum deposition method, a sputtering method or an ion plating method upon considering suitability for the above materials.

Incidentally, the above anode patterning may undergo chemical etching such as photolithography or physical etching employing lasers. Further, a mask is overlapped and subsequently, vacuum deposition or sputtering may be carried out or a lift-off method or a printing method may also be carried out.

It is appropriately to select the thickness of the above anode, depending on the above materials, and it is not possible to specify it. However, the above thickness is commonly 10-50 μm, but is preferably 50-20 μm. The resistance value of the above anode is preferably at most 10$^6$Ω/□, but is more preferably at most 10$^5$Ω/□. When the value is at most 10$^6$Ω/□, it is possible to prepare a large area organic EL element of high performance via arranging the bus line electrode of the present invention. The above anode is colorless and transparent, or colored and transparent. In order to receive emitting light from the above anode side, transmittance is preferably at least 60%, but is more preferably at least 70%. It is possible to determine the above transmittance, employing the methods know in the art in which a spectrophotometer is employed.

(c) Cathode Substrate

Specific examples of the cathode substrate employed in the present invention include inorganic materials such as zirconia stabilized yttrium YSZ) or glass and organic materials such as polyesters and polyethylene naphthalate including polyethylene phthalate, polybutylene phthalate, as well as polystyrene, polycarbonate, polyethersulfone, polyallylate, polyimide, polycycloolefin, norbornene resins, poly(chlorotrifluoroethylene), and polyimide. In the case of organic materials, it is preferable that they exhibit excellent heat resistance, dimensional stability, solvent resistance, electrical insulation, and machinability.

Shapes, structures, and sizes of anode substrates are not particularly limited. They may be appropriately selected based on their use and purpose of organic EL elements. Commonly, the above shape is plate-like. The above structure may be of a single layer structure or a laminated layer structure. Further, the above substrate may be composed of a single material or at least two materials.

The cathode substrate may be transparent and colorless or opaque. When the cathode substrate is opaque, a substrate support is preferred in which an insulation layer is provided on one side or both sides of the metal foil. Metal foils are not particularly limited, and usable foils include an aluminum foil, a copper foil, a stainless steel foil, a gold foil, and a silver foil. Of these, in view of ease of machining and cost, the aluminum foil or copper foil is preferred. Insulation layers are not particularly limited, and may be formed employing inorganic compounds such as an inorganic oxide or an inorganic nitride, polyesters such as polyethylene terephthalate, polybutylene phthalate, or polyethylene naphthalate, and plastics such as polystyrene, polycarbonate, polyether sulfone, polyacrylate, allyldiglycol carbonate, polyimide, polycyloolefin, norbornene resins, poly(chlorotrifluoroethylene), or polyimide.

The thermal linear expansion coefficient of the cathode substrate is preferably at most 20 ppm/° C. The thermal linear expansion coefficient is determined by the method in which a sample is heated at a constant rate and the resulting variation of length is recorded, and determined mainly by the TMA method. When the thermal linear expansion coefficient exceeds 20 ppm/° C., during a adhesion process and their use, electrodes and organic layers peel off due to heat, resulting in degradation of durability.

The thermal linear expansion coefficient of an insulation layer provided on the cathode substrate is preferably at most 20 ppm/° C. Preferred materials to form the insulation layer of at most 20 ppm/° C. include metal oxide such as silicon oxide, germanium oxide, zinc oxide, aluminum oxide, titanium oxide, or copper oxide, and metal nitrides such as silicone nitride, germanium nitride, or aluminum nitride. They may be employed individually or in combinations of at least two. The thickness of the organic insulation layer composed of metal oxide and/or metal nitride is preferably 10-1,000 nm. When the thickness of inorganic insulation layer is at most 10 nm, insulation capability becomes too low, while the thickness of the insulation layer is at least 1,000 nm, cracks tend to be formed followed by formation of pin holes and degradation of insulation. Methods to form an insulation layer composed of metal oxides and/or metal nitrides are not limited, and as the above methods, it is possible to utilize dry system methods such as a vapor deposition method, a sputtering method, a CVC method, wet system methods such as a sol-gel method, or methods in which metal oxide particles and/or metal nitride particles are dispersed into solvents and the resulting dispersion is coated.

As plastic materials of a thermal linear expansion coefficient of at most 20 ppm, it is possible to most preferably employ polyimide or liquid crystal polymers. Quality of these plastic materials is detailed in "Plastic Data Book" (edited by "Plastic" Editing Department of Asahi Kasei Amidas Corp.). When polyimide is employed as an insulation layer, it is preferable that a sheet composed of polyimide is laminated with an aluminum foil. The thickness of the sheet composed of polyimide is preferably 10-200 μm. When the thickness of the sheet composed of polyimide is at most 10 μm, during lamination, ease of handling is degraded. On the other hand, when the thickness of the sheet composed of polyimide is at least 200 μm, flexibility is lost to degrade the ease of handling. The insulation layer may be provided on one side or both sides of the metal foil. When provided on both sides, both sides may be composed of metal oxides and/or metal nitrides, or both sides may be a plastic insulation layer such as polyimide. Further, One side may be an insulation layer composed of metal oxides and/or metal nitrides, and the other may be an insulation layer composed of polyimide. If further desired, a hard-coat layer and an under-coat layer may be arranged.

Water vapor permeability (25±0.5° C., relative humidity (90±2) %) of the cathode substrate, determined by the method based on JIS K 7129-1992 is commonly 0.1 g/(m$^2$·24 hours), is preferably at most 0.05 g/(m$^2$·24 hours), is more preferably 0.01 g/(m$^2$·24 hours), but is most preferably 1×10$^{-3}$ g/(m$^2$·24 hours).

Oxygen permeability of the cathode substrate, determined by the method based on JIS K 7126-1987 is commonly 0.1 ml/(m$^2$·24 hours·MPa), is preferably at most 0.05 ml/(m$^2$·24 hours·MPa), is more preferably 0.01 ml/(m$^2$·24 hours·MPa), but is most preferably 1×10$^{-3}$ ml/(m$^2$·24 hours·MPa).

By regulating as above, it becomes possible to minimize permeation of water vapor and oxygen which result in degradation of durability of the interior of organic El elements. As such materials, it is possible to employ the same materials described above.

(d) Cathode

Shapes, structures, and sizes of cathodes are not particularly limited as long as they function as a cathode which injects electrons into the above organic layer. Accordingly, it is possible to select them from electrodes known in the art, depending on their use and purpose.

Examples of preferred materials of the above cathode include metals, alloys, metal oxides, electrically conductive materials, and the mixtures thereof. Those of a work function of at most 4.5 eV are preferred. Specific examples include alkaline metals (for example, Li, Na, K, and Cs), alkaline earth metals (for example, Mg and Ca), gold, silver, lead, aluminum, sodium, sodium-potassium alloy, lithium-aluminum alloy, magnesium-silver alloy, and rare earth metals such as indium or ytterbium. These may be employed singly, but may be employed in combination of at least two types in view of realizing stability and of making electron injecting properties compatible.

Of these, in terms of electron injecting properties, alkaline metals and alkaline earth metals are preferred. In view of excellent retention stability, materials which incorporate aluminum as a main component are preferred. "Materials which incorporate aluminum as a main component", as described herein, refer to aluminum itself, aluminum alloys, and mixtures (for example, lithium-aluminum alloy, or magnesium-aluminum alloy) incorporating alkali metals or alkaline earth metals in an amount of 0.01-10% by weight.

The above materials of cathodes are detailed in Japanese Patent Publication No. 2-15595 and JP-A No, 5-121172.

Methods to form the above cathode are not particularly limited, and in the present invention, the formation is carried out in equipment under vacuum. It is possible to form the cathode on the above substrate, employing the method such as a physical system including a vacuum deposition method, and a sputtering method, or a chemical system including CVD and a plasma CVD method, which is appropriately selected upon considering adaptability with the above materials. For example, when metals are selected as a cathode material, one type or at least two types may be employed simultaneously or sequentially via the sputtering method.

Meanwhile, the above cathode patterning may undergo chemical etching such as photolithography or physical etching employing lasers. Further, a mask is overlapped and subsequently, vacuum deposition or sputtering may be carried out or a lift-off method or a printing method may also be carried out.

Further, a dielectric layer at a thickness of 0.1-5 nm, composed of above alkali metals or above alkali earth metals may be inserted between the above cathode and the above organic layer. Meanwhile, it is possible to form the above dielectric layer, employing any of the methods such as a vacuum deposition method, a sputtering method, or an ion plating method.

It is not possible to definitely specify the thickness of the above cathode since it may be suitably selected depending on the materials. However, the above thickness is commonly 10 nm-5 μm, but is preferably 50 nm-1 μl.

(e) Organic Layer

In the present invention, the above organic layer is composed of at least one non-light emitting organic layer exhibiting positive hole transportability, at least one light emitting organic layer, and at least one non-light emitting layer exhibiting electron transportability. In this specification of the present invention, term "dielectric" refers to the compound itself and derivatives thereof.

(1) Light Emitting Layer

A light emitting layer employed in the present invention is composed of at least one type of a light emitting material, and if desired, may incorporate positive hole transporting materials, electron transporting materials, and host materials.

The light emitting layer is composed of a mixture of host materials and dopants. "Host" and "dopant" in the light emitting layer refers to the following. The light emitting layer is composed of at least two types of compounds, and in the above two types of compounds, the compound of a higher mixing ratio (by weight) is a host, while the compound of a lower mixing ratio is a dopant.

The mixing ratio of the dopant is preferably 0.001-50% by weight, while the mixing ratio of the host is preferably 50-100% by weight.

Two principles are listed. One principle is an energy transfer type in which that the excited state of a host compound is formed via recombination on a host to which hosts are transported and the resulting energy is transferred to dopants, followed by light emission from the dopants. The other is a carrier trap type in which dopants trap carriers and recombination of carriers occurs on the dopant compound, followed by light emission from the dopants. In either case, a condition is that the energy of the excited state of dopant compounds is lower than that of the excited state of host compounds.

Further, in the energy transfer type, a preferred condition, in which energy transfer is easily conducted, is a larger overlap integral of light emission of the hosts and absorption of the dopants. In the carrier trap type, a necessary relationship is that carrier trapping easily occurs. For example, in carrier trapping of electrons, it is necessary that the level of electron affinity (LUMO) of the dopant is higher than that of the host. On the other hand, in carrier trapping of carriers, it is necessary that ionization potential (being HOMO level) of the dopant is lower than that of the dopant.

Based on the above, it is possible to select dopant compounds as a dopant, considering luminescent color including color purity and light emission efficiency, while dopant compounds are selected from those which result in desired carrier transportability and satisfy the above energy relationship.

Light emitting dopants employed in the present invention are not particularly limited and those are employable which are fluorescence emitting compounds or phosphorescence emitting compounds. Examples of fluorescence emitting compounds include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyralidine derivatives, cyclopentadiene derivatives, bisstyrylanthracene derivatives, quinacridone derivatives, pyrrolopyridine derivatives, thiadiazopyridine derivatives, styrylamine derivatives, aromatic dimethylidene derivatives, various metal complexes represented by metal complexes and rare earth complexes of 8-quinolynol derivatives, and polymer compounds such as polythiophene derivatives, polyphenylene derivatives, polyphenylenevinylene derivatives, or polyfluorene derivatives. These may be employed individually or in combinations of at least two types.

Phosphorescence emitting compounds are not particularly limited, but orthometal metal complexes or porphyrin metal complexes are preferred. Orthometal metal complexes, as described herein, include all compounds described, for example, in Akio Yamamoto, "Yuki Kinzoku Kagaku—Kiso to Oyo—(Organic Metal Chemistry—Base and Application—" pages 150 and 232, Shokabo Sha (published in 1982), and H. Yersin, "Photochemistry and Photophysics of Coordination Compounds" pages 71-77, 135-146, Springer-Verlag Co. (published in 1987). The above organic layer incorporating the above orthometal metal complexes is advantageous due to realization of high luminance and excellent light emission efficiency.

Various ligands, which form the above orthometal metal complexes, are available and are described in the above references. Of these, the most preferable ligands include 2-phenylpyrindien derivatives, 7,8-banzoquinoline derivatives, 2-(2-thienyl)pyridine derivatives, 2-(1-naphthyl)pyridine derivatives, and 2-phenylquinoline derivatives. If desired, these derivatives may have substituents. The above orthometal metal complexes may have other ligands other than the above ligands.

It is possible to synthesize orthometal metal complexes employed in the present invention via various methods known in the art such as Inorg. Chem. 1991, No. 30, page 1,685, ibid. 1988, No. 27, page 3,469, ibid. 1994, No. 33, page 545, Inorg. Chim. Acta 1991, No. 181, page 245, J. Organomet. 1987, No. 335, page 293, or J. Am. Chem. Soc. 1985, No. 107, page 1,431. Of the above orthometal complexes, in the present invention, in view of enhancement of the light emitting efficiency, it is possible to preferably employ compounds which emit light from a triplet state excimer. Further, of porphyrin metal complexes, preferred are porphyrin platinum complexes. The above phosphorescence emitting compounds may be employed individually or in combinations of at least two types. Further, the above fluorescence emitting compounds and phosphorescence emitting compounds may be simultaneously employed. In the present invention, in view of luminance of emitted light and light emitting efficiency, it is preferable to employ the above phosphorescence emitting compounds.

As the above positive hole transporting materials, it is possible to employ any of the low molecular weight positive hole transporting materials and polymer positive hole transporting materials. They are not limited as long as they exhibit any of the functions which inject positive holes from the anode, transport positive holes, and block electrons injected from the cathode. Examples of such materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylydene based compounds, porphyrin based compounds, as well as polymer compounds such as polysilane based compounds, poly(N-vinylcarbazole) derivatives, aniline based copolymer, thiophene oligomer, electrically conductive polymer oligomer such as polythiophene, polythiophene derivatives, polyphenylene derivatives, polyphenylenevinylene derivatives, or polyfluorene derivatives. They may be employed individually or in combinations of at least two types.

The content of the above positive hole transporting materials in the above light emitting layer is preferably 0-99.9% by weight, but is more preferably 0-80% by weight.

The above electron transporting materials are not limited as long as they exhibit any of the functions which transport electrons, and block positive holes injected from the anode. Examples of such materials include triazole derivatives, oxazole derivatives, oxadiazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxyl anhydrides, phthalocyanine derivatives, various metal complexes represented by metal complexes of 8-quinolyl derivatives and metal phthalocyanine, metal complexes having, as a ligand, benzoxazole, or benzothiazole, aniline based copolymer, electrically conductive polymer oligomers such as polythiophene, and polymer compounds such as polythiophene derivatives, polyphenylene derivatives, polyphenylene derivatives, or polyfluorene derivatives.

The content of the above electron transporting materials in the above light emitting layer is preferably 0-99.9% by weight, but is more preferably 0-80% by weight.

The above host compounds refer to those which allow compounds capable of emitting fluorescence or phosphorescence to emit luminescence so that energy transfer occurs from the excited state of the host compound to compounds capable of emitting fluorescence or phosphorescence. The above host materials are not particularly limited as long as they are capable of achieving transfer of excitation energy to light emitting materials, and may be appropriately selected depending on their use. Specifically listed are carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene based compounds, porphyrin based compounds, anthaquinodimethane derivatives, anthrone derivatives, diphenylquinone derivatives, thiopyrandioxide derivatives, carbodiimide derivatives, fluorenylidenemethane derivatives, distyrylpyrazine derivatives, heterocyclic tetracarboxylic anhydrides such as naphthaleneperylene, phthalocyanine derivatives, various metal complexes represented by metal complexes of 8-quinolyl derivatives and metal complexes in which metal phthalocyanine, benzoxazole, or benzothiazole is employed as a ligand, polysilane based compounds, poly(N-vinylcarbazole) derivatives, aniline based copolymers, electrically conductive polymer oligomers such as thiophene oligomer or polythiophene, and polymer compounds such as polythiophene derivatives, polyphenylene derivatives, or polyfluorene derivatives.

Preferred as host materials are compounds which exhibit positive hole transportability and electron transportability, minimize an increase in wavelength of emitted light and further exhibit relatively high Tg (glass transition temperature).

It is possible to prepare such compounds in such a way that the π electron plane is modified to a non-plane, utilizing effects such as steric hindrance. For example, a substituent which results in steric hindrance is introduced into the ortho position (viewed from the nitrogen atom) of the aryl group of triarylamine, whereby the twist angle increases. Namely, by effectively arranging, in an organic compound, steric hindrance-resulting substituents such as a methyl group, a t-butyl group, an isopropyl group, or a peri position hydrogen atom of a naphthyl group, it is possible to prepare a light emitting material which emits short wavelength light without lowering the Tg of positive hole transporting materials exhibiting a relatively high Tg and electron transporting materials exhibiting a relatively high Tg, even though the resulting positive hole transportability and electron transportability are slightly degraded. In this regard, substituents are not limited thereof.

Further, when a group, which is conjugated to the aromatic ring, is introduced, it is also possible to prepare the above compounds via introduction to a non-conjugated position (for example, in the case of triphenylamine, the meta-position of the phenyl group).

The above host compounds may be employed individually or in combinations of at least two types. The content of the above host compounds in the above light emitting layer is preferably 0-99.9% by weight, but is more preferable 0-99.0% by weight.

Specifically, in the present invention, if desired, as other components, employed may be electrically inactive polymer binders in the light emitting layer. Listed as electrically inactive polymers employed, when needed, may, for example, be polyvinyl chloride, polycarbonate, polystyrene, polymethyl methacrylate, polybutyl methacrylate, polyester, polysulfone, polyphenylene oxide, polybutadiene, hydrocarbon resins, ketone resins, phenoxy resins, polyamide, ethyl cellulose, vinyl acetate, ABS resins, polyurethane, melamine resins, unsaturated polyester, alkyd resins, epoxy resins, silicone resins, polyvinyl butyral, and polyvinyl acetal. When the above light emitting layer incorporates the above polymer binders, advantages result in which it is easily to form the above light emitting layer of a large area via a wet system film forming method and the degree of lamination is improved.

(2) Injection Layer (Buffer Layer)

When needed, injection layers are provided, which include an electron injecting layer and a positive hole injection layer. As noted above, may be arranged between the anode and the light emitting or positive hole transporting layer, or between the cathode and the light emitting layer or electron transporting layer.

The injection layer, as described herein, refers to the layer provided between the electrode and the organic layer to lower driving voltage and to enhance light emission efficiency, and is detailed in Chapter 2 "Denkyoku Zairyo (Electrode Materials)(pages 123-166)" of Second Part of "Yuuki EL Soshi to Sono Kogyoka Saizensen (Organic El Elements and Frontier of Their Industrialization)" (published by NTS Co. Nov. 30, 1998), and includes a positive hole injection layer (being an anode buffer layer) and an electron injecting layer (being a cathode buffer layer).

The anode buffer layer (being the positive hole injection layer) is detailed in JP-A Nos. 9-45479, 9-260062, and 8-1288069. Specific examples include a phthalocyanine buffer layer represented by copper phthalocyanine, an oxide buffer layer represented by vanadium oxide, an amorphous carbon buffer layer, and a polymer buffer layer employing electrically conductive polymers such as polyaniline (emraldine) or polythiophene.

The cathode buffer layer (being the electron injecting layer) is detailed in JP-A Nos, 6-325871, 9-17574, and 10-74586. Specific examples include a metal buffer layer represented by strontium and aluminum, an alkaline metal compound buffer layer represented by lithium fluoride, an alkaline earth metal compound buffer layer represented by magnesium fluoride, and an oxide buffer represented by aluminum oxide.

It is preferable that the above buffer layer (the injection layer) is a very thin film. The thickness is preferably in the range of 0.1-100 nm though varied depending on components.

(3) Blocking Layer

As noted above, if needed, the blocking layer is provided other than the basic structuring layer composed of a thin organic compound film. Its examples include the positive hole blocking (hole blocking) layer described in JP-A No. 11-204359, and "Yuuki EL Soshi to Sono Kogyoka Saizensen (Organic El Elements and Frontier)", N T S Co. Nov. 30, 1998).

In a broad sense, the positive hole blocking layer refers to the electron transporting layer, which is composed of materials capable of transporting elections while exhibiting minimal capability to transport positive holes. By transporting electrons while blocking positive holes, it is possible to enhance the recombination probability of electrons and positive holes.

On the other hand, in a broad sense, the electron blocking layer refers to the positive hole transporting layer which is composed of materials capable of transporting positive holes while exhibiting minimal capability to transport electrons. By transporting positive holes while blocking electrons, it is possible to enhance the recombination probability of electrons and positive holes.

(4) Positive Hole Transporting Layer

The positive hole transporting layer, as described herein, is composed of materials which exhibit a function to transport positive holes. In a broad sense, the positive hole injecting layer as well as the electron blocking layer is included in the positive hole transporting layer.

The positive hole transporting layer may be prepared employing a single layer or a plurality of layers. Positive hole transporting materials are not particularly limited, and it is possible to employ any of the materials which are selected from those commonly used as charge injection transporting materials of positive holes and those, known in the art, which are used in the positive hole injecting layer and the positive hole transporting layer of EL elements.

Positive hole transporting materials exhibit any of the injection or transportation of positive holes and blocking of electrons, and may be either organic materials or inorganic materials. Examples thereof include triazole derivatives, oxadiazole derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline based copolymer, and electrically conductive polymer oligomer, particularly thiophene oligomer.

The above materials may be employed as positive hole transporting materials, but it is preferable to employ porphyrin compounds, aromatic tertiary amine compounds, and styrylamine compounds. Of these, it is particularly preferable to employ the aromatic tertiary amine compounds.

Representative examples of the aromatic tertiary amine compounds include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenol) propane; 1,1-bis(4-di-p-tolylaminophenyl)cyclohexane; N,N,N',N'-tetra-p-tolyl-4,4'-diaminobiphenyl; 1,1-bis(4-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bios (diphenylamino)quo-triphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostyl benzene, and N-phenylcarbazole. In addition, listed are those having two condensed aromatic rings in the molecule, such as 4,4'-bis[N-(1-naphthyl)-N-phenylamino]biphenyl (NPD), described in U.S. Pat. Nos. 5,061,569 and 4,4',4''-tris[N-(3-methylphenyl)-N-phenylamino]triphenylamine (MTDATA) in which triphenylamine units are connected to result in 3 star burst type, described in JP-A No. 4-308688.

Further, it is possible to employ polymer materials in which the above materials are introduced into the polymer chain, or they are employed as a main chain of polymers.

Still further, it is possible to employ inorganic compounds such as p type-Si or p type-SiC as a positive hole injecting material and a positive hole transporting material.

(5) Electron Transporting Layer

The electron transporting layer, as described herein, is composed of materials which exhibit a function to transport electrons. In a broad sense, the electron transporting layer includes an electron injecting layer and a positive hole blocking layer. It is possible to arrange the electron transporting layer composed of a single layer or a plurality of layers.

Electron transporting materials are not particularly limited. Any of the materials, known in the art, employed in electron transporting materials of conventional organic EL elements may be selected and employed.

Examples of the above electron transporting materials include phenanthroline derivatives, bipyridine derivatives, nitro-substituted fluorene derivatives, diphenylquinone derivatives, thiopyrandioxide derivatives, heterocyclic tetracarboxylic anhydrides such as naphthereneperylene, carbodiimide, fluorenylidenemethane derivatives, anthraquinodimethane and anthrone derivatives, and oxadiazole derivatives. Fu her, it is possible to employ, as an electron transporting material and an electron injecting material, thiadiazole derivatives in which in the above oxadiazole derivatives, the oxygen atom of the oxadiazole ring is replaced with a sulfur atom, as well as quinoxaline derivatives having a quinoxaline ring known as an electron attractive group.

Further, it is possible to employ polymer materials in which the above materials are introduced into the polymer chain, or these materials are employed as a main chain of the polymers.

Further, it is possible to employ metal complexes.

(6) Formation of Organic Layer

The above organic layer may desirably be prepared employing any of the dry system film making methods such as a vapor deposition method or a sputtering method, the wet system film making methods such as dipping, a spin coating method, a dip coating method, a casting method, a roller coating method, a bar coating method, or a gravure coating method, as well as the transfer method, and the printing method.

In order to realize high productivity, one of the features of the present invention is that at least 80% by weight of the organic layer on a substrate is prepared employing the wet process selected from the above wet system film making methods and the printing method. The film making ratio via the wet process varies depending on the types of materials of the organic layer, but the upper limit is 100% by weight.

Of the above methods, the wet system film making methods are advantageous in points such that it is possible to readily prepare the above organic layer of a large area and organic EL elements which exhibit high luminance and excellent light emitting efficiency are efficiently papered at lower cost. Further, it is possible to appropriately select the type of the film making method according to materials of the above organic layer. In the case of film making employing the above wet system film making methods, drying may appropriately carried out. The above drying conditions are not particularly limited, and temperature may be selected within the range so that a layer formed by coating is not adversely affected.

When the above organic layer is formed by coating employing the above wet system film making method, it is possible to add binder resins to the above organic layer. In this case, listed as the above binder resins are polyvinyl chloride, polycarbonate, polystyrene, polymethyl methacrylate, polybutyl methacrylate, polyester, polysulfone, polyphenylene oxide, polybutadiene, hydrocarbon resins, ketone resins, phenoxy resins, polyamide, ethyl cellulose, vinyl acetate, ABS resins, polyurethane, melamine resins, unsaturated polyester, alkyd resins, epoxy resins, silicone resins, polyvinyl butyral, and polyvinyl acetal. These may be employed individually or in combinations of at least two types.

When the above organic layer is formed by coating employing the wet system film forming method, solvents, which are employed to prepare a liquid coating composition by dissolving materials of the above organic layer, are not particularly limited and may appropriately be selected depending on the types of the above positive hole transporting materials, the above orthometal complexes, the above host materials, and the above polymer binders. Examples include halogen based solvents such as chloroform, carbon tetrachloride, dichloromethane, 1,2-dichloroethane, or chlorobenzene; ketone based solvents such as acetone, methyl ethyl ketone, diethyl ketone, n-propyl methyl ketone, or cyclohexane; aromatic solvents such as benzene, toluene, or xylene; ester based solvents such as ethyl acetate, n-propyl acetate, n-butyl acetate, methyl propionate, ethyl propionate, γ-butyrolactone, or diethyl carbonate; ether based solvents such as dioxane; amide based solvents such as dimethylformamide or dimethylacetamide; dimethylsulfoxide, and water.

Meanwhile, the weight of solids with respect to the total weight of solvents, which dissolve them, is not particularly limited, and the resulting viscosity may appropriately be selected depending on the wet system film making method.

In the present invention, by employing the transfer method to form a light emitting layer, it is possible to avoid blending and dissolution with other layers, whereby it is possible to efficiently form a multi-layered organic layer. Further, by forming an interface between the light emitting organic layer and the non-light emitting organic layer exhibiting positive hole transportability and/or the non-light emitting organic layer exhibiting electron transportability, it becomes possible to preferably control carrier mobility, whereby it has been found to make it possible to prepare a high performance organic EL element.

The transfer method, as described herein, refers to the method which includes the process in which by employing a plurality of transfer materials which have formed the organic layer on the temporary support, the organic layer is transferred onto a substrate via a peeling-transfer method. Peeling-transfer method refers to a method in which by heating and/or pressing transfer materials, the organic layer is softened, and after adhesion to the film forming surface of a substrate, the organic layer is only allowed to remain on the film making surface. With regard to the heating method and the pressing method, it is possible to employ the same method which is employed in the above lamination method.

(7) Transfer Materials (7-1) Temporary Support

It is essential that the temporary support for the transfer sheet employed in the present invention is composed of materials which are chemically and thermally stable, as well as also flexible. In practice, preferred is a thin sheet composed of fluororesins (for example, a tetrafluorinated ethylene resin (PTFE), a trifluorinated chlorinated ethylene resin (PCTFE)), polyester (for example, polyethylene terephthalate and polyethylene naphthalate (PEN)), polyacrylate, polycarbonate, polyolefin (for example, polyethylene and polypropylene), polyethersulfone (PES), or a laminated body thereof. Appropriate thickness of the temporary support is 1-300 μm, while when an organic layer of highly detailed pattern is formed, the thickness is preferably 3-20 μm.

(7-2) Formation of Organic Layer on Temporary Support

It is preferable that an organic layer, incorporating polymer compounds as a binder, is formed on a temporary support via the wet-system method. Materials for the organic layer are dissolved in organic solvents to the desired concentration, and the resulting solution is applied onto the temporary support. Coating methods are not particularly limited as long as the thickness of the dried organic layer is at most 200 nm at a uniform layer thickness distribution. Coating methods include a spin coating method, a screen printing method, a gravure coating method (for example, a micro-gravure coating method), a dip coating method, a cast coating method, a die coating method, a roller coating method, a bar coating method, an extrusion coating method, and an ink-jet coating method. Of these, preferred are the micro-gravure coating method and the ink-jet method, which are preferred for patterning.

By sequentially coating a liquid coating composition incorporating light emitting compounds of each color via mask onto the predetermined pattern, it is also possible to form an organic layer in which light emitting pixels of three colors, namely blue, green, and red, are subjected to patterning.

Further, by sequentially transferring the coating film incorporating the light emitting compounds of each color via a mask onto the predetermined pattern, it is possible to form an organic layer in which light emitting pixels of three colors of blue, green, and red are subjected to patterning.

The mask materials are not limited, but preferred are those which are durable and relatively inexpensive, which may be employed in combination. Further, in view of mechanical strength and pattern accuracy of light emitting pixels of the organic layer, the thickness of the mask is commonly 2-100 μm, but is preferably 5-60 μm.

(7-3) Patterning Method of Light Emitting Materials

One example of the production method of a patterning member according to the present invention will now be described with reference to drawings.

Figure 7:
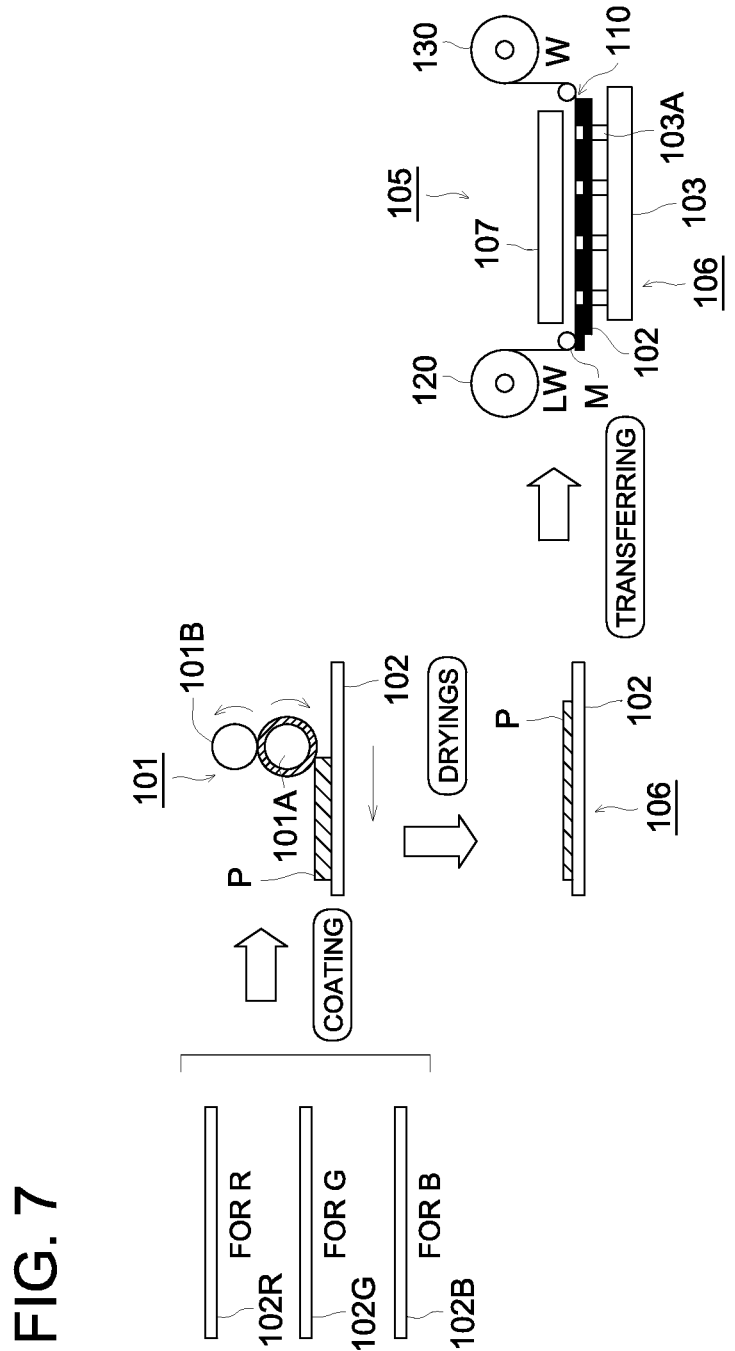
FIG. 7 is one example showing a process of the production method of the patterning member employed in the present invention.

FIG. 7 is one example showing a process flow of the production method of the patterning member employed in the present invention.

In the present embodiment, as shown in FIG. 7, employed as primary transfer sheet 102 of various types, are three types of primary transfer sheet 102R for red, primary transfer sheet 102G for green, and primary transfer sheet 102B for blue. It is possible to preferably employ a belt-like flexible support as the various type primary transfer sheet 102.

The belt-like flexible support is a sheet having the predetermined shape, and it is possible to apply, onto the above support, various types of different materials (pattern materials) P. Further, it is possible to employ materials capable of transferring material P to transfer sheet 110 during the transfer process. Namely, it is required that under conditions during the transfer process, wettability or adhesion property of material P is inferior to transfer sheet 110.

As such belt-like flexible supports, it is possible to employ a plastic film composed of polyethylene terephthalate (PET), polyethylene-2,6-naphthalate, cellulose diacetate, cellulose triacetate, cellulose acetate propionate, polyvinyl chloride, polyvinylidene chloride, polycarbonate, polyimide, or polyamide, paper, paper coated or laminated by α-polyolefins having 2-20 carbon atoms such as polyethylene, polypropylene, ethylene-butene copolymers, flexible belt-like materials such as a metal plate, and belt-like materials which are prepared by forming a treated layer on the surface of the above belt-like materials. The width and length are specified, and the typical thickness is about 2-200 μm.

Coating apparatus (coating means) 101, shown in FIG. 7, accepts a roller coating apparatus as one example. In this roller coating apparatus, pattern material P of a predetermined thickness is applied onto primary transfer sheet 102 in such a manner that primary transfer sheet 102 is conveyed at a predetermined rate in the arrowed direction under applicator roller 101A which rotates in the direction shown in FIG. 7. On the rear side of applicator roller 101A, arranged is metering roller 101B, and controlled is so that the supply amount of pattern material P onto applicator roller 101A becomes uniform.

Primary transfer sheet 102 may be conveyed via the embodiment in which it is fed from the roller of the feeding section (not shown) and is wound by the roller of a winding section (not shown) via coating apparatus 101 and drying means 104 (to be described below). Further, another embodiment may be acceptable in which primary transfer sheet 102 of a predetermined size is secured via a primary transfer sheet holding table (for example, a vacuum adsorption table) and is conveyed to coating apparatus 101.

Coating apparatus 101 may be employed so that one unit coats various pattern materials P, while coating apparatus 101 may be provided for each of the various pattern materials P.

Systems of coating apparatus 101 are not limited in practice as long as it enables coating of pattern material P of the predetermined thickness onto primary transfer sheet 102 as described above.

Primary transfer sheet 102 coated with pattern material P is conveyed to drying apparatus (drying means) 104, and pattern material P is dried. Usable drying apparatus 104 includes various dryers of various systems, such as a hot air circulation drier system, an infrared drier system, a vacuum drier system.

It is preferable that a series of the above processes are carried out under an ambience at a high degree of dust-free as well as at optimal temperature and humidity. Consequently, it is preferable that they are carried out in a clean room, and particularly, it is preferable that coating means 101 and drying means 104 are arranged under an ambience of at most Class 100. For this, it is possible to accept an embodiment to simultaneously employ a down-flow clean room or a clean bench.

In the present invention, pattern material P is the light emitting layer of the organic EL. Since moisture adversely affects product life, it is preferable to store the above light emitting layer at an ambience of low humidity. In practice, preferable ambience is air or nitrogen gas at an dew point of at most −20° C. It is also preferable to maintain relative humidity as low as possible.

Transfer apparatus (transfer means) 105 employed for the transfer process is an apparatus which transfers pattern material P onto transfer sheet 110 to be pattern-like in such a manner that one of primary transfer sheets 102 overlaps transfer sheet 110 so that pattern material P faces transfer sheet 102 via mask M (mask material) having an aperture of the shape almost similar to the pattern and pressing pressure is applied onto the rear surface of primary transfer sheet 102 via pressing plate 103.

As a material of transfer sheet 110 supplied in the above process, it is possible to preferably employ a belt-like flexible support.

As such belt-like flexible supports, it is possible to employ plastic films composed of polyethylene terephthalate (PET), polyethylene-2,6-naphthalate, cellulose diacetate, cellulose triacetate, cellulose acetate propionate, polyvinyl chloride, polyvinylidene chloride, polycarbonate, polyimide, or polyamide, paper, paper coated or laminated with α-polyolefins having 2-20 carbon atoms such as polyethylene, polypropylene, ethylene-butene copolymers, flexible belt-like materials such as a metal plate, and belt-like materials which are prepared by forming a treatment layer on the surface of the above belt-like materials as a substrate. Their width is specified, their length is 45-20,000 m, and their thickness is about 2-200 μm.

Figure 8:
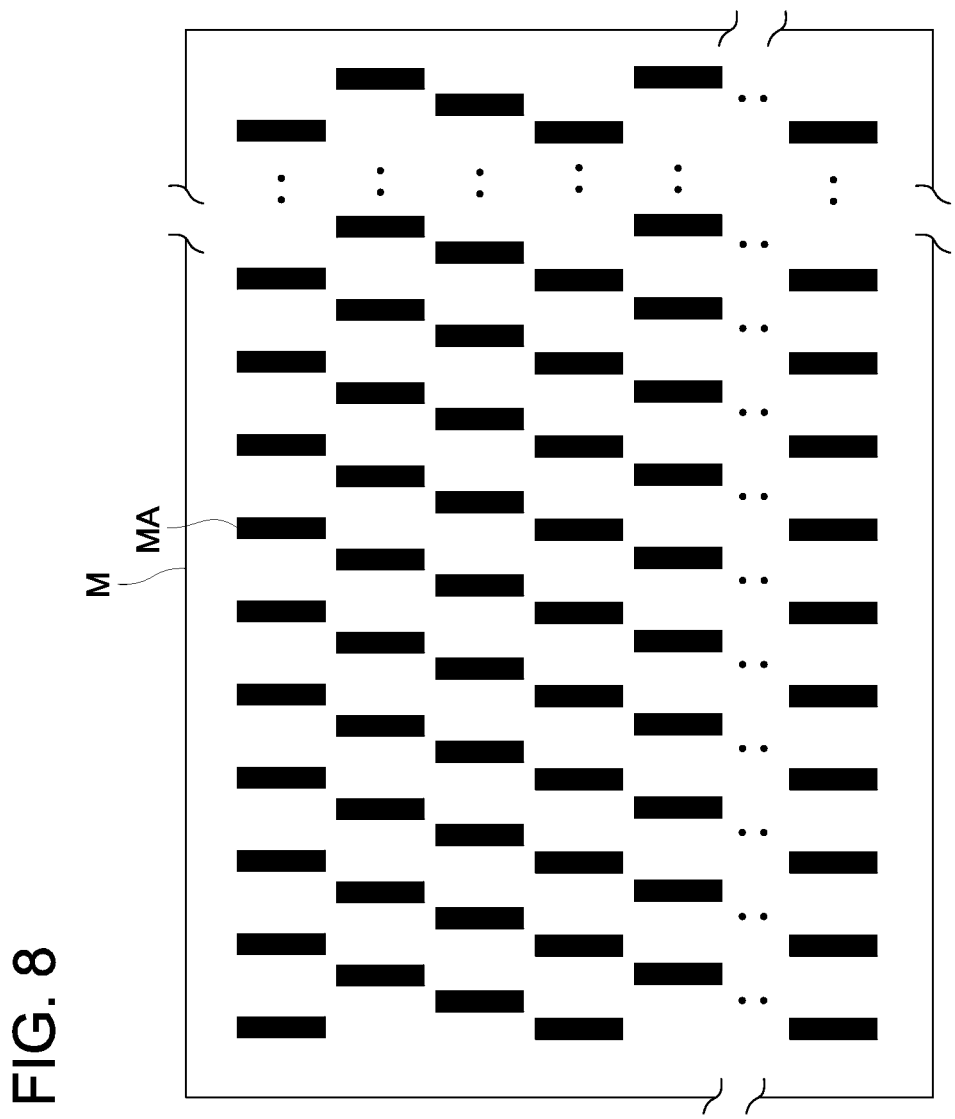
FIG. 8 is a structural view (declined line arrangement) of a mask.

As shown in the structural view of FIG. 8, employed as mask M (mask material) is a thin plate-like member having aperture section MA almost similar to the pattern in shape. Arrangement of aperture section MA on mask M is set to correspond to the pattern of each of the materials (R, G, and B). The size of aperture section MA is almost similar to the shape of the pattern, but it is preferable that the size is somewhat larger than the pattern. This will be detailed later. For example, when a pattern is a rectangle of 100 μm×200 μm, it is preferable to make aperture section MA to be rectangle of 105 μm×205 μm.

It is possible to accept the optimal value as a thickness of mask M depending on the size of the pattern, the layer thickness of the pattern and the required accuracy for the pattern, and the commonly and preferably acceptable values are in the range of 20-40 μm. In view of accuracy required for the pattern, it is preferable that the thickness of mask M is as low as possible, while in view of durability (working life) and stiffness of mask M, it is preferable that the thickness of mask M is high.

It is preferable that four sides of the above mask are retained via frame materials and supported under a predetermined tension. Preferably employed as of mask M material is, for example, stainless steel. Formation of aperture section MA of mask M is carried out via photoetching.

Figure 9:
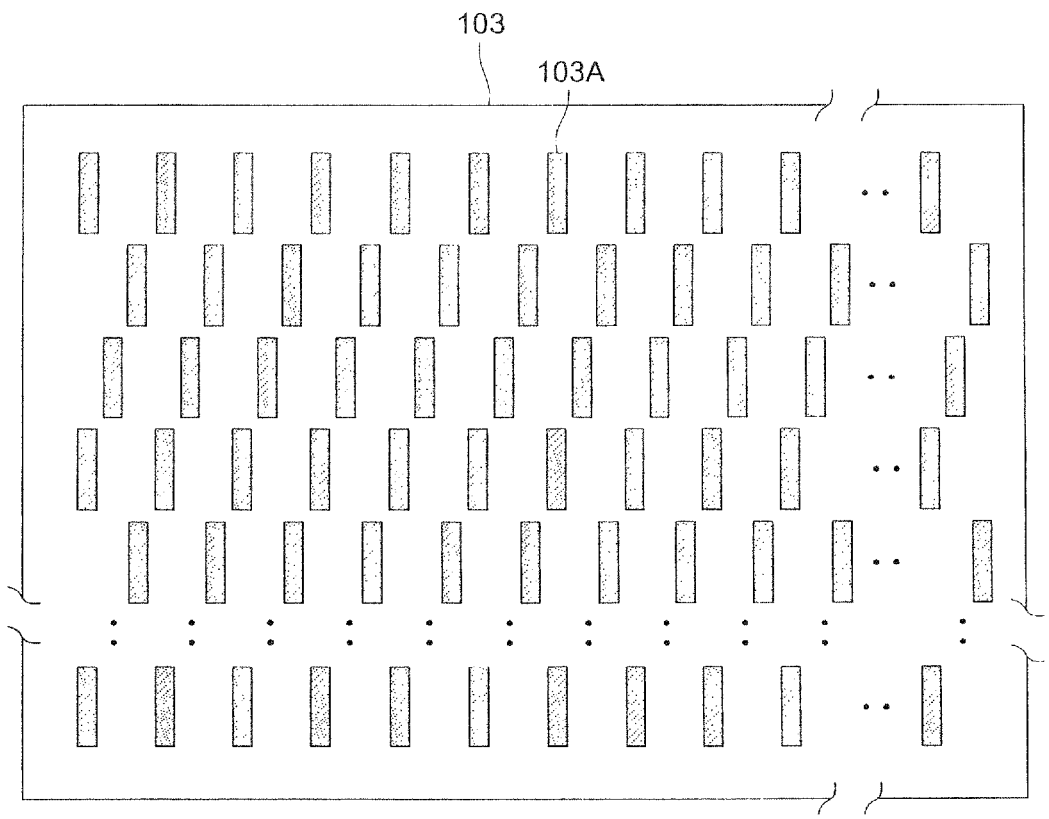
FIG. 9 is a structural view (declined line arrangement) of a pressing plate.

As shown in the structural view of FIG. 9, employed as pressing plate 103 is a plate-like member on which surface projections 103A, which are almost similar to the shape of the pattern, are formed. The arrangement of projections 103A on pressing plate 103 is based to correspond to the pattern of each of the materials (R, G, and B). It is preferable that the size of projection 103A is almost similar to the pattern or is somewhat less than the same. This will be detailed. In practice, for example, when a pattern is a rectangle of 100×200 μm, it is preferable to employ the same as above.

It is possible to accept the optimal value of the level difference of projection 103A of pressing plate 103, depending on the size of the pattern, the film thickness of the pattern, and the accuracy required for the pattern, but the commonly acceptable value is 30-70 μm. In view of the required accuracy for the pattern, namely molding accuracy of projection 103A, it is preferable that the bump of projection 103A is as low as possible, while in view of the transferability of the pattern, it is preferable that the bump of projection 103A is somewhat larger.

It is preferable that such pressing plate 103 is molded of metal member being thicker than the predetermined value. Formation of projection 103A of pressing plate 103 is performed via photoetching.

In alignment transfer zone 106, in order to accurately align transfer sheet 110 with primary transfer sheet 102, it is preferable that tension applied to transfer sheet 110 is relatively small. Namely, it is preferable to minimize elastic deformation of transfer sheet 110 for highly accurate alignment. Specifically, when transfer sheet 110 is held by substrate supporting base 107 via adsorption, it is preferable that no tension is applied.

Transfer apparatus (transfer means) 105 shown in FIG. 5 is an embodiment corresponding to transfer sheet 110 of the belt-like flexible support. When plate-like transfer sheet 110 such as a glass plate, a silicon substrate, or a metal plate is employed, the basic structure is almost the same except for differing in conveyance means.

Figure 10:
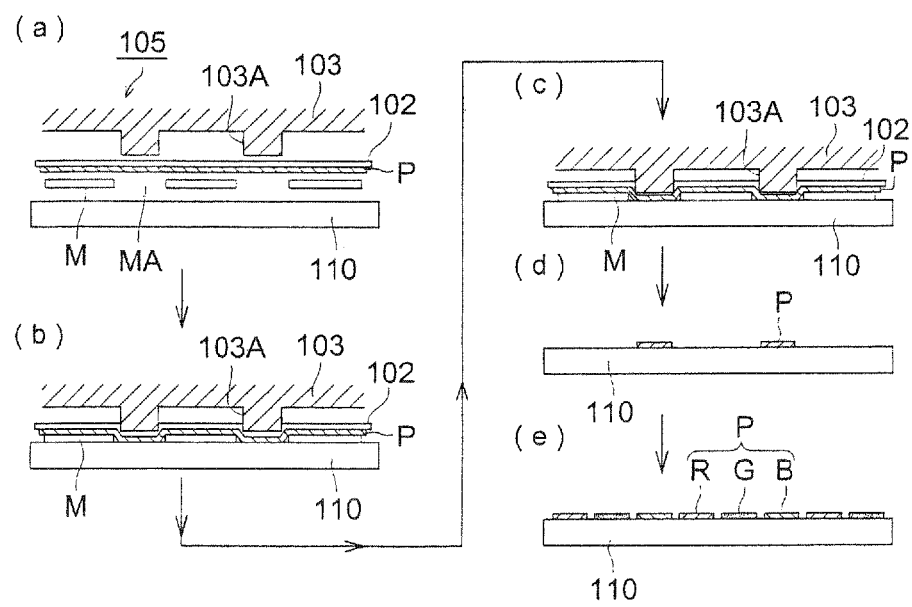
FIG. 10 is a schematic view showing a flow of the primary transfer process.

Alignment transfer zone 106 will now be detailed with reference to FIGS. 7 and 10. FIG. 10 is a schematic view showing the flow of a transfer process. In FIGS. 7 and 10, "up" and "down" are reversed. Further, in FIG. 10, substrate supporting base 107 is not shown.

In FIG. 10, alignment transfer means 105 is composed of: mask M which supports primary transfer sheet 102 on the upper surface; a mask alignment means (not shown), which performs alignment of mask M in the X, Y, Z, and θ directions; substrate supporting base 107 (refer to FIG. 7) in which a flat surface is molded and which supports the substrate via adsorption onto the rear surface; at least two alignment detection means (not shown) which are arranged near both edges of primary transfer sheet 102 to enable alignment and which are capable of aligning mask M or detecting the pattern section of transfer sheet 110; pressing plate 103 which transfers, pattern-like, pattern material P to transfer sheet 110 via aperture section MA of mask M by pressing projection 103A from the rear surface of primary transfer sheet 102; and a pressing means (not shown) which presses pressing plate 103 onto the side of transfer sheet 110.

It is possible to constitute the mask alignment means, which aligns mask M in the X, Y, Z, and θ directions via a common means employing a combination of such as ball screws and a stepping motor. Adsorption securing of transfer sheet 110 in substrate supporting base 107 may be achieved, for example by a combination of a plurality of tiny vacuum adsorption holes arranged on the surface of substrate supporting base 107 and a suction means (for example, a rotary type vacuum pump) which is connected to those holes. It is possible to constitute the alignment detection means via a combination of a microscope or a digital camera and a CRT monitor connected to it.

As a pressing means, employed may be any common ones in which a combination of an air cylinder and a regulator results in planar pressure. Further, instead of such planar pressing structure, it is possible to employ a linear pressing method employing a roller member. Namely, a structure is usable in which a roller member is conveyed while pressure is applied to the rear surface of pressing plate 103 via the above roller member.

Further, it is possible to employ a manual pressing system in which while viewing the detection results of the alignment detection means, an operator aligns in the X, Y, X and θ directions of mask M, or an automatic system in which, based on detection results of the alignment detection means, alignment in the X, Y, Z, and θ directions of mask M is automatically achieved.

It is essential that alignment in the X, Y, Z, and θ directions is possible so that projection 103 of pressing plate 103 is settable in aperture section MA of mask M in all positions. In order to achieve the above, it is possible to accept such an embodiment that as a structure, it is possible to position and fix mask M and pressing plate 103 via off-line setup while being movable only in the Z direction.

Further, it is also possible to provide a positioning means only for pressing plate 103 to achieve its positioning in the X, Y, Z, and θ directions. In view of accuracy of the alignment, the above is preferable, though resulting in burden for facilities. In this case, it is possible to employ the above-described alignment detection means to align pressing plate 103 and mask M. Namely, by changing the focal length, the alignment detection means is applicable.

Initially from the state shown in FIG. 7, substrate supporting base 107 descends, and supports transfer sheet 110 via adsorption at the position which comes into nearly contact with the rear surface (being the upper surface) of transfer sheet 110. Subsequently, as shown in FIG. 10(*a*), primary transfer sheet 102 is supported on mask M and at the same time, via mask M, primary transfer sheet 102 is allowed to approach and face transfer sheet 110. In such a state, mask M is aligned in the X, Y, Z, and θ directions. Further, if desired, pressing plate 103 is aligned in the X, Y, Z, and θ directions.

In the above alignment, it is necessary that over the whole surface of mask M, projection 103A of pressing plate 103 nearly corresponds to aperture section MA of mask M, and when pressing plate 103, is conveyed to the transfer sheet 110 side, and adjustment is achieved so that projection 103A is in the state to be settable in aperture section MA of mask M.

When the above alignment is completed, pattern material P is transferred onto transfer sheet 110 by pressing the rear surface of plate 30 via pressing means. The above states are sequentially shown in FIGS. 10(*b*) and (*c*). Namely, since primary transfer sheet 102 is thin, it is stretched and is pushed into aperture section MA of mask M via projection 103A of pressing plate 103. By doing so, pattern material P on a part of primary transfer sheet 102 pushed into aperture section MA is pressed on transfer sheet 110, and finally transferred onto transfer sheet 110.

As shown in FIGS. 10(b) and (c), it is found that the width of the pattern transferred onto transfer sheet 110 is less than that of aperture section MA of mask M and the width of the pattern is more than that of projection 103A of pressing plate 103. Since the above sectional state is formed, it is necessary to design the width of aperture section MA of mask M and the width of projection 103A of pressing plate 103 while considering the design width of the pattern, the thickness of primary transfer sheet 102, the elongation magnitude of primary transfer sheet 102, the mechanical characteristics (for example, longitudinal elastic coefficient) of primary transfer sheet 102, and the film thickness of pattern material P.

After pattern material P is transferred onto transfer sheet 110, pressing plate 103, mask M, and primary transfer sheet 102 are withdrawn from the transfer sheet 110 side. The above operation is repeated, for example, for three R, G, and B colors, to form the substrate shown in FIGS. 10(e) and 11.

It is preferable that structure is made so that during transfer, predetermined pressure and if needed, predetermined heat are applied depending on the shape and materials of pattern material P. Employed as a heating means may, for example, be a structure in which a sheath heater is provided in the interior of pressing plate 103.

When transfer of the first type of pattern material P is completed, substrate supporting base 107 (refer to FIG. 7) and transfer sheet 110 secured by the above stand without any change. Subsequently, the first type of primary transfer sheet 102 and mask M are replaced with another primary transfer sheet 102 and mask M. During this operation, another mask M is aligned while shifted by one pitch of the stripe or matrix pattern.

Alignment of the second type of mask M and the following is made by detecting, via an alignment detection means, an alignment mark formed near both edges to result in a pertinent positional relationship with respect to pattern material P of the first type formed on the surface of transfer sheet 110, or by detecting pattern material P of the first type via alignment detection means. The above operation is carried out for all types of mask M, and transfer of pattern material P to transfer sheet 110 is completed.

Incidentally, in cases in which alignment is made by detecting pattern material P of the first type and the like via the alignment detection means, when part of substrate supporting base 107 or mask M is formed via transparent materials, or part of substrate supporting base 107 is cut off, it is possible to conveniently detect pattern material of the first type via the alignment detection means through above substrate supporting base 107 or mask M.

Further, when the mask alignment means is allowed to support mask M, structure is preferred in which alignment pins are arranged at three positions of the mask alignment means, and two sides of the frame of mask M come into contact with the alignment pins while being pressed, whereby mask is supported at the same position. Structure may also be employed in which passing-through holes are formed at the alignment position of mask alignment means with mask M and alignment is made by joining via passing-through pin (in this case, a taper-like pin is preferred) which passes through the holes.

When alignment of pattern material P is not required to be high, instead of employing the above alignment detection means, it is possible to achieve mask alignment only by employing the above alignment pins.

With regard to transfer conditions, it is necessary to select optimal conditions depending on the materials of pattern material P and the materials of transfer sheet 110. Applicable pressing pressure during transfer is 5-50 N/cm in terms of linear pressure, for example, when a roller member (being elastic roller such as a rubber roller) is employed and linear pressing is applied.

Further, during transfer, heating temperature is preferably 40-250° C., but is more preferably 60-180° C. It is preferable to maintain the temperature of primary transfer sheet 102 (pressing plate 103) and/or transfer sheet 110 (substrate supporting base 107) to enable enhancement of productivity.

During transfer, it is important to pay attention to the presence of the difference in thermal expansion coefficient among mask M, primary transfer sheet 102, transfer sheet 110 and pressing plate 103. For example, at normal temperature (for example, 20° C.), even though both edges of mask M (for example, stainless steel at a of $18 \times 10^{-6}$) and transfer sheet (for example, resin film at a of $80 \times 10^{-6}$) are matched, in the case of heating temperature of 150° C. during transfer, difference in the magnitude of thermal expansion of about 40 μm occurs, which causes un-negligible problems.

One of countermeasures is that structure is made so that the thermal expansion coefficient α of each of the structural members is near as much as possible, and another countermeasure is that design is made so that positional relationship of each structuring member becomes optimal. It is more preferable to employ both in combination.

Further, at completion of the transfer, when no appropriate temperature control is performed, during withdrawal of pressing plate 103 from the edge of transfer sheet 110, it may be afraid that projection 103A set in aperture section MA of mask M is not released.

After completion of the transfer process, under a state in which adhesion force between pattern material P and transfer sheet 110 is assured, winding onto winding roller 130 is carried out.

Figure 11:
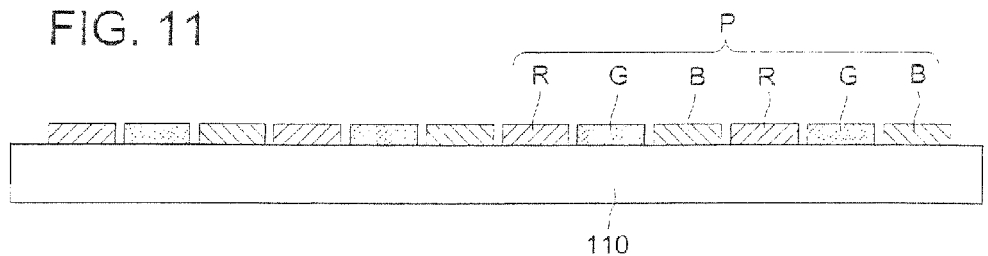
FIG. 11 is a structural view of a transfer sheet after completion of transfer from the primary transfer sheet.

FIG. 11 is a structural view of transfer sheet 110 after completion of transfer. On the above transfer sheet 110, pattern material P of three types (R, G, and B) is repeatedly formed at the predetermined width and pitch.

The production method of the pattern member according to the present invention is described above; however, the present invention is not limited the above embodiments and is subjected to various embodiments.

For example, with regard to the types and number of primary sheets 102, the number of coating apparatus 101, and drying apparatus 104, the layout, and the arrangement of the transfer apparatus, other than the above embodiments, it is possible to select various embodiments depending on the product size of the pattern member, the types of products and the production quantity.

In the present embodiment, drying apparatus 104 of a batch system is employed, but it is possible to employ an embodiment in which primary transfer sheet 102 is conveyed via rollers, and a tunnel furnace type drying apparatus is provided in the latter stage.

In the present embodiment, mask M is prepared so that it is employed for each of pattern material P and is employed via exchange. However, it is possible to employ an embodiment in which one type of mask M is fixed in the mask alignment means, which is employed in common for each pattern material P.

Further, for example, in transfer equipment (a transfer means) 105, it is possible to employ structure in which alignment is made by shifting 1 pitch of substrate supporting base 107 (transfer sheet 110) instead of the structure in which alignment of subsequent mask M is made by shifting 1 pitch of the stripe or the matrix pattern.

Further, in the example of the above embodiment, the drying process is employed in which the transfer sheet coated with the pattern member is dried. However, depending on the materials of the pattern member, it is possible to employ a transfer process without employing a drying process.

(f) Moisture and/or Oxygen Absorbing Layer (1) Materials

It is preferable that the materials employed in the moisture and/or oxygen absorbing layer of the present invention are reducing metal oxides, or metals or alloys of a work function of at most 4.0 eV.

"Reducing metal oxides", as described herein, refer to oxides, in which the atom, which bonds to oxygen, has the oxidation number which is less than the atomic valence. Examples of the reducing oxides which are employed in the moisture and/or oxygen absorbing layer include SiO, GeO, SnO, FeO, MNO, and WO. Of these, preferred are SiO, GeO, SnO, and FeO.

Examples of metals or alloys of a work function of at most 4.0 eV include metals such as Ca, Ce, Cs, Er, Eu, Gd, Hf, K, La, Li, Mg, Nd, Rb, Sc, Sm, Y, Yb, or Zn, and alloys which are composed of the above metals as major components. Of these, in view of ease of procurement and handling, particularly preferred are Ca, Li, and Mg, as well as alloys thereof.

As materials of the moisture and/or oxygen absorbing layer, reducing oxides and metals or alloys of a work function of at most 4.0 eV may be employed in combination. When employed in combination, the moisture and/or oxygen absorbing layer may be multi-layered or both may be dispersed into a single layer.

(2) Arrangement Method

The moisture and/or oxygen absorbing layer is arranged between a cathode substrate and a cathode. By realizing the above structure, it is possible to efficiently absorb moisture and/or oxygen incorporated in the substrate as well as moisture and/or oxygen penetrated into elements, whereby it is possible to enhance durability and luminance of organic EL elements.

Arrangement methods of the moisture and/or oxygen absorbing layer are not particularly limited. A vapor deposition method or a sputtering method is preferred, and the method which is the same as the cathode arrangement method is preferred. By arranging the moisture and/or oxygen absorbing layer employing the same method as the cathode arrangement method, it is possible to continuously arrange the cathode after arranging the moisture and/or oxygen absorbing layer, whereby it is possible to simplify the process. An interlayer such as an insulation layer may be arranged between the moisture and/or oxygen absorbing layer and the cathode or the cathode substrate.

The thickness of the moisture and/or oxygen absorbing layer is not particularly limited as long as reducing oxides and/or metals or alloys of a work function of at most 4.0 eV are incorporated, which absorb a sufficient amount of moisture and/or oxygen to enhance durability of organic EL elements. The above thickness is preferably 10 nm-1 μm, but is more preferably 50-500 nm. The thickness of the absorbing layer which is less than the lower limit is not preferred since moisture absorbing capacity is not sufficient. On the other hand, the thickness which exceeds the upper limit is not also preferred since longer period is required for film making and in addition, peeling problems of the cathode substrate or the cathode and the absorbing layer tend to occur.

(g) Other Layers

Other layers are not particularly limited and may be selected appropriately depending on purposes. For example, listed are a protective layer and a drying layer. Appropriately listed as the above protective layer are those described, for example, in JP-A Nos. 7-85974, 7-1925866, 8-22891, 10-275682, and 10-106746. The shape, size, and thickness may be suitably selected. The materials are not particularly limited as long as they function to retard penetration and entry of those such as moisture or oxygen to degrade organic EL elements into the above organic EL elements. Examples include silicon oxide, silicon dioxide, germanium oxide, and germanium dioxide.

Methods to form the above protective layer are not particularly limited and include, for example, a vacuum deposition method, a sputtering method, a reactive sputtering method, a molecular beam epitaxy method, a cluster-ion beam method, an ion plating method, a plasma polymerization method, a plasma CVD method, a laser CVD method, a thermal CVD method, and a coating method.

Materials of the drying layer are not particularly limited, and those which adsorb moisture are preferably employed. Preferably employed are, for example, reducing oxides such as SiO, GeO, FeO, or SnO, as well as metals and alloys of a work function of at most 4.0 eV. The drying layer is preferably arranged between a cathode and a cathode substrate. Arranging methods are not particularly limited and include, for example, a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method.

The organic EL element of the present invention enables light emission by applying direct current (if required, an alternating current component may be included) voltage (usually, 2-40 V) or direct current electricity between the above anode and the above cathode. Driving the organic EL element of the present invention may be carried out utilizing the methods described in JP-A Nos. 2-148687, 6-301355, 5-29080, 7-134558, 8-234685, and 8-241047, as well as U.S. Pat. Nos. 5,828,429, 6,023,308, and 2,784,615.

The following compounds are listed as specific compounds of the structural layer.

The structural layer includes a positive hole injecting layer, a positive hole transporting layer, a light emitting layer, and an electron transporting layer.

For example, in the positive hole injecting layer, employed are conjugated type polymers and non-conjugated type polymers, and oligomer compounds. In order to enhance electrical conductivity, the above compounds are subjected to acceptor doping and then employed.

Listed as conjugated type polymers are polythiophenes and polyanilines, which are usually subjected to doping via acid. Specifically preferred as polythiophenes is PEDOT/PSS, and as polyanilines is PANI/CSA.

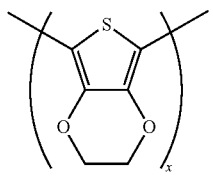

PEDOT

PSS
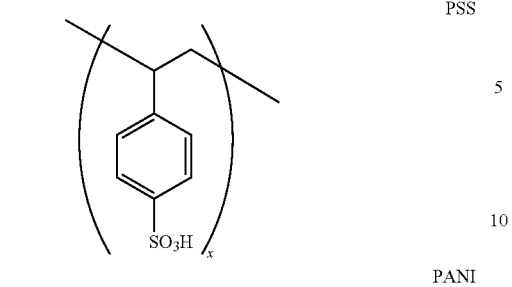
PANI
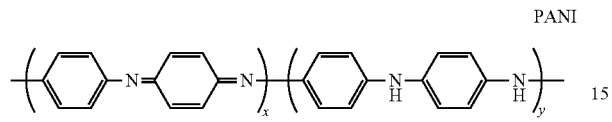
CSA
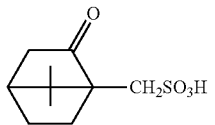
Non-conjugated type polymers include aromatic amines and those in which aromatic amine is introduced into the primary chain or side chain. Examples include those represented by Formulas 1 and 2. Of these, preferred are PC-TPB-DEG, PTPDES, Et-PTPDEK, PVTPA1, and PVTPA2.
Formula (1)
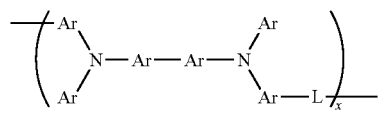
Formula (2)
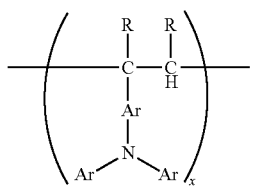
PC-TPB-DEG
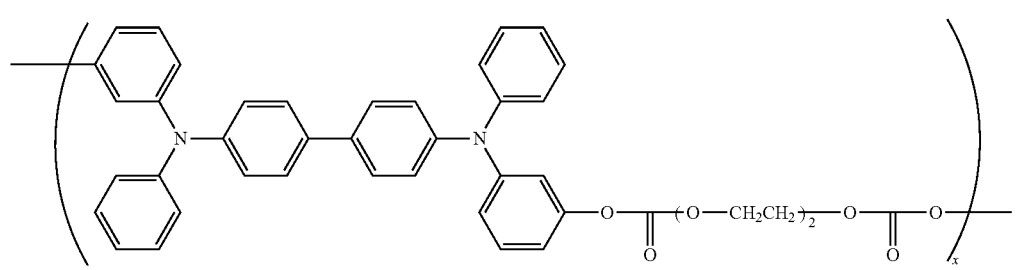
PTPDES
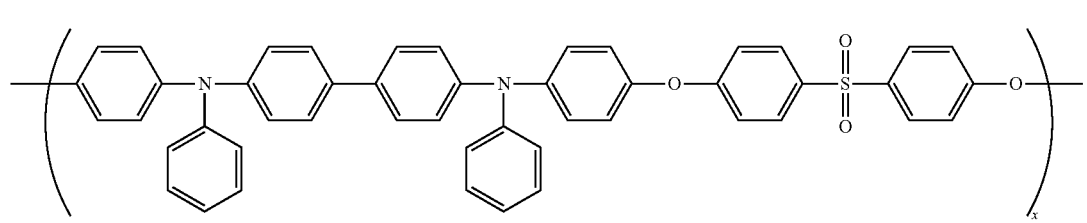
Et-PTPDEK
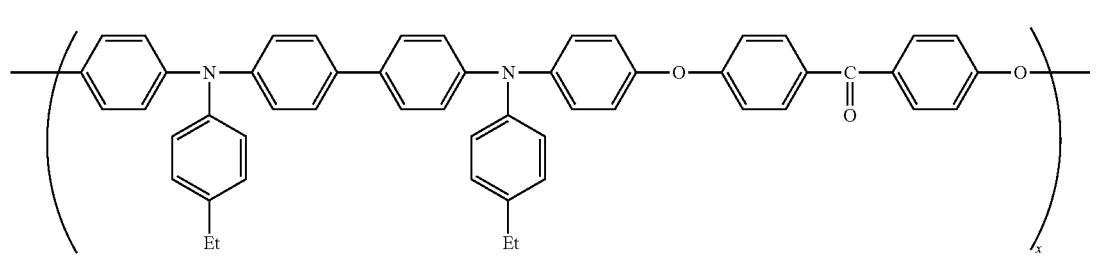

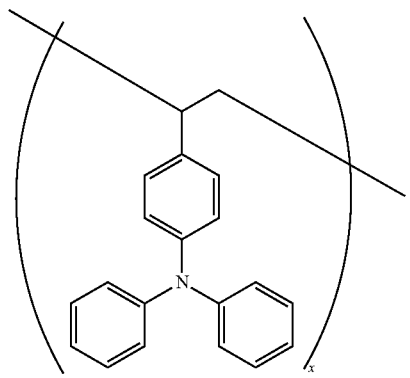 PVTPA1

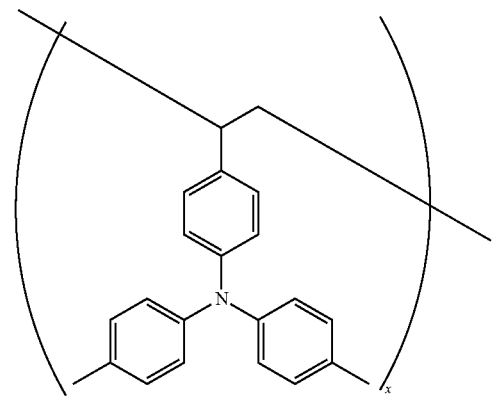 PVTPA2

Preferred as acceptors are those exhibiting extremely high electron acceptability. Preferred examples include TBPAH, quinones, and DDQ is particularly preferred.

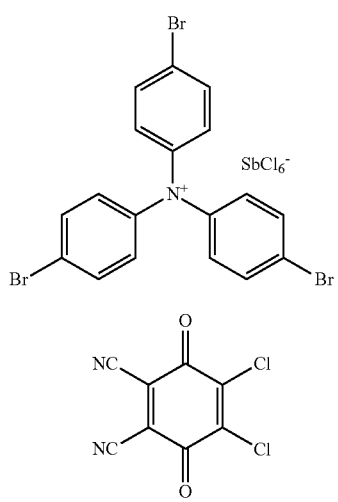

TBPAH

DDQ

Further, also listed as non-conjugated type polymers are condensed type polymers, which include the compounds represented by following Formula A.

$$-\!\!\!\left(\!\!\begin{array}{c}Ar_n-L\\|\\(K-Z)_m\end{array}\!\!\right)\!\!\!-$$

Formula A wherein Ar represents an aryl group and a heteroaryl group, each of which has a substitutable position and may independently be substituted, m represents an integer of 1-4, n represents an integer of 1-4, Z represents a residual group of a fluorescent or phosphorescent compound (including organic complexes). Of (m+2) substitutable positions of Ar, m positions are bonded via K. K represents a bivalent linking group or a bonding means. Z of m pieces and L, all may be the same or differ. L represents a bivalent linking group selected from following Group 1 of Linking Groups.

Group 1 of Linking Groups $$-\!\!O\!\!-\quad -\!\!S\!\!-\quad -\!\!\!\underset{R_2}{\overset{R_1}{\underset{|}{C}}}\!\!\!-\quad -\!\!\!\underset{R_4}{\overset{R_3}{\underset{|}{Si}}}\!\!\!-$$

$R_1$-$R_4$ each represent a hydrogen atom, an alkyl group which may be substituted, an aryl group, and a heteroaryl group.

The following compounds are listed as specific examples of these compounds.

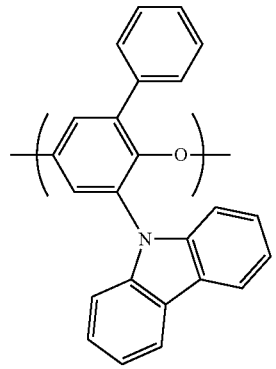 CP-1

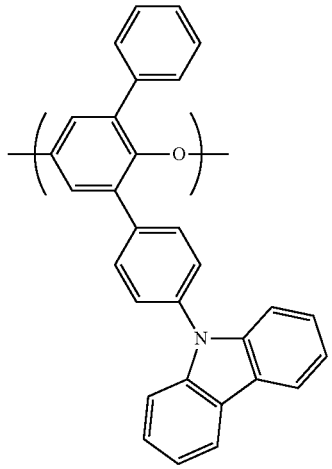 CP-2

CP-3
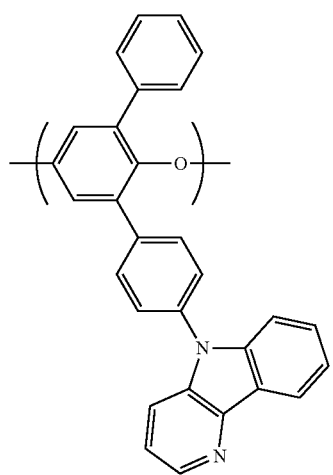
CP-4
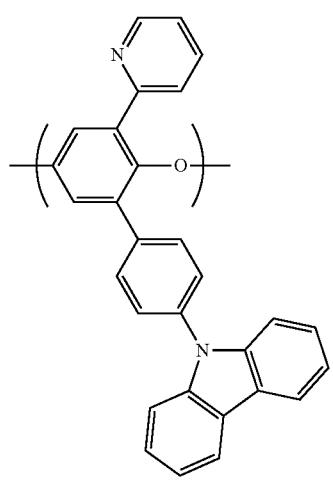
CP-5
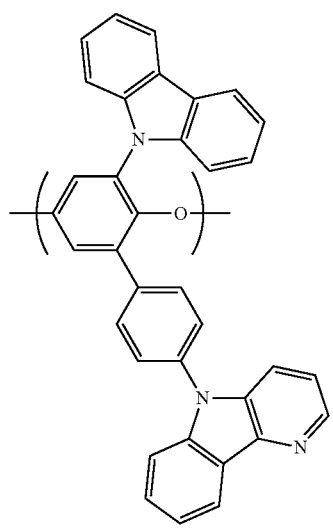
CP-6
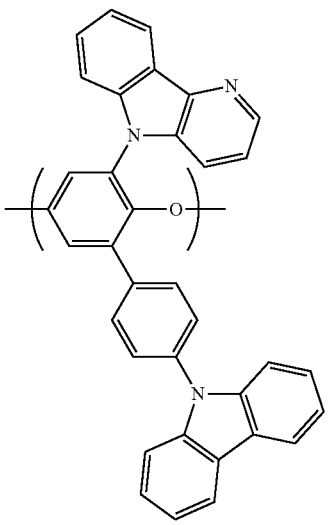
CP-7
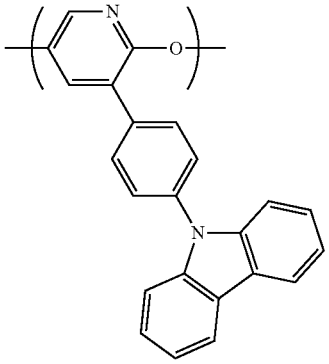
CP-8
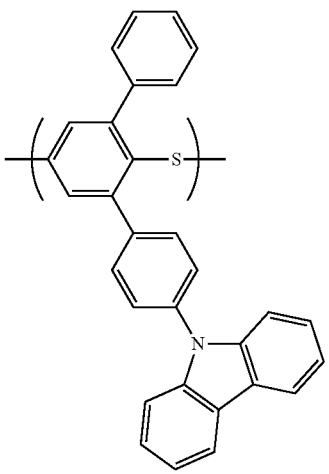

CP-9

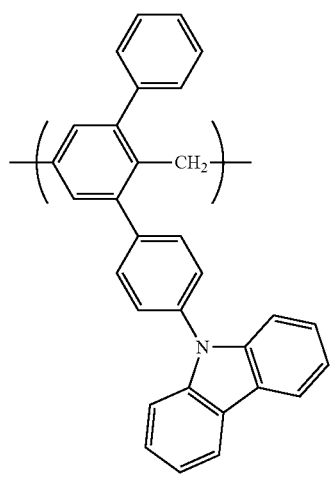

CP-11

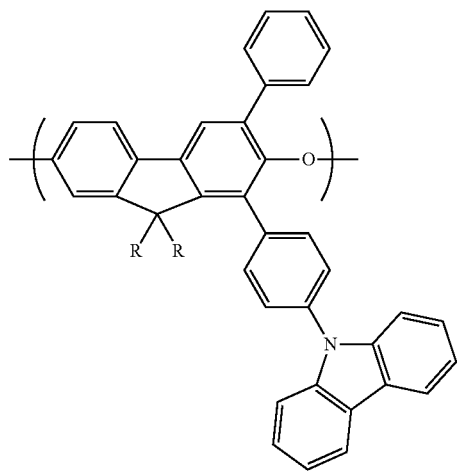

R represents a 2-ethylhexyl group

CP-10

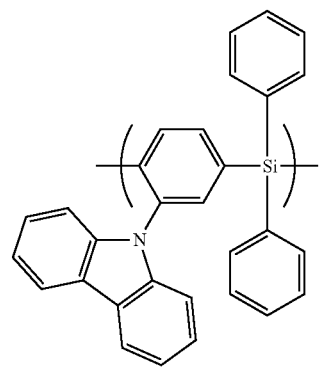

Oligomer compounds include aromatic amine oligomers. Those which have the structure, in which aromatic amines are linked, may be subjected to sublimation purification, and exhibit good amorphousness. Those are represented by any of following Formulas 3-6, and examples thereof include following Compounds 3-1-5, 4-1-4, 5-1-4 and 6-1-3.

Formula (3)

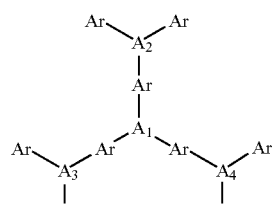

$A_1$-$A_4$:N, P, B

Compound 3-1

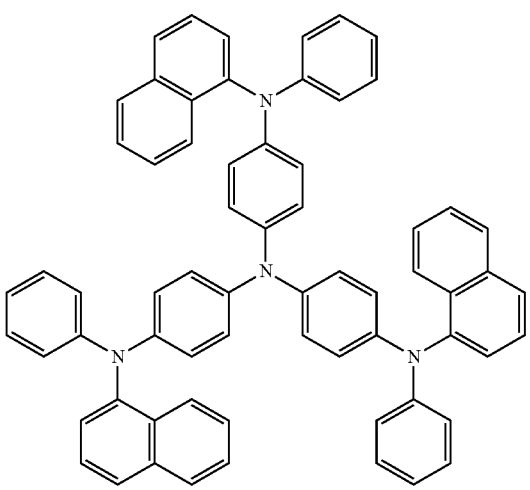

-continued
Compound 3-2
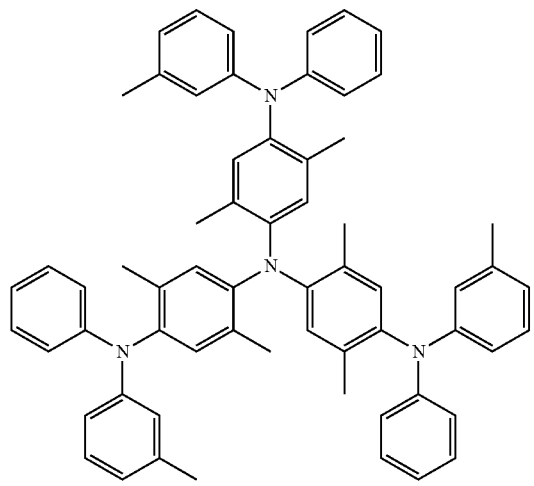
Compound 3-3
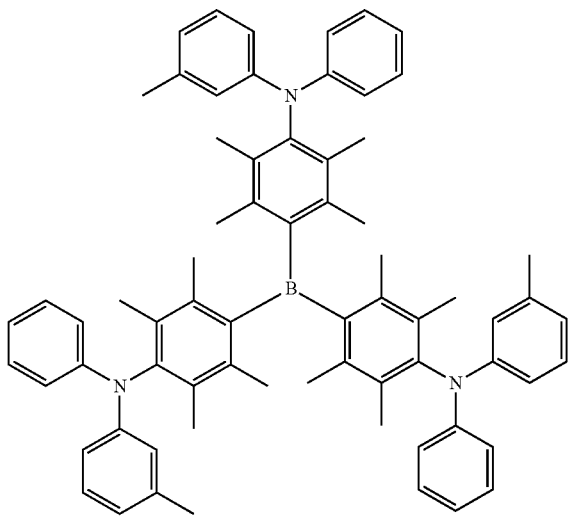
Compound 3-4
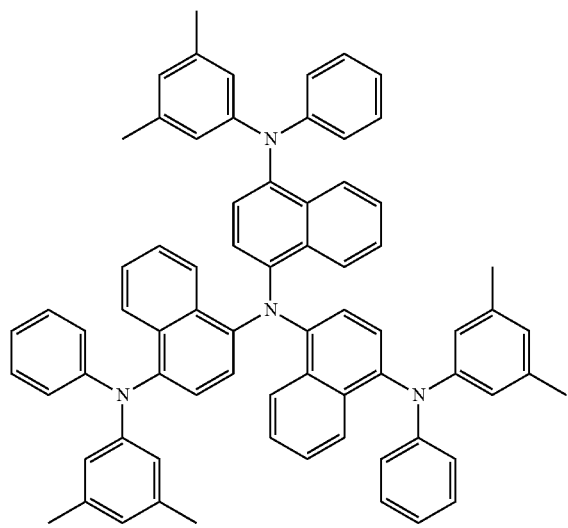
Compound 3-5
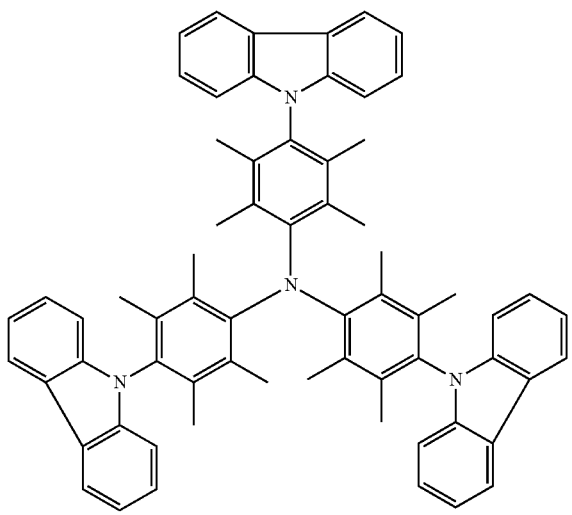
Formula 4
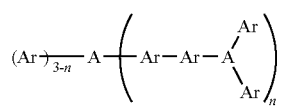
A: N, B, and P and $n = 2$ or 3
Compound 4-1
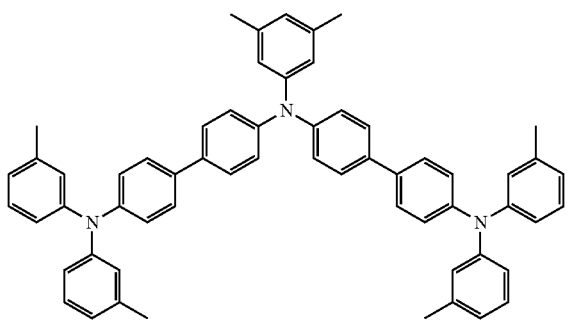

-continued
Compound 4-2
Compound 4-3
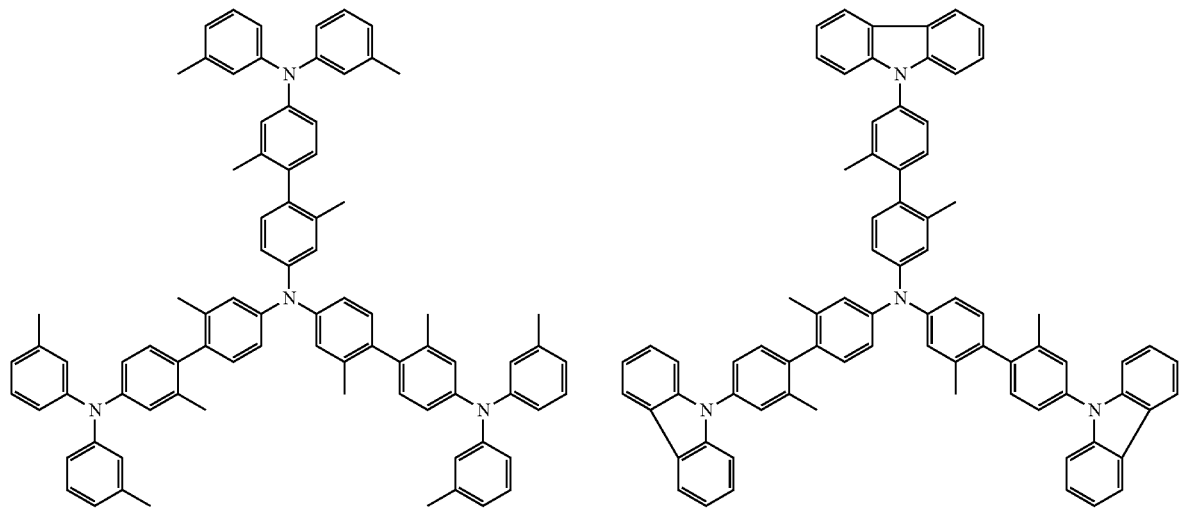
Compound 4-4
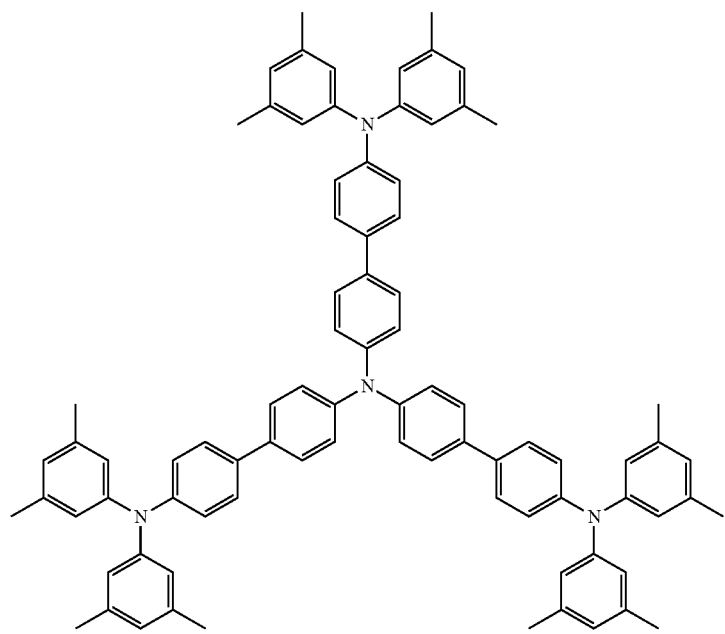
Formula 5
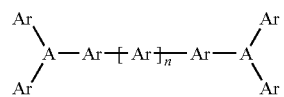
A: N, B, and P and n = 1-3
Compound 5-1
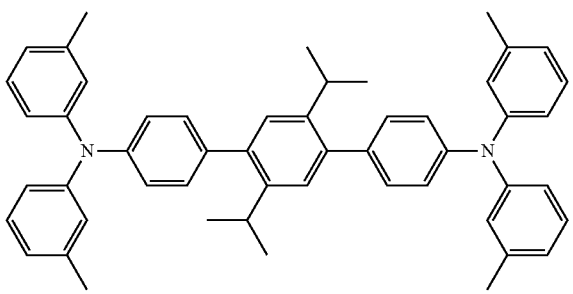

-continued
Compound 5-2
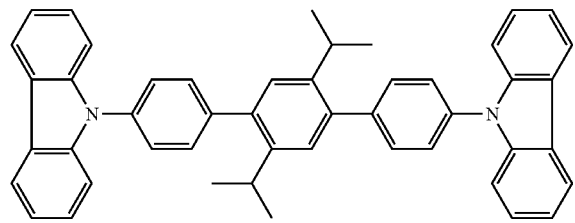
Compound 5-3
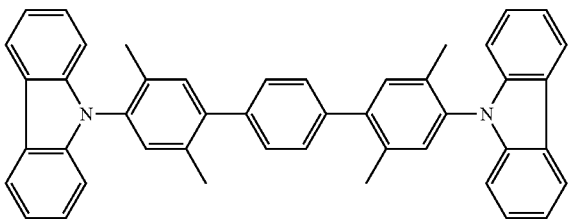
Compound 5-4
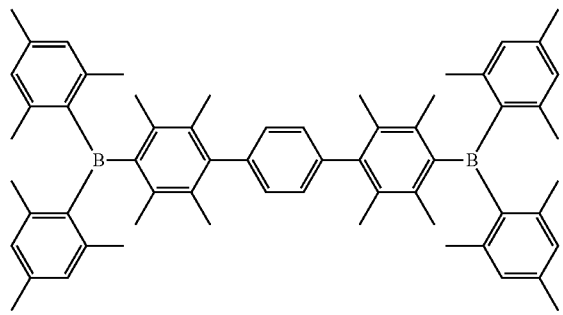
Formula 6
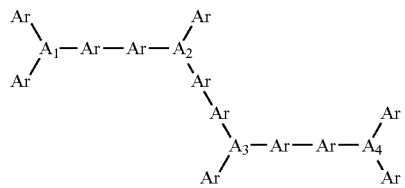
Compound 6-1
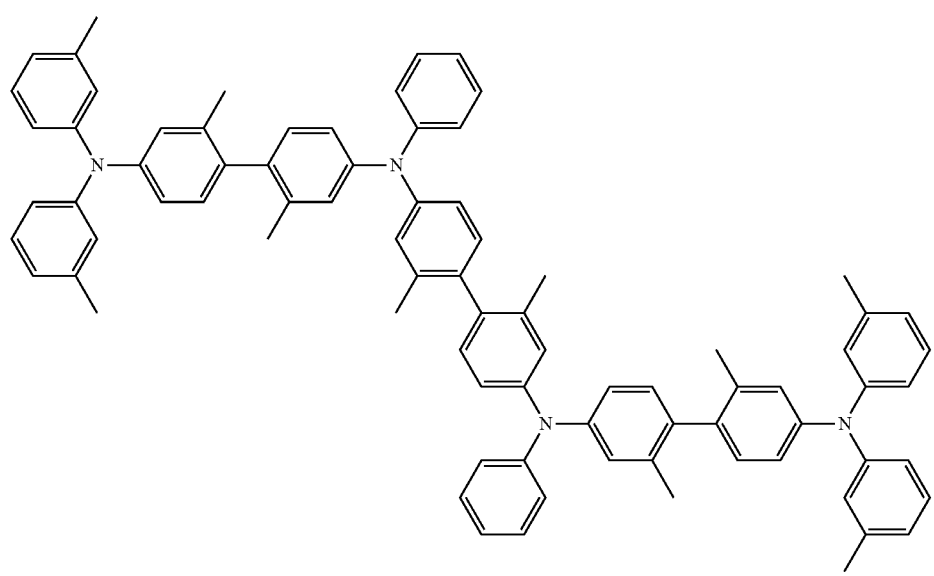

Compound 6-2

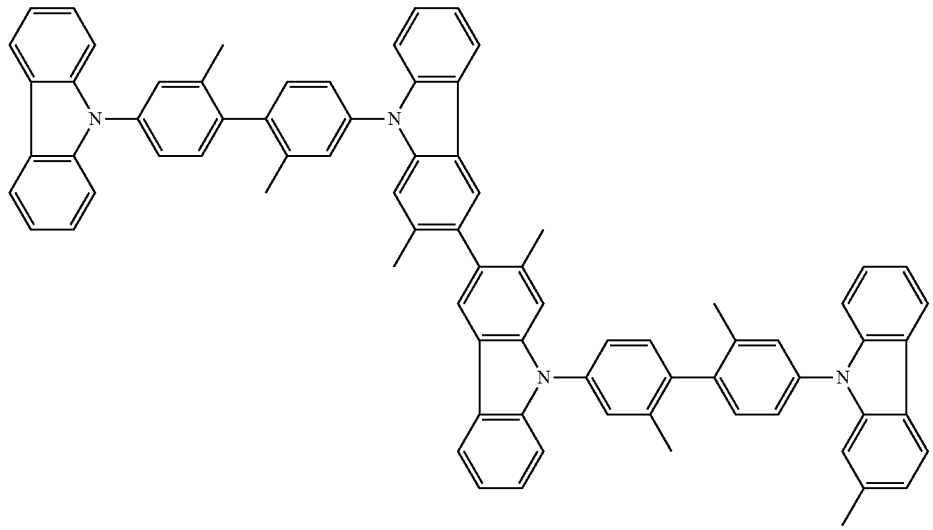

Compound 6-3

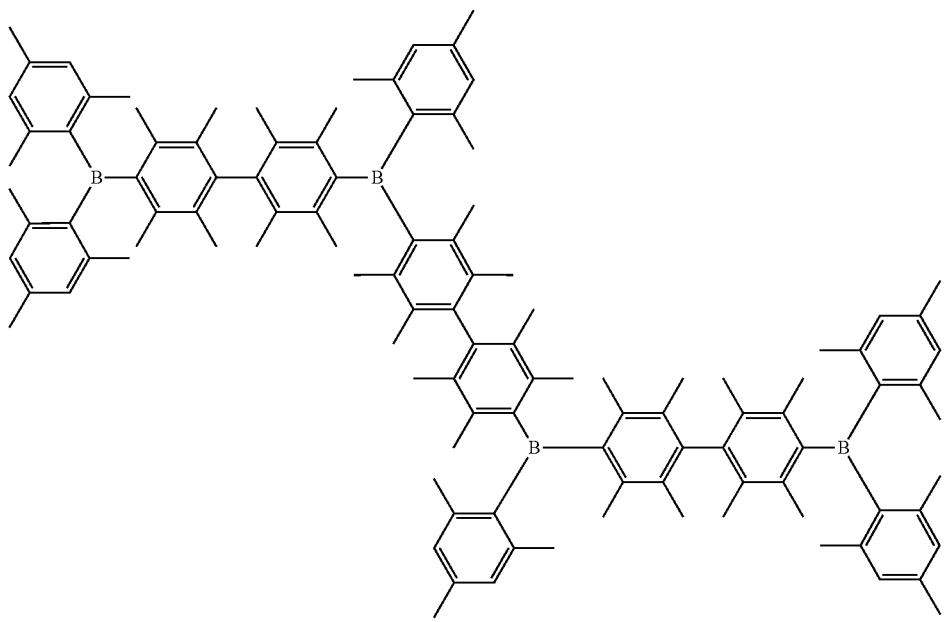

Preferred as acceptors are those which exhibit very high electron acceptability, and preferred examples include above TBPAH and quinones. Of these, DDQ is particularly preferred.

In the positive hole transporting layer, employed are aromatic amines modified to polymers, amorphous low molecular weight compounds, and liquid crystal compounds.

The aromatic amines modified to polymers include those in which aromatic amines are introduced into a primary chain or a side chain, and which are represented by Formulas 1 and 2. Preferred examples include PC-TPB-DEG, PTPDES, Et-PT-PDEK, PVTPA1 and PVTPA2.

Amorphous low molecular weight compounds, as described herein, are those which can be purified via sublimation and exhibit excellent amorphous properties when coated.

Such amorphous low molecular weight compounds include aromatic amine oligomers. Even though having a structure in which aromatic amine is linked, they can be purified via sublimation and exhibit excellent amorphous properties when coated. Examples include Compounds 3-1-5, 4-1-4, and 6-1-3, represented by above Formulas 3-6.

Any of the liquid crystal compounds are applicable as long as they exhibit liquid crystal properties, and include triphenylene derivatives and polyfluorene derivatives exhibiting discotic properties. Further, to enhance positive hole transportability, positive hole transporting dopants may be incorporated.

Conjugated type polymers, non-conjugated type polymers, and amorphous low molecular weight compounds are employed to form a light emitting layer.

The conjugated type polymers include polyphenylenevinylene derivatives, polythiophene derivatives, polyparaphenylene derivatives, polyacetylene derivatives, and polymers in which phosphorescent molecules are introduced into the primary chain.

Polyphenylenevinylene derivatives are those represented by following Formula 7 and examples thereof include PPV, RO-PPV, and CN-PPV.

Formula 7

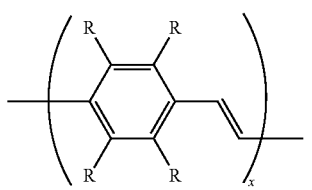
PPV

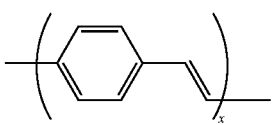
RO-PPV

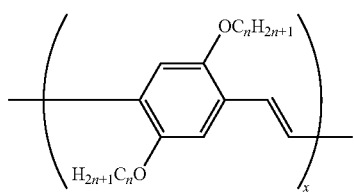
CN-PPV

Polythiophene derivatives are those represented by following Formula 8 and examples thereof include PAT, PCHMT, and POPT.

Formula 8

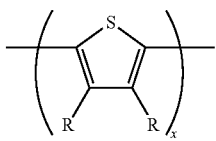
PAT

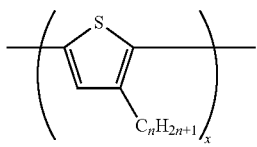
PCHMT

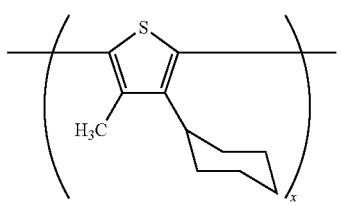
POPT

Polyparaphenylene derivatives are those represented by following Formula 9 and examples thereof include PPP, RO-PPP, FP-PPP, and PDAF.

Formula 9

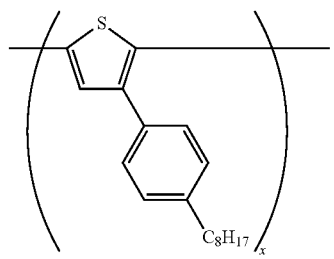
PPP

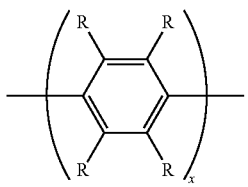
RO-PPP

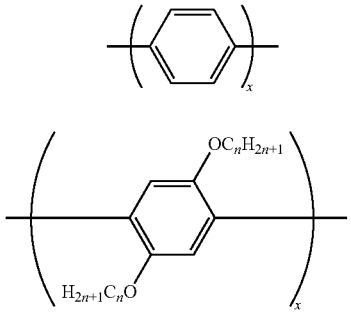
FP-PPP

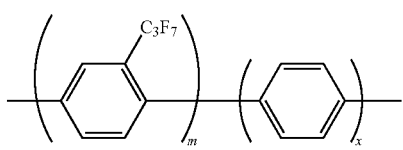
PDAF

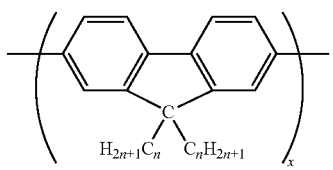

Polyacetylens are those represented by following Formula 10 and examples thereof include PPA and PDPA.

Formula 10

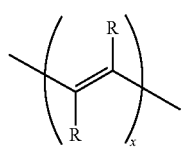

PPA

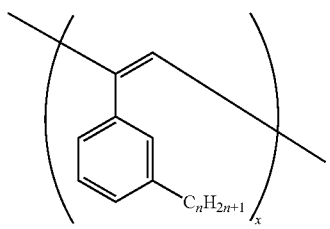

PDPA

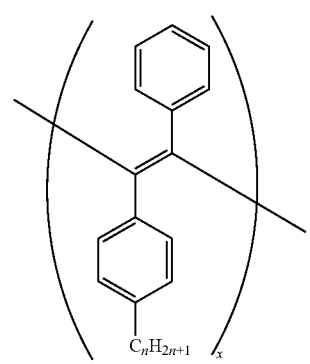

Polymers, in which phosphorescent molecules are introduced into the primary chain, are those in which phosphorescent molecules capable of emitting phosphorescence are introduced into the primary chain. Preferred as the phosphorescent molecules are orthometal complexes and platinum complexes, and Ir complexes are particularly preferred. The examples thereof are those represented by following Formula 11 and include Compounds 11-1 and 11-2.

Formula 11

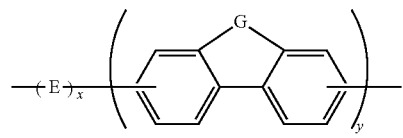

E: Ir complex
G: N—R₁CR₂

Compound 11-1

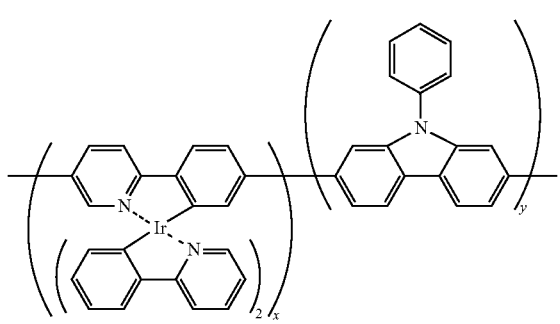

Compound 11-2

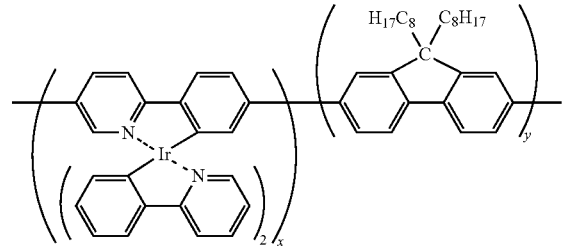

The non-conjugated type polymers are those in which functional molecules are bonded in the side chain and are represented by following Formula 12, which include PVCz and Compound 12-1.

Formula 12

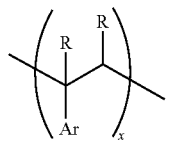

PVCz

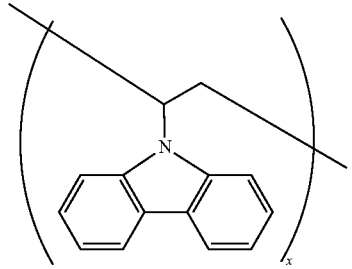

Compound 12-1

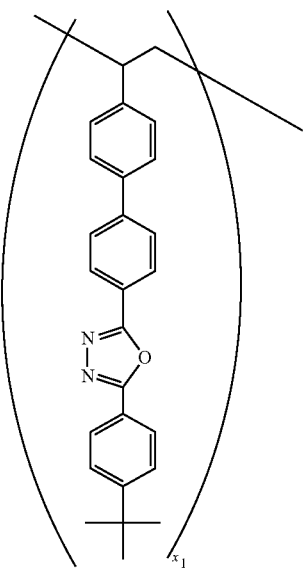

Further, employed may be polymers in which phosphorescent molecules are bonded to the side chain. Examples include Compounds 13-1 and 13-2, represented by Formula 13.

Formula 13

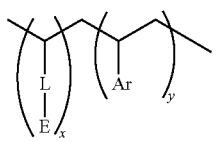

L: linking group
E: Ir complex

Compound 13-2

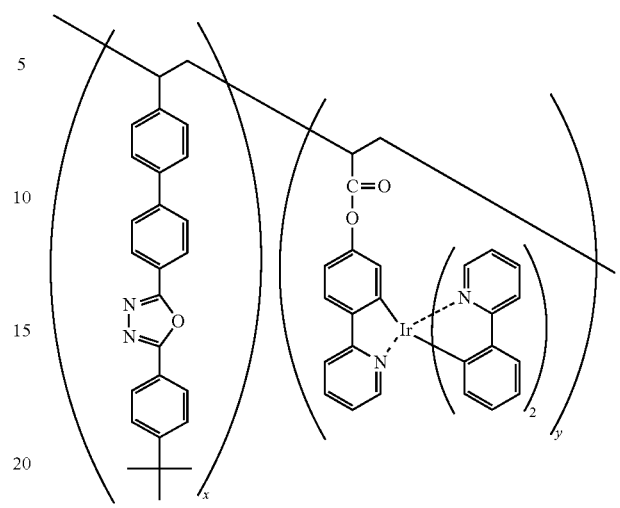

Compound 13-1

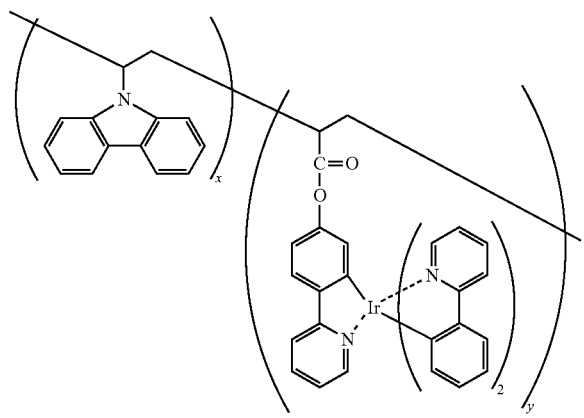

As noted above, amorphous low molecular weight compounds, as described herein, are those which can be purified via sublimation and exhibit excellent amorphous properties when coated. Compounds which exhibit desired amorphous properties are preferably those of relatively high Tg (glass transition temperature). Examples thereof are represented by any of above Formulas 3-6 and following Formula 14-17, which include Compounds 3-1-5, 4-1-4, 5-1-4, 6-1-3, 14-1-15, 15-1-4, 16-1-3, and 17-1-5.

Formula 14

Ar─[Ar─Ar]$_n$ $n$: 2-6

Compound 14-1

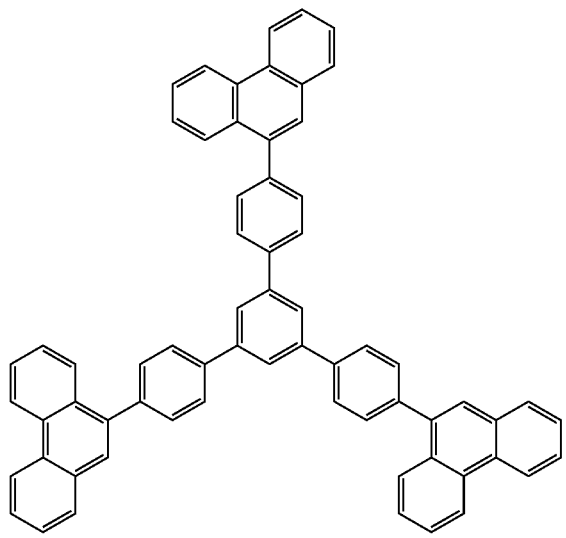

-continued
Compound 14-2
Compound 14-3
Compound 14-4
Compound 14-5
Compound 14-6
Compound 14-7
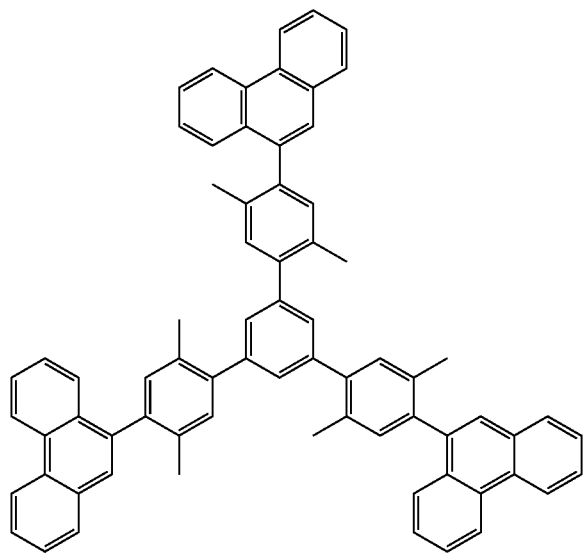

-continued
Compound 14-8
Compound 14-9
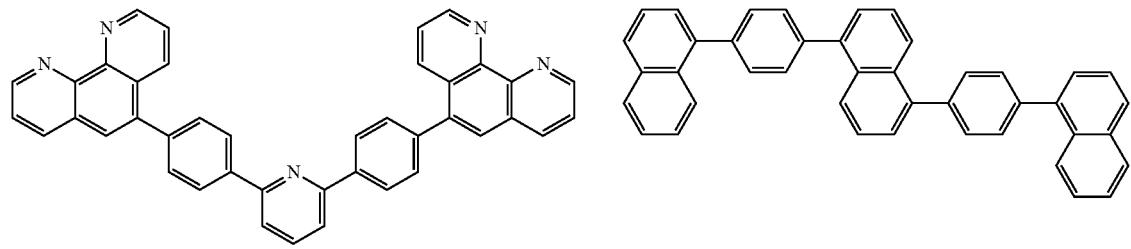
Compound 14-10
Compound 14-11
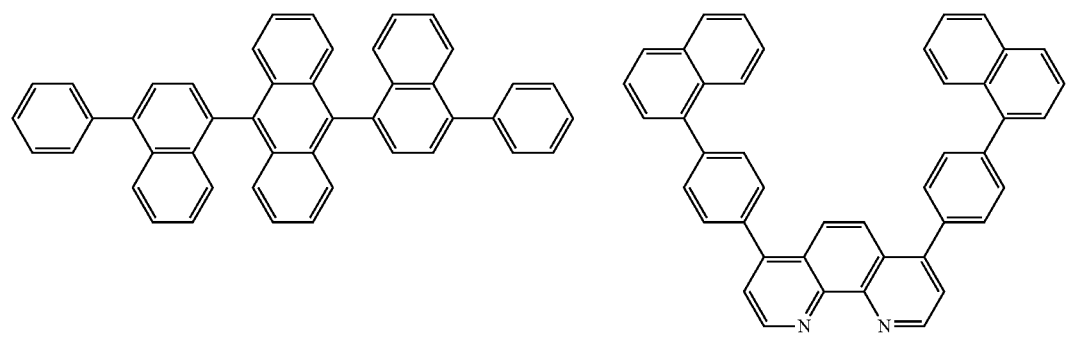
Compound 14-12
Compound 14-13
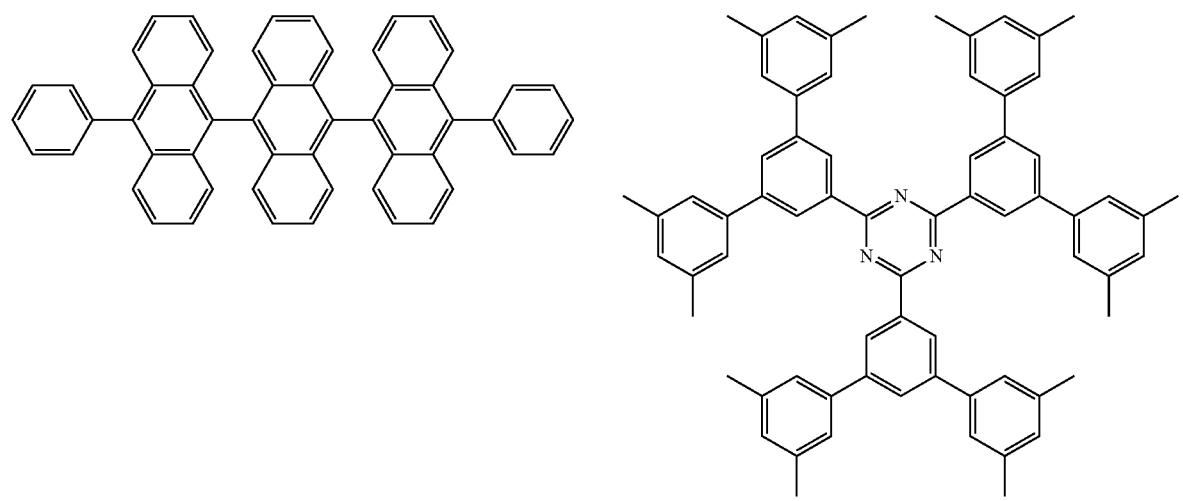
Compound 14-14
Compound 14-15
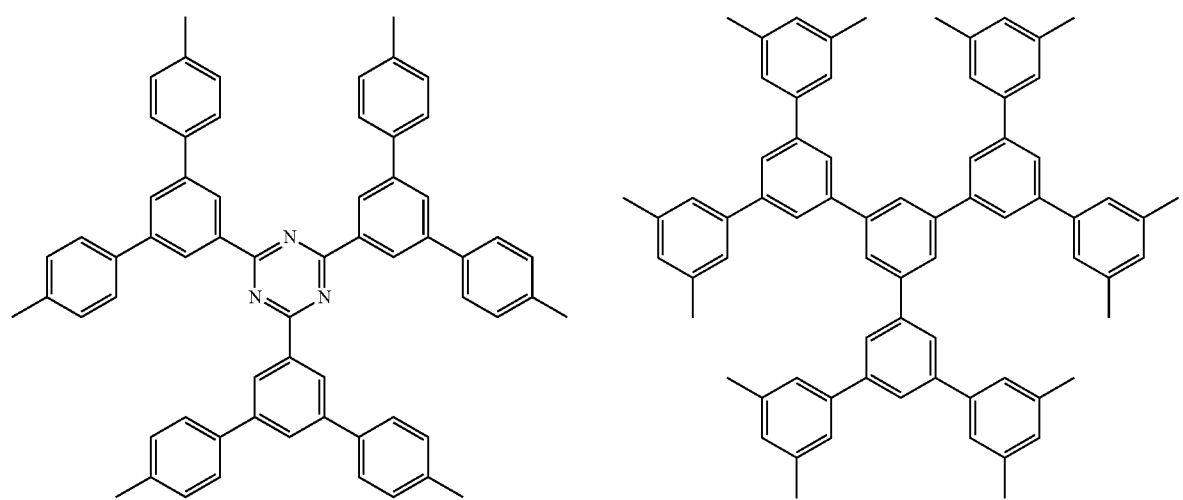

Formula 15
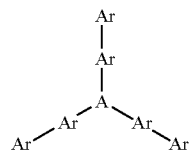
A: N, B, and P
Compound 15-1
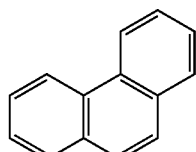
Compound 15-2
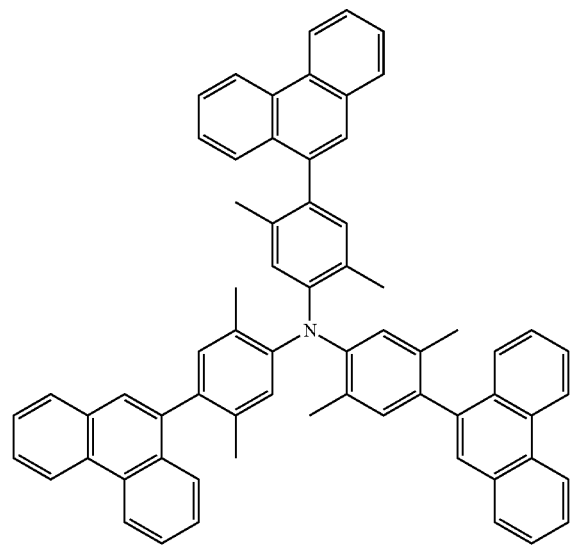
Compound 15-3
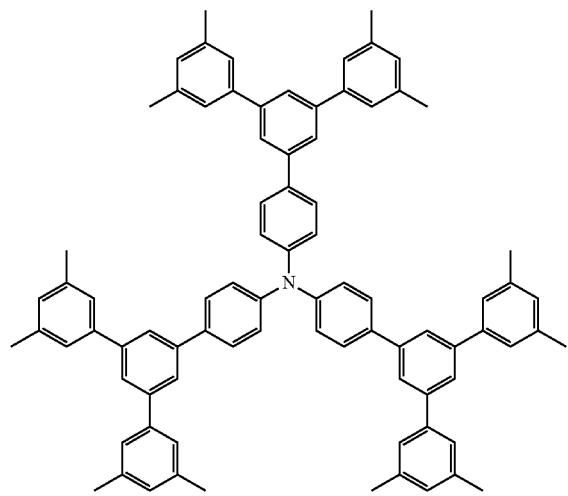
Compound 15-4
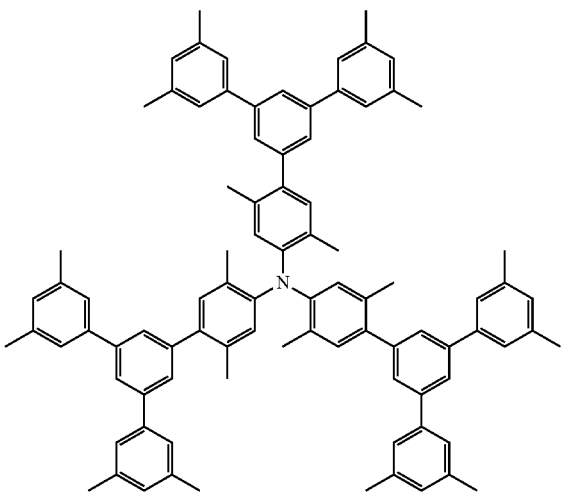
Formula 16
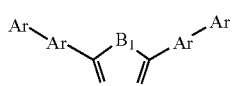
B₁: N—Ar and O
B₂: C and N
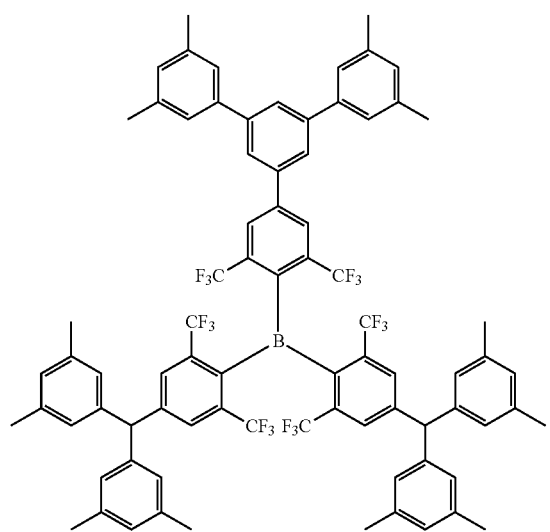

Compound 16-1
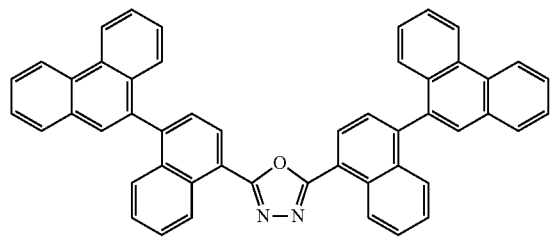
Compound 16-2
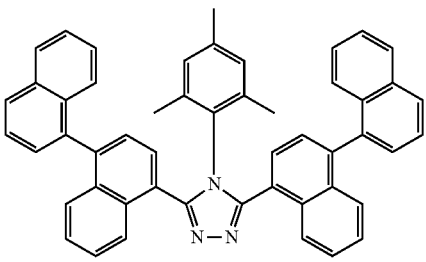
Compound 16-3
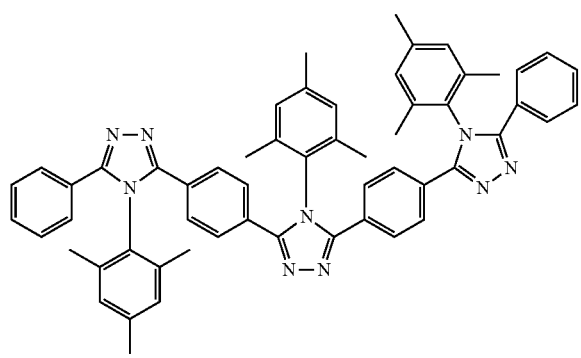
Formula 17
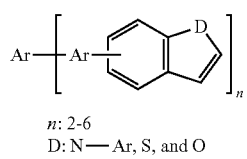
n: 2-6
D: N—Ar, S, and O
Compound 17-1
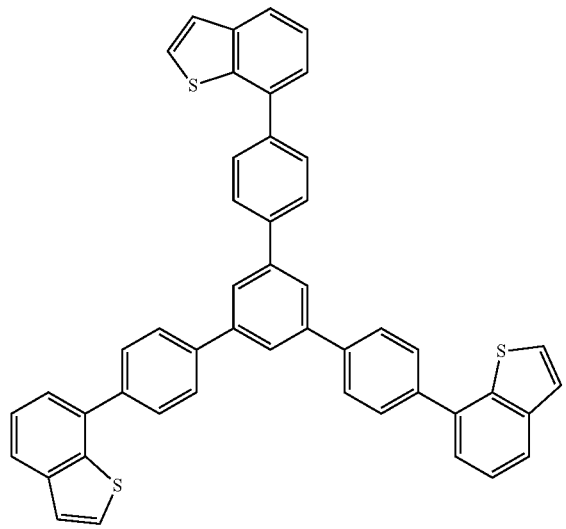
Compound 17-2
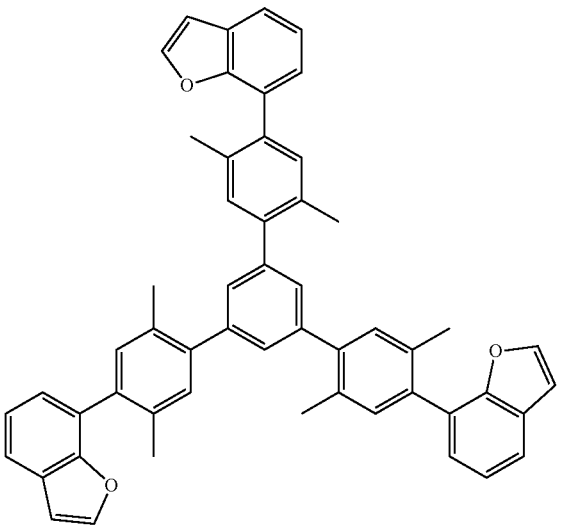
Compound 17-3
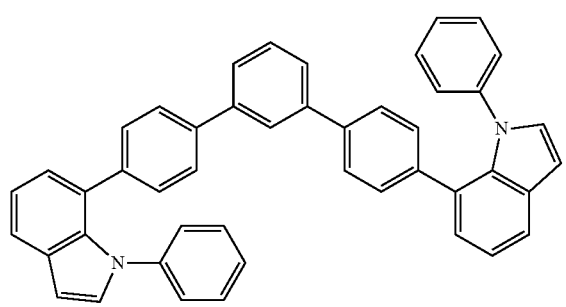

Compound 17-4

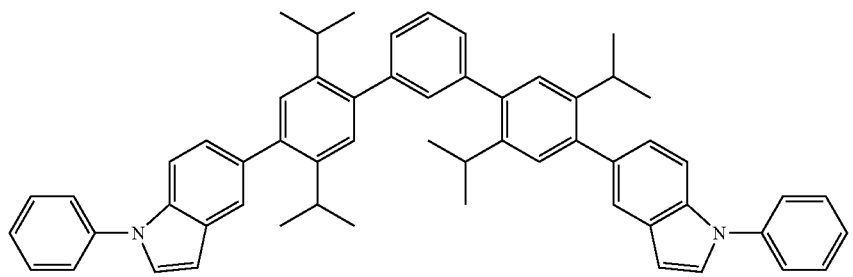

Compound 17-5

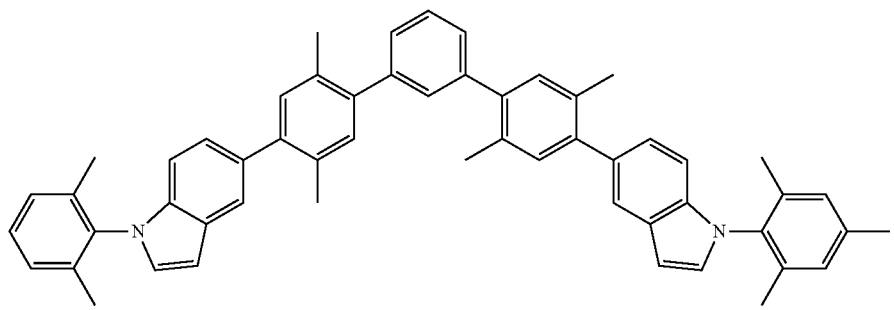

If desired, added to the above polymers or compounds may be dopants which include a light emitting dopant and an electric charge transporting dopant. Listed as the light emitting dopants are fluorescent dopants and phosphorescent dopants. They are selected depending on desired emitted color. As fluorescent dopants, those which exhibit a high fluorescent quantum yield are preferred, which include laser dyes.

As phosphorescent dopants, compounds, of which phosphorescence is observed at room temperature, are preferred. Of these, orthometal complexes, platinum complexes are preferred, and Ir complexes are more preferred. Examples include Ir-1-13.

Ir-1

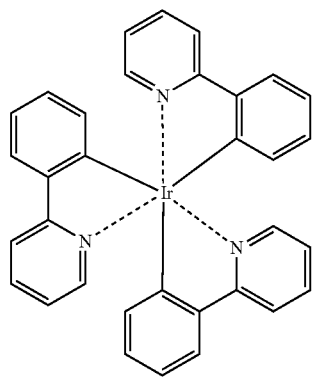

-continued

Ir-2

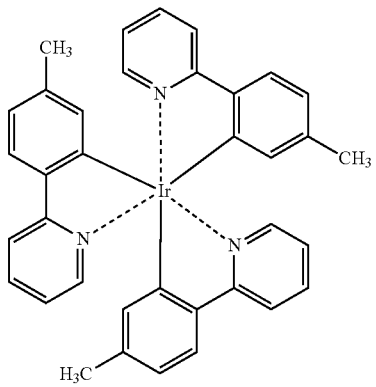

Ir-3

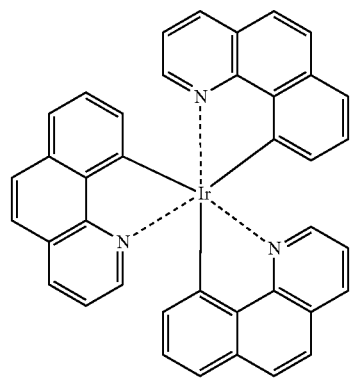

-continued

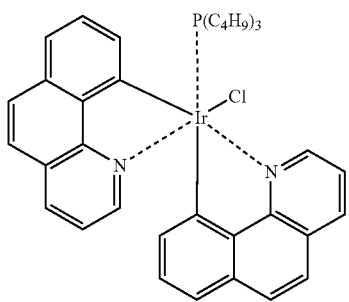
Ir-4

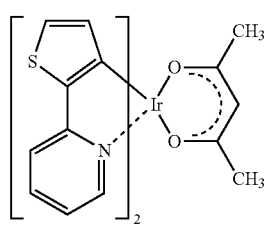
Ir-5

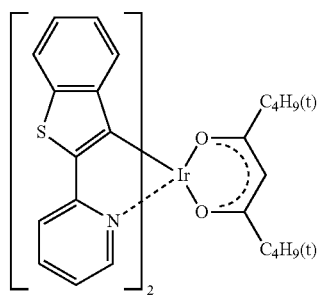
Ir-6

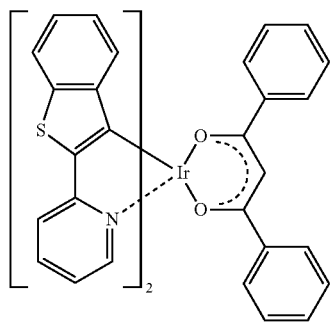
Ir-7

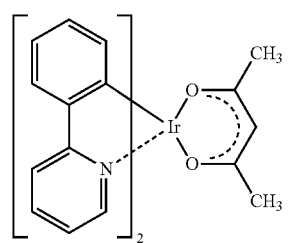
Ir-8

-continued

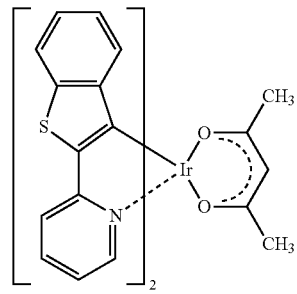
Ir-9

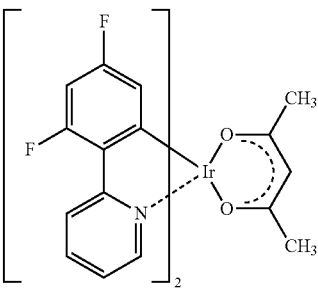
Ir-10

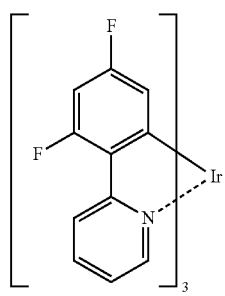
Ir-11

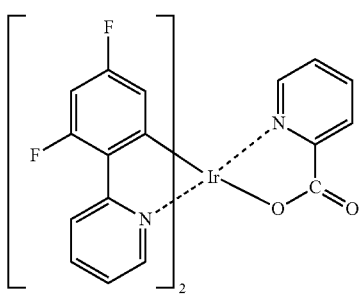
Ir-12

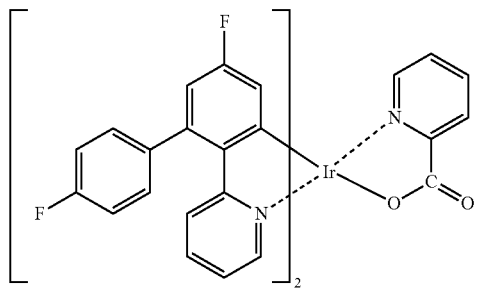
Ir-13

Electric charge transporting dopants include positive hole transporting dopants and electron transporting dopants. Listed as the positive hole dopants are aromatic amines, while listed as the electron transporting dopants are heterocycles.

It is possible to employ the polymers or compounds listed for the light emitting layer to form an electron transporting layer. If desired, electron transporting dopants may be employed, and examples thereof include heterocyclic compounds. Further, a mixture of a plurality of polymers listed herein and other polymers may be employed. Still further, monomers which are employed to synthesize the above polymers and monomers of polymers listed herein or monomers of other polymers are copolymerized and the resulting copolymers may be employed in the present invention.

It is possible to employ the organic EL element of the present invention as a display and a light emitting light source. In the display, it is possible to display full-color by employing three types of organic EL elements emitting blue, red and red lights.

Displays include televisions, personal computers, mobile devices, AV devices, letter broadcasting displays, and information displays in automobiles. Specifically, it is possible to use it as a display to reproduce still and moving images. A driving system, when employed as a display for reproducing moving images, may be either a simple matrix (passive matrix) system or an active matrix system.

Light emitting light sources include home lighting, car interior lighting, backlight for clocks and liquid crystals, advertisement boards, traffic lights, light sources of optical memory media, light sources of electrophotographic copiers, light sources of optical processing processors, and light sources of optical sensors. The organic EL elements of the present invention are suitable for various types of lighting.

EXAMPLES

The present invention will now be detailed with reference to examples; however, the present invention is not limited thereto.

Examples

Preparation of Organic EL Element 1

Full-color Organic EL Element 1 composed of a cathode substrate/cathode/electron transporting layer/light emitting layer/positive hole transporting layer/anode/anode substrate was prepared as described below.

(A) Preparation of Cathode Laminated Body 1 (Cathode Substrate/Cathode/Electron Transporting Layer)

Both sides of a sheet of Al foil (at a thickness of 30 μm) was laminated with a 50 μm thick polyimide sheet (UPILEX 50S, produced by Ube Industries, Ltd.), and the resulting foil was cut to 35 mm×40 mm, whereby a cathode substrate was prepared.

Figure 12:
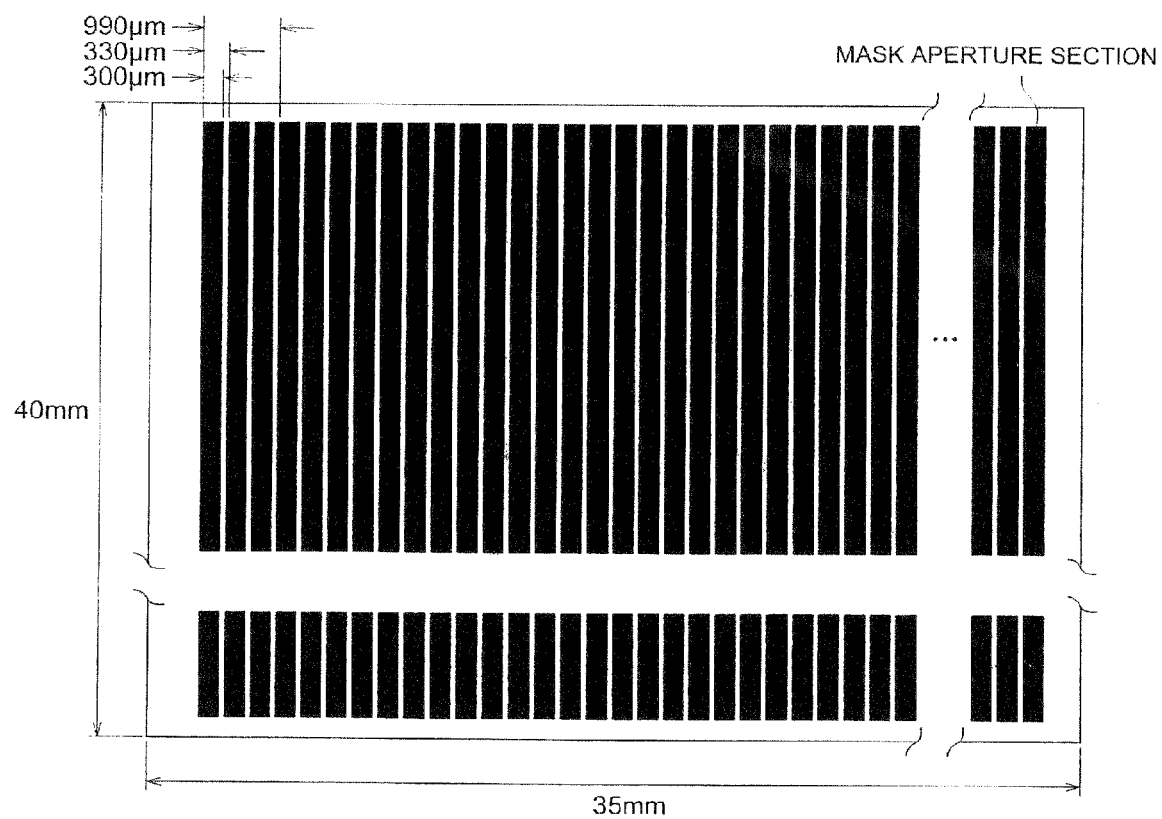
FIG. 12 is a structural view (a stripe arrangement) of the mask for a cathode.
Figure 13:
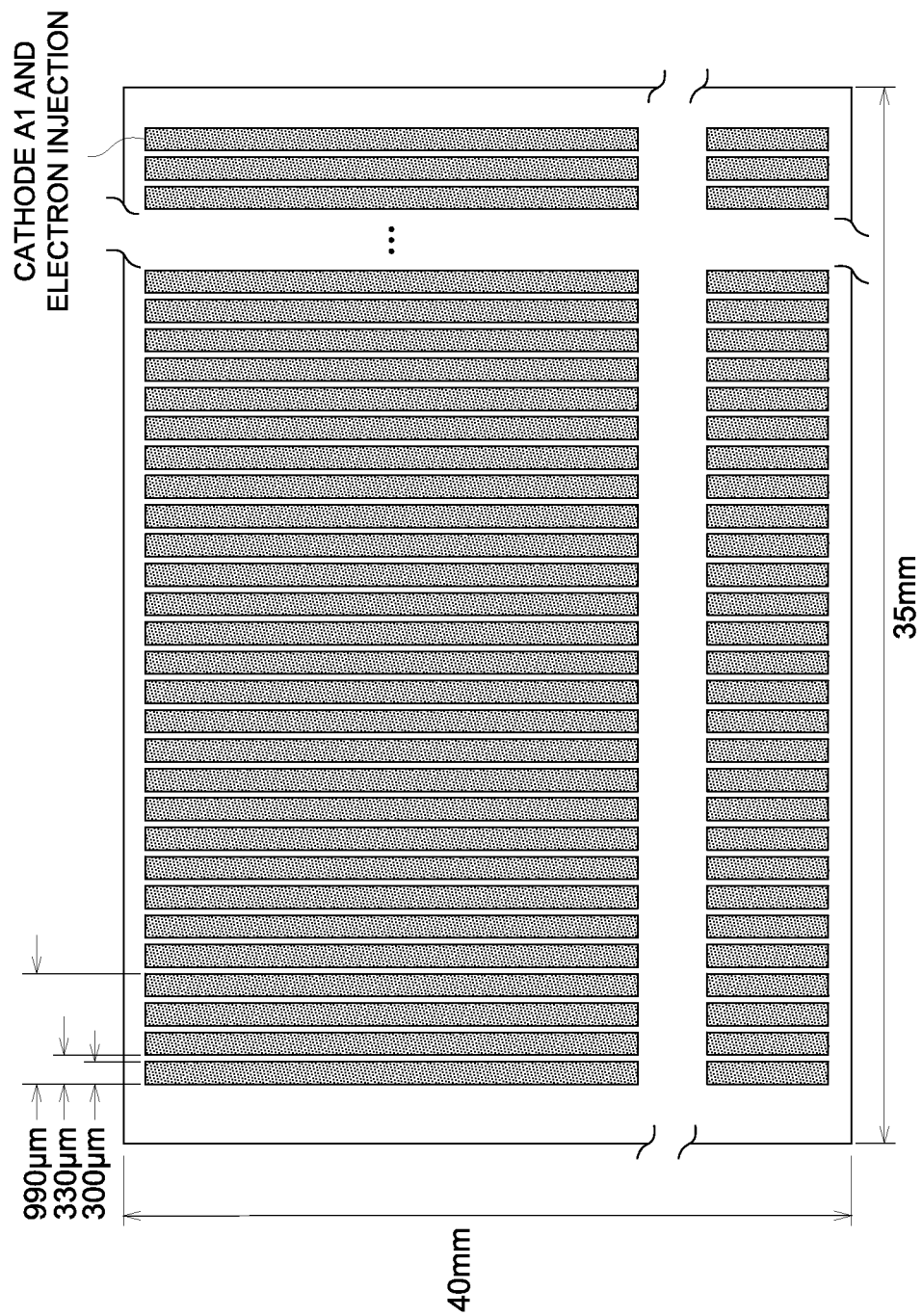
FIG. 13 shows the cathode substrate after deposition of cathode Al and an electron injecting layer.

The above cathode substrate was placed in a cleaning vessel. After cleaning it via i-propyl alcohol (IPA), it was subjected to oxygen plasma treatment. Subsequently, a mask (a mask arranged with stripes of a line width of 300 μm and an interval of 30 μm, as shown in FIG. 12) was arranged, and Al was vapor-deposited at a reduced pressure of about 0.1 mPa, whereby a stripe-structured cathode of a film thickness of 0.2 μm was formed (refer to FIG. 13).

Continuously, as an electron injecting member, LiF was vapor-deposited in the same pattern as the Al layer, whereby a 3 nm thick electron injecting layer was formed.

Subsequently, the above mask was removed and an electron transporting organic layer liquid coating composition, formulated as described below, was applied employing a spin coater and the resulting coating was dried at 60° C. to form a 40 nm thick electron transporting layer, whereby Cathode Laminated body 1 was prepared.

| | |
|---|---|
| Electron Transporting Compound 12-1 (Mw of 50,000) | 40 parts by weight |
| Dichloroethane | 3200 parts by weight |

(B) Preparation of Anode Laminated Body 1 (Anode Substrate/Anode/Positive Hole Transporting Layer)

Figure 14:
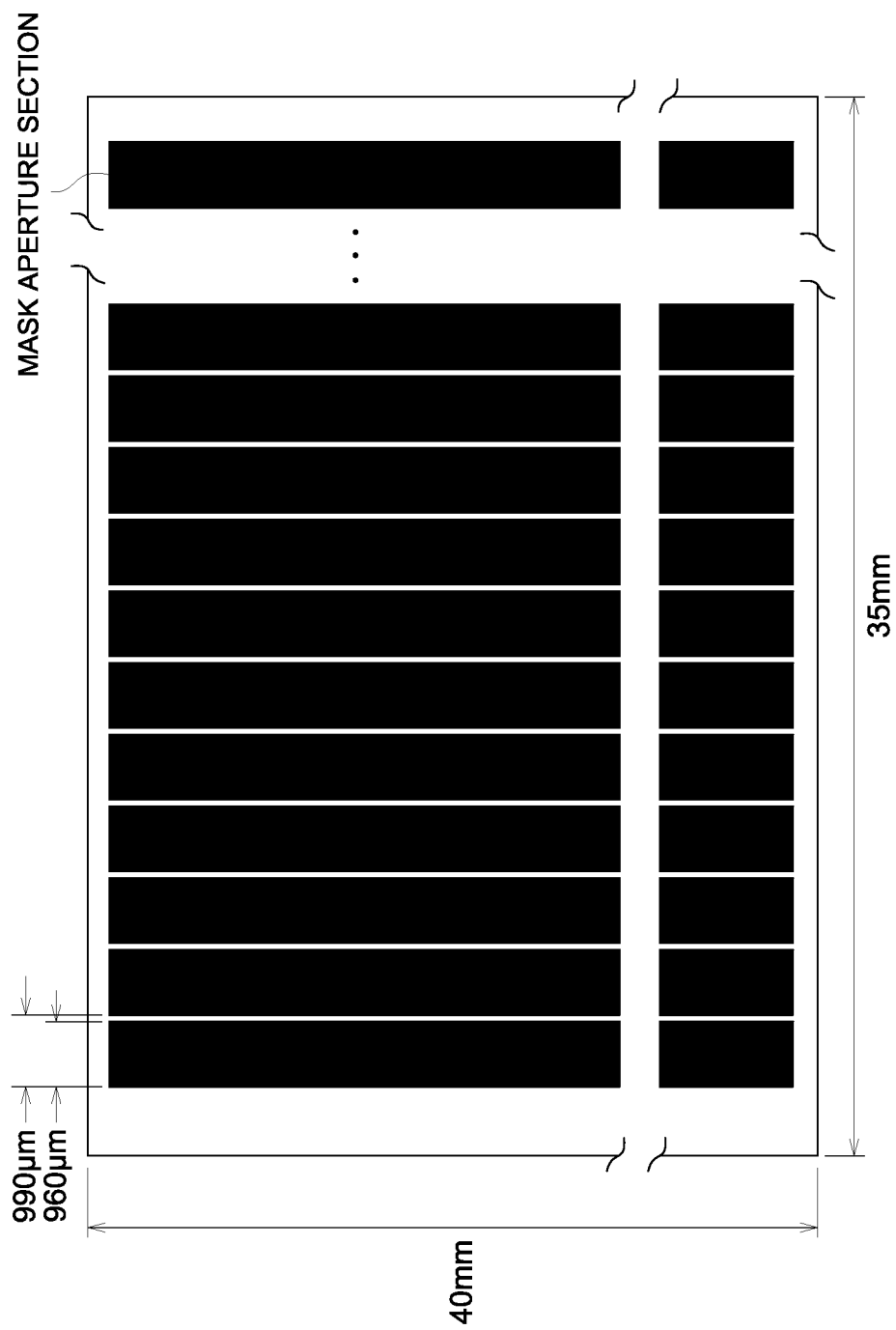
FIG. 14 is a structural view (a stripe arrangement) of a mask for the anode.
Figure 15:
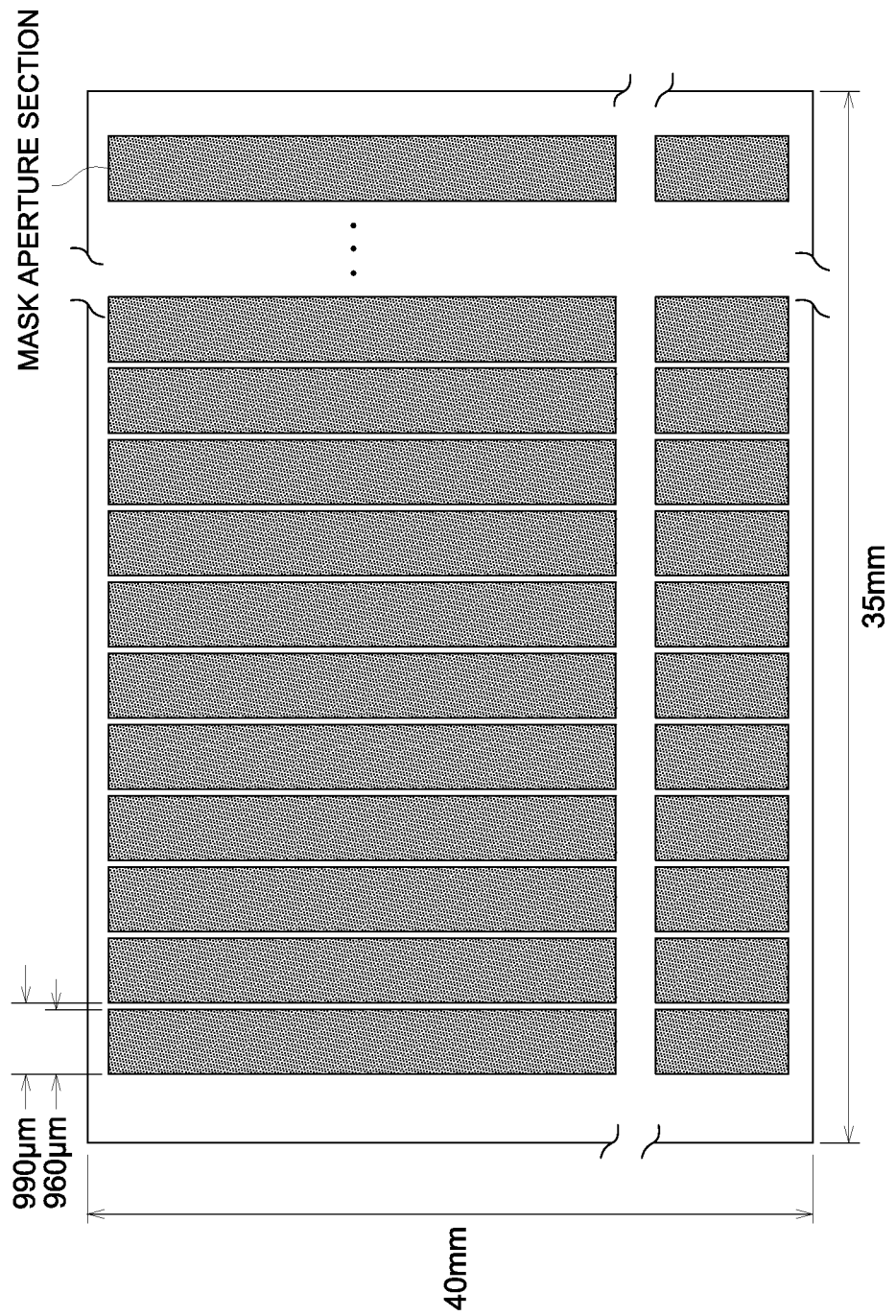
FIG. 15 shows an anode substrate after deposition of anode ITO.

A 0.7 mm×35 mm×40 mm glass plate, employed as an anode substrate, was introduced into a vacuum chamber, and a patterned mask (a mask arranged with stripes of a line width of 960 μm and an interval of 30 μm, shown in FIG. 14) was arranged. Subsequently, employing an ITO target (at a mole ratio of indium:tin of 95:5) containing 10% $SnO_2$ by weight, a stripe structure anode composed of a 0.2 μm thick ITO thin layer was formed (refer to FIG. 15).

The surface conductivity of the above node was 10Ω/□. The anode substrate on which the above anode was formed was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby Anode Laminated Body 1 was prepared.

| | |
|---|---|
| Positive hole transporting compound (PTPDES) | 40 parts by weight |
| Additive (TBPAH) | 10 parts by weight |
| Dichloroethane | 3200 parts by weight |

Figure 16:
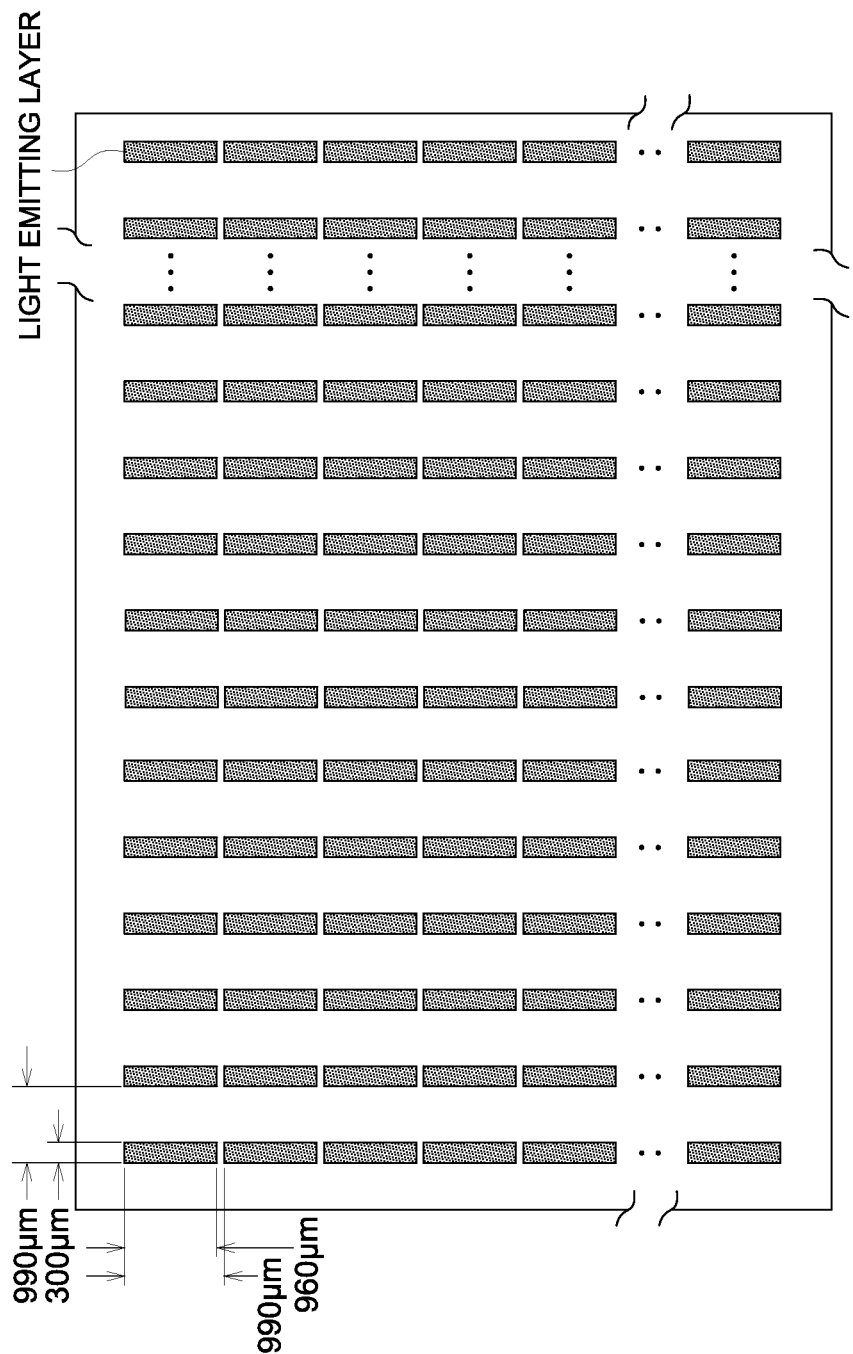
FIG. 16 is a structural view (stripe arrangement) of the primary transfer sheet.

(C) Formation of Light Emitting Organic Layer Patterned onto Transfer Sheet (1) Preparation of Primary Transfer Sheet (a) Preparation of Primary Transfer Sheet for Blue Polyvinyl carbazole (Mw of 63,000, produced by Aldrich, Co.) and iridium complex (Ir-12) as an orthometal complex at a weight ratio of 40:1 were dissolved in dichloromethane. The resulting liquid coating composition was applied onto a 5 μm thick temporary support composed of PET film (produced by Teijin Ltd.) via a gravure coater and dried, whereby a 40 nm thick blue light emitting layer (light emitting pixels) of a longitudinal length of 960 μm and a lateral length of 300 μm which is pattern-like at longitudinal and lateral cycles of 990 μm was prepared. The pattern arrangement was subjected to a stripe arrangement (refer to FIG. 16).

(b) Preparation of Primary Transfer Sheet for Green

Polyvinyl carbazole (Mw of 63,000, produced by Aldrich Co.), and iridium complex (Ir-1) as an orthometal complex at a weight ratio of 40:1 were dissolved in dichloromethane. The resulting liquid coating composition was applied onto a 5 μm thick temporary support composed of PET film (produced by Teijin Ltd.) via a gravure coater and dried, whereby a 40 nm thick green light emitting layer (light emitting pixels) of a longitudinal length of 960 μm and a lateral length of 300 μm which is pattern-like at longitudinal and lateral cycles of 990 μm was prepared. The pattern arrangement was subjected to a stripe arrangement in the same manner as blue (refer to FIG. 16).

(c) Preparation of Primary Transfer Sheet for Red

Polyvinyl carbazole (Mw of 63,000, produced by Aldrich Co.), and iridium complex (Ir-9) as an orthometal complex at a weight ratio of 40:1 were dissolved in dichloromethane. The resulting liquid coating composition was applied onto a 5 μm thick temporary support composed of PET film (produced by Teijin Ltd.) via a gravure coater and dried, whereby a 40 nm thick red light emitting layer (light emitting pixels) of a longitudinal length of 960 µm and a lateral length of 300 µm which is pattern-like at longitudinal and lateral cycles of 990 µm was prepared. The pattern arrangement was subjected to a stripe arrangement in the same manner as blue (refer to FIG. 16).

As described above, three types of primary transfer materials were prepared in which light emitting pixels of blue, green, and red are formed to be pattern-like.

(2) Preparation of Transfer Sheet which are Subjected to B, G, and R Patterning.

Figure 17:
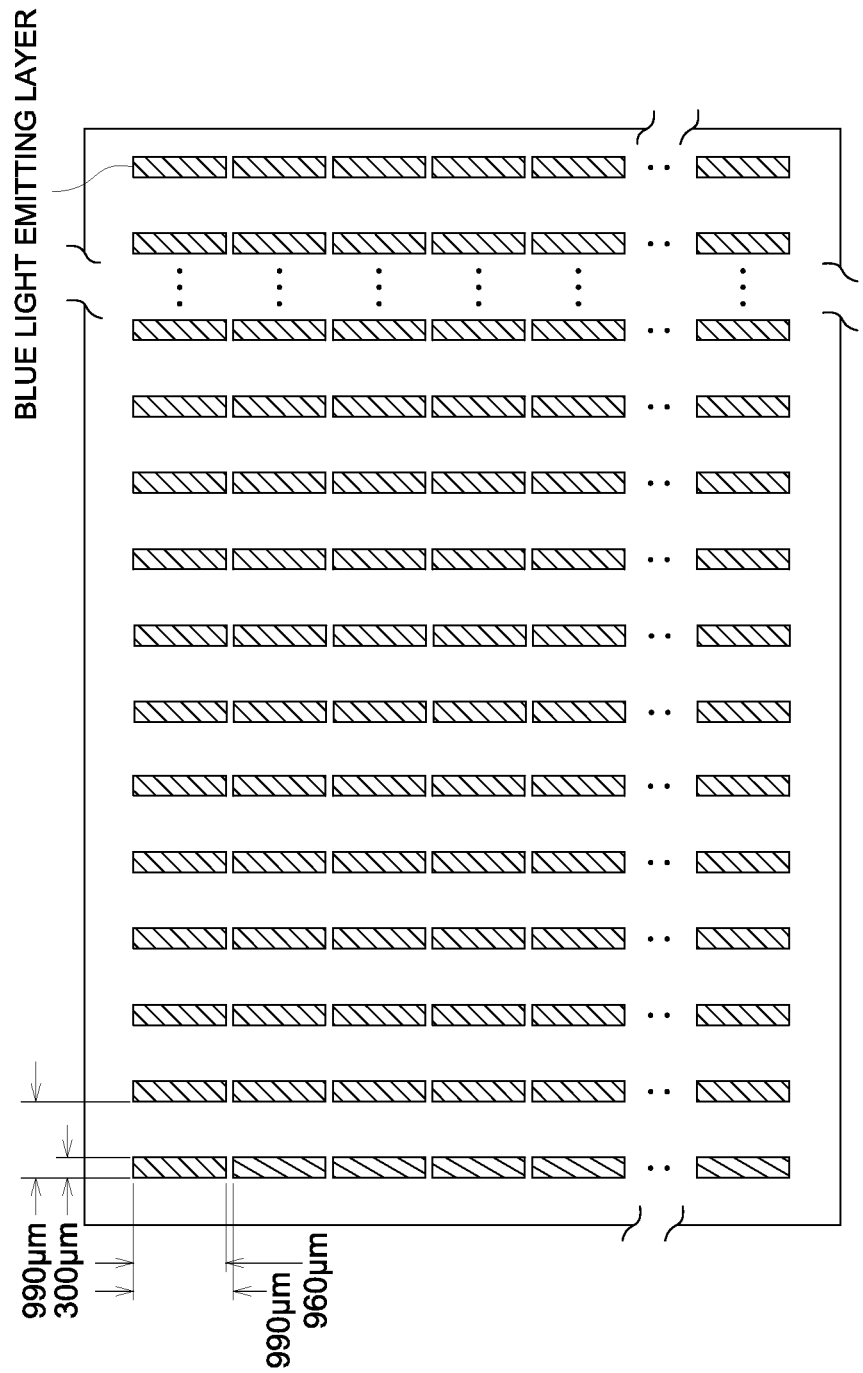
FIG. 17 is a structural view of the transfer sheet after completion of transfer from the primary transfer sheet for blue.

The organic layer side of the primary transfer sheet for blue was overlapped onto a 5 µm thick temporary support for a transfer sheet, composed of a PET film (produced by Teijin Ltd.), and heat and pressure were applied onto the rear side of the primary transfer sheet via conveyance at a rate of 0.05 m/minute between paired rollers exhibiting a pressing pressure of 0.3 MPa (one roller being a 160° C. heating roller). Subsequently, by peeling the primary transfer sheet from the temporary support, a blue light emitting layer was transferred onto the transfer sheet (refer to FIG. 17).

Subsequently, the organic layer side of the primary transfer sheet for green was overlapped by shifting by one-third cycle (330 µm) in the lateral direction of the pixels so that pixels were not overlapped, and the green light emitting layer was transferred onto a transfer sheet (refer to FIG. 19).

(D) Transfer of Light Emitting Organic Layer to Cathode Laminated Body 1

Figure 20:
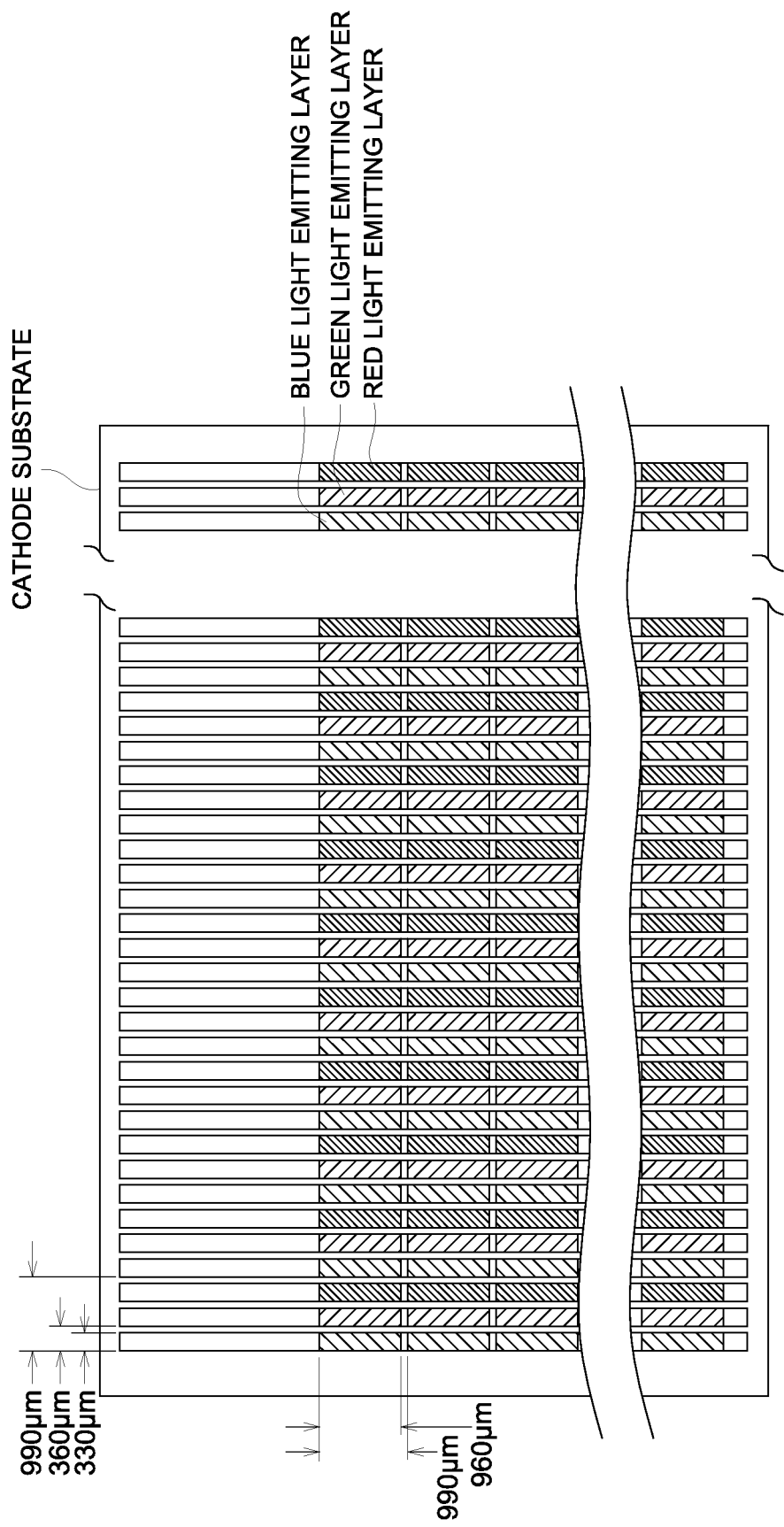
FIG. 20 is a structural view of the first laminated body after completion of transfer to a cathode substrate from the transfer sheet.

The light emitting organic layer side of the transfer sheet which was subjected to B, G, and R patterning, prepared in (C) was overlapped on the electron transporting layer side of cathode laminated body 1, prepared as in (A), so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, a B, G, and R three-color light emitting layer was transferred onto the electron transporting side of Cathode Laminated Body 1 (cathode substrate/cathode/electron transporting layer), prepared in (A), whereby First Laminated Body 1 (refer to FIG. 20) was prepared.

(E) Lamination of First Laminated Body 1 with Anode Laminated Body 1

Figure 21:
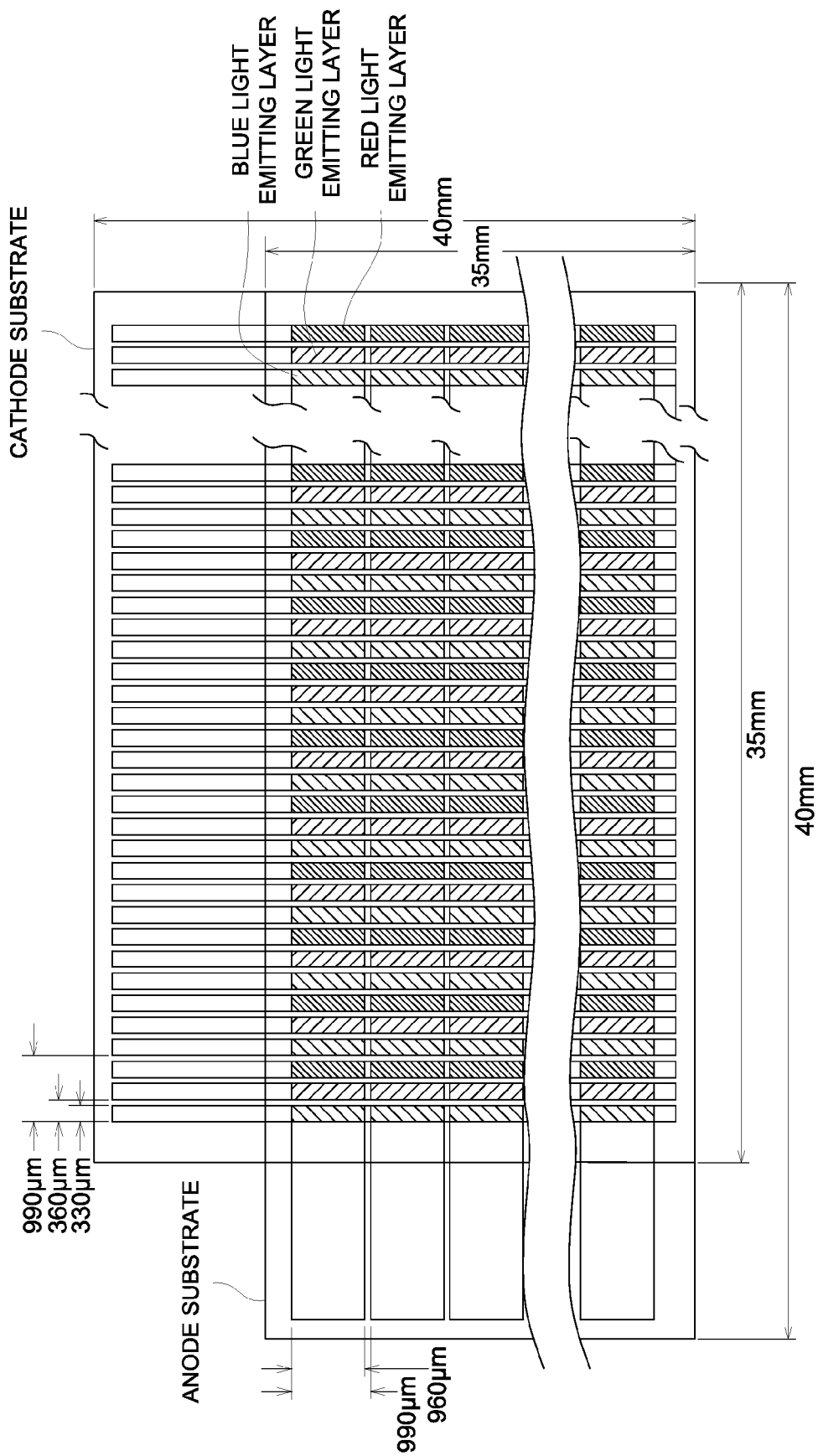
FIG. 21 is a structural view of the organic EL element after adhesion of the first laminated body to the anode substrate.

The light emitting side of First Laminated Body 1 prepared in (D) was faced with the positive hole transporting layer of Anode Laminated Body 1 and overlapped so that the striped pattern in the lateral direction of light emitting pixels coincided with the striped pattern of the anode. Subsequently, overlapping was carried out by rotating the long edge by 90 degrees as shown in FIG. 21.

Heat and pressure were applied onto the support side of First Laminated Body 1 via conveyance at a rate of 0.05 m/minute between paired rollers exhibiting a pressing pressure of 0.3 MPa (one roller being a 160° C. heating roller), whereby First Laminated Body 1 and Anode Laminated Body 1 were laminated.

Subsequently, an aluminum lead was extended from each of the lines of the anode and the cathode, whereby a 32-pixel× 32-pixel passive driving type full-color organic EL element, composed of an cathode substrate/cathode/electron transporting layer/light emitting layer/positive hole transporting layer/anode/anode substrate, was prepared.

(F) Sealing of Side Section

UV curing type epoxy based adhesive agent XNR5493T (produced by Nagase Ciba Co., Ltd.) was coated in the adhesive agent position, shown in FIG. 2, of the organic EL element prepared as above to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby Organic Element 1 of the present invention was prepared. Meanwhile, the above sealing was carried out in the globe box in which the ambient air was replaced with nitrogen. The dew point was −60° C., and oxygen concentration was 10 ppm.

Example 2

As described below, full-color Organic EL Element 2 was prepared, which was composed of a cathode substrate/cathode/electron transporting layer/light emitting layer/positive hole transporting layer/anode/anode substrate.

(A) Preparation of Cathode Laminated Body 2 (Cathode Substrate/Cathode/Electron Transporting Layer)

Both sides of an Al foil (at a thickness of 30 µm) was laminated with a 50 µm thick polyimide sheet (UPILEX 50S, produced by Ube Industries, Ltd.), and the resulting foil was cut to 35 mm×40 mm, whereby a cathode substrate was prepared.

The above cathode substrate was placed in a cleaning vessel. After cleaning it via i-propyl alcohol (IPA), an oxygen plasma treatment was applied. Subsequently, a mask (a mask arranged with stripes of a line width of 300 µm and an interval of 30 µm, shown in FIG. 12) for deposition, which was subjected to patterning, was arranged, and Al was vapor-deposited at a reduced pressure of about 0.1 mPa, whereby a stripe-structured cathode of a film thickness of 0.2 µm was formed (refer to FIG. 12).

Continuously, as an electron injecting material, LIF was vapor-deposited in the same pattern as the Al layer, whereby a 3 nm thick electron injecting layer was formed.

Subsequently, the above mask was removed and an electron transporting organic layer liquid coating composition, formulated as described below, was applied employing a spin coater and the resulting coating was dried at 60° C. to form a 40 nm thick electron transporting layer, whereby cathode laminated body 2 was prepared.

| | |
|---|---|
| Electron Transporting Compound 12-1 (Mw of 50,000) | 40 parts by weight |
| Dichloroethane | 3200 parts by weight |

(B) Preparation of Anode Laminated Body 2 (Anode Substrate/Anode/Positive Hole Transporting Layer)

A 0.7 mm×35 mm×40 mm glass plate employed as an anode substrate was introduced into a vacuum chamber, and a patterned mask (a mask arranged with stripes of a line width of 960 µm and an interval of 30 µm, shown in FIG. 14) was arranged. Subsequently, employing an ITO target (at a mole ratio of indium:tin of 95:5) containing 10% SnO$_2$ by weight, a stripe structured anode composed of a 0.2 µm thick ITO thin layer was formed (refer to FIG. 15).

The surface conductivity of the above anode was 10Ω/□. The anode substrate on which the above anode was formed was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby anode laminated body 2 was prepared.

| Positive hole transporting compound (PTPDES) | 40 parts by weight |
|---|---|
| Additive (TBPAH) | 10 parts by weight |
| Dichloroethane | 3200 parts by weight |

(C) Formation of Light Emitting Organic Layer Patterned onto Transfer Sheet (1) Preparation of Primary Transfer Sheet (a) Preparation of Primary Transfer Sheet for Blue Compound CP-2 (Mw of 50,000) and iridium complex (Ir-12) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick blue light emitting layer was prepared.

(b) Preparation of Primary Transfer Sheet for Green

Compound CP-2 (Mw of 50,000) and tris(2-phenylpyridine)iridium complex (Ir-1) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick green light emitting layer was prepared.

Compound CP-2 (Mw of 50,000) and iridium complex (Ir-9) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick blue light emitting layer was prepared.

As described above, three types of primary transfer materials of blue, green, and red light emitting organic layers were prepared on temporary supports.

(2) Preparation of Transfer Sheet which were Subjected to B, G, and R Patterning.

Figure 22:
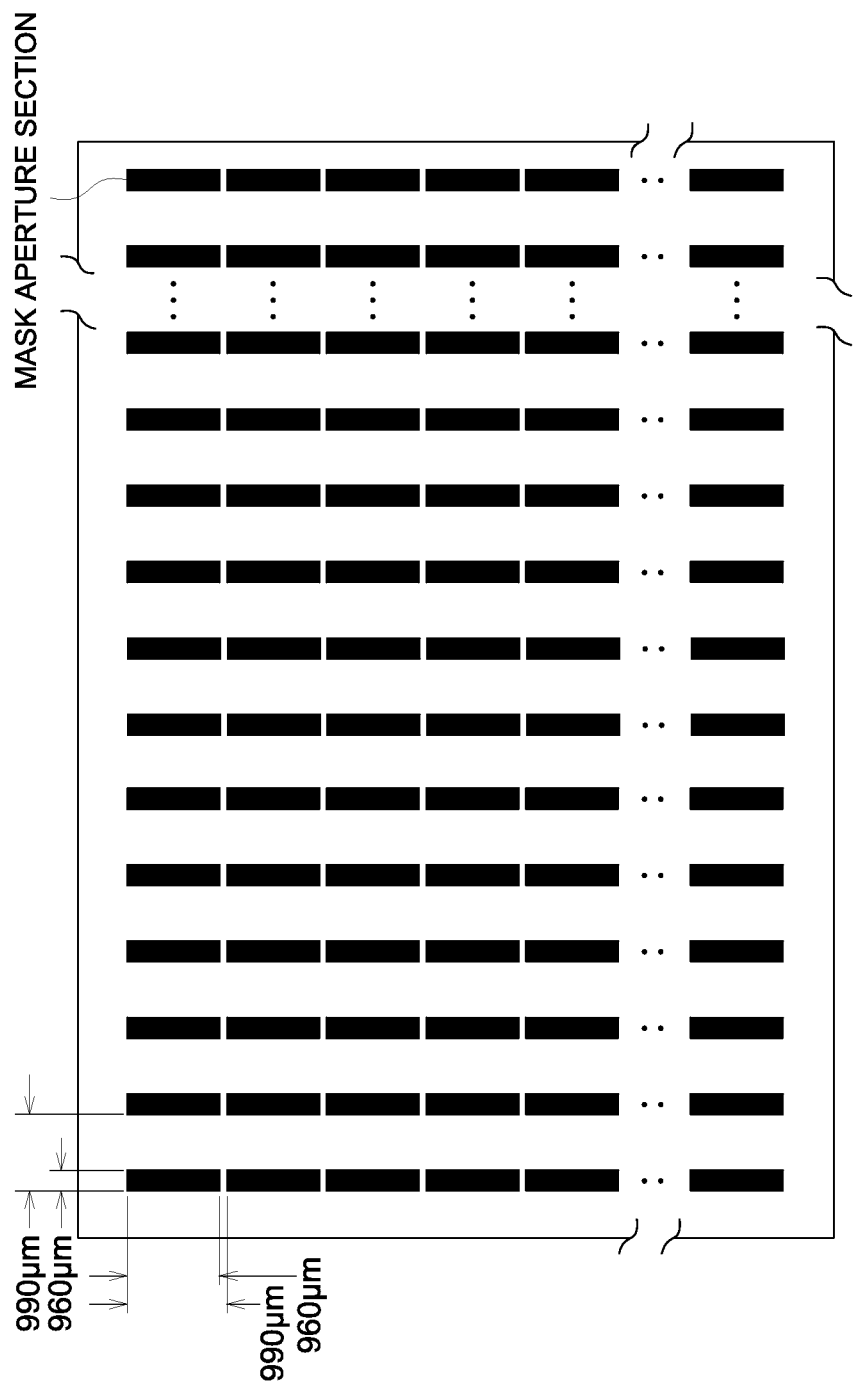
FIG. 22 is a structural view (stripe arrangement) of the mask for transferring a light emitting layer.

On the temporary support for a transfer sheet composed of 5 μm thick PET film (produced by Teijin Ltd.), sequentially overlapped were a stripe-structured mask (of 50 mm×50 mm, and a thickness of 30 μm, having holes in a striped pattern of a longitudinal length of 970 μm and a lateral length of 310 μm and longitudinal and lateral cycles of 990 μm, refer to FIG. 22), so that the center of the mask holes coincided with the projections of the pressing plate. Subsequently, heat and pressure were applied onto the support side of the primary transfer sheet via being conveyed at a rate of 0.05 m/minute between paired rollers exhibiting a pressing pressure of 0.3 MPa (one roller being a 160° C. heating roller). Subsequently, by peeling the pressing plate, the primary transfer sheet, and the mask from the temporary support, a blue light emitting layer was transferred onto the transfer sheet (refer to FIG. 17).

Figure 18:
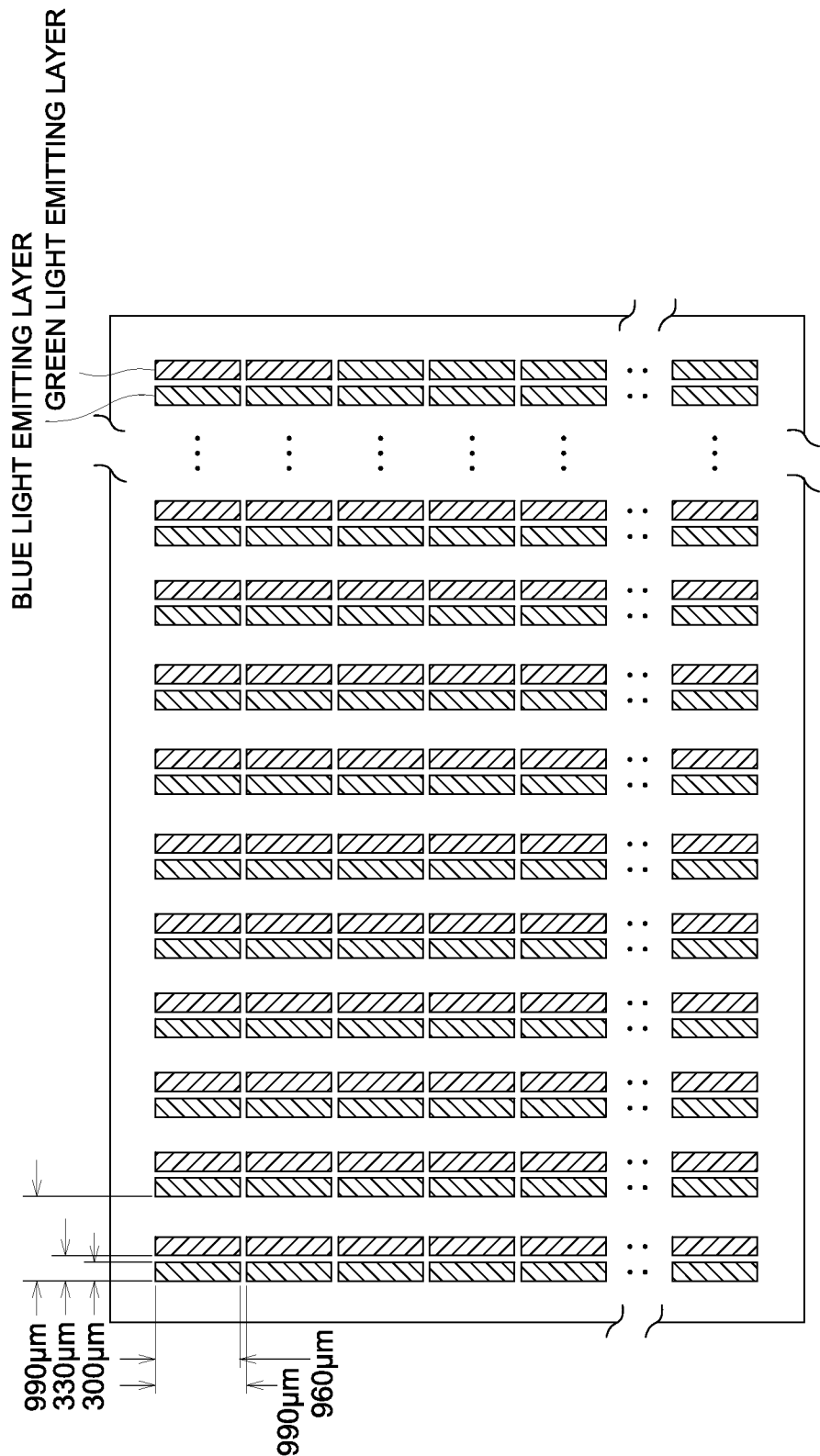
FIG. 18 is a structural view of the transfer sheet after transfer from two types of primary transfer sheets for blue and green.

Further, the mask, the primary transfer sheet for green, and the pressing plate were overlapped by a shift of one third cycle (330 μm) in the lateral direction of the pixels so that blue and green pixels were not overlapped, and the green light emitting layer was transferred onto a transfer sheet in the same manner as the blue light emitting layer (refer to FIG. 18).

Figure 19:
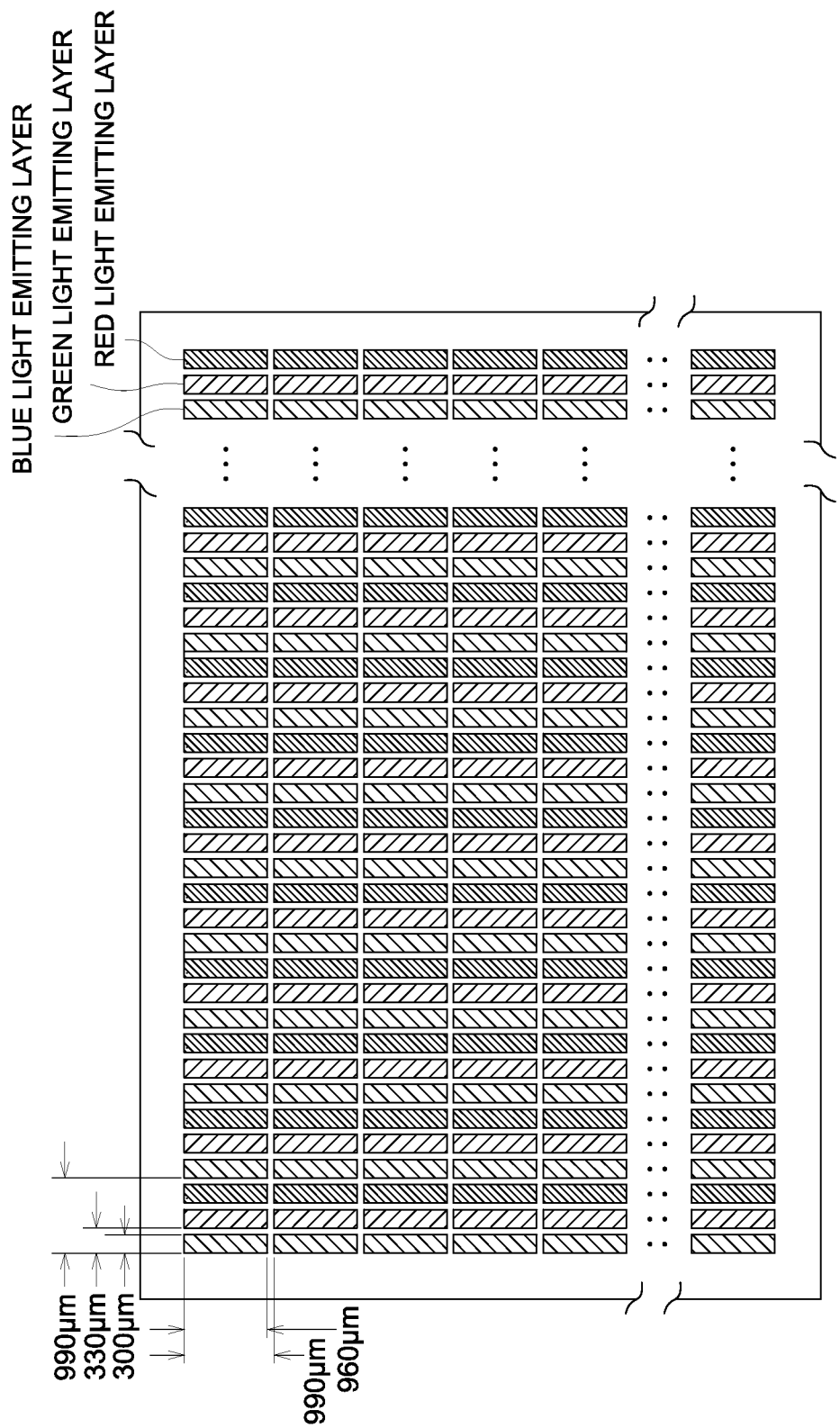
FIG. 19 is a structural view of the transfer sheet after transfer from three types of the primary transfer sheets for blue, green, and red.

Finally, the mask, the primary transfer sheet for red, and the pressing plate were overlapped by a shift of one third cycle (330 μm) in the lateral direction of the pixels so that blue, green, and red pixels were not overlapped, and the red light emitting layer was transferred in the same manner as the green light emitting layer, whereby a transfer sheet, which had been subjected to B, G, and red patterning, was prepared (refer to FIG. 19).

(D) Transfer of Light Emitting Organic Layer to Cathode Laminated Body 2

The electron transporting side of Cathode Laminated Body 2 prepared in (A) was overlapped on the light emitting layer side of the transfer sheet prepared in (C) which had been subjected to patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto the electron transporting side of Cathode Laminated Body 2 (cathode substrate/cathode/electron transporting layer), prepared in (A), whereby First Laminated Body 2 (refer to FIG. 20) was prepared.

(E) Lamination of First Laminated Body 2 with Anode Laminated Body 2

The light emitting side of First Laminated Body 1 prepared in (D) was made to face the positive hole transporting layer of Anode Laminated Body 2 and overlapped so that the striped pattern in the lateral direction of light emitting pixels coincided with the striped pattern of the anode. Subsequently, overlapping was carried out by rotating the long side direction by 90 degrees as shown in FIG. 21.

Heat and pressure were applied onto the support side of First Laminated Body 2 via conveyance at a rate of 0.05 m/minute between paired rollers exhibiting a pressing pressure of 0.3 MPa (one roller being a 160° C. heating roller), whereby First Laminated Body 2 and Anode Laminated Body 2 were laminated.

Subsequently, an aluminum lead was extended from each of the lines of the anode and the cathode, whereby a 32-pixel× 32-pixel passive driving type full-color organic EL element, composed of a cathode substrate/cathode/electron transporting layer/light emitting layer/positive hole transporting layer/ anode/anode substrate, was prepared.

(F) Sealing of Side Section

UV curing type epoxy based adhesive agent XNR5493T (produced by Nagase Ciba Co., Ltd.) was coated in the adhesive agent position, shown in FIG. 2, of the organic EL element prepared as above to reach a layer thickness of 1 mm, employing a dispenser. After coating, ultraviolet radiation at an intensity of 100 mW/cm$^2$ was exposed onto both sides of the organic EL element, employing a high pressure mercury lamp, to achieve curing, whereby Organic Element 2 of the present invention was prepared. Meanwhile, the above sealing was carried out in the globe box in which the ambient air was replaced with nitrogen. The dew point was −60° C., and oxygen concentration was 10 ppm.

Example 3

Preparation of Organic EL Element 3

As described below, full-color Organic EL Element 3 was prepared, which was composed of a cathode substrate/cathode/electron transporting layer/light emitting layer/positive hole transporting layer/anode/anode substrate.

(A) Preparation of Cathode Laminated Body 3 (Cathode Substrate/Cathode/Electron Transporting Layer)

Both sides of an Al foil (at a thickness of 30 μm) was laminated with a 50 μm thick polyimide sheet (UPILEX 50S, produced by Ube Industries, Ltd.), and the resulting foil was cut to 35 mm×40 mm, whereby a cathode substrate was prepared.

The above cathode substrate was placed in a cleaning vessel. After cleaning it with i-propyl alcohol (IPA), an oxygen plasma treatment was applied. Subsequently, a mask (a mask arranged with stripes of a line width of 300 μm and an interval of 30 μm, shown in FIG. 12) for deposition, which was subjected to patterning, was arranged, and Al was vapor-deposited at a reduced pressure of about 0.1 mPa, whereby a striped cathode of a film thickness of 0.2 μm was formed (refer to FIG. 12).

Subsequently, as an electron injecting material, LiF was vapor-deposited in the same pattern as the Al layer, whereby a 3 nm thick electron injecting layer was formed.

Subsequently, the above mask was removed and an electron transporting organic layer liquid coating composition, formulated as described below, was applied employing a spin coater and the resulting coating was dried at 60° C. to form a 40 nm thick electron transporting layer, whereby Cathode Laminated Body 3 was prepared.

| | |
|---|---|
| Electron Transporting Compound 12-1 (Mw of 50,000) | 40 parts by weight |
| Dichloroethane | 3200 parts by weight |

(B) Preparation of Anode Laminated Body 3 (Anode Substrate/Anode/Positive Hole Transporting Layer)

A 0.7 mm×35 mm×40 mm glass plate, employed as an anode substrate, was introduced into a vacuum chamber, and a mask (a mask arranged with stripes of a line width of 960 μm and an interval of 30 μm, shown in FIG. 14) for deposition, which had been subjected to patterning, was arranged. Subsequently, employing an ITO target (at a mole ratio of indium: tin of 95:5) containing 10% $SnO_2$ by weight, a striped anode composed of a 0.2 lam thick ITO thin layer was formed via DC magnetron sputtering (conditions: temperature of the substrate support of 250° C. and an oxygen pressure of $1 \times 10^{-4}$ Pa) (refer to FIG. 15).

The surface conductivity of the above node was 10Ω/□. The anode substrate on which the above anode was formed was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby Anode Laminated Body 3 was prepared.

| | |
|---|---|
| Positive hole transporting compound (PTPDES) | 40 parts by weight |
| Additive (TBPAH) | 10 parts by weight |
| Dichloroethane | 3200 pars by weight |

(C) Formation of Light Emitting Organic Layer Patterned onto Transfer Sheet Mask Transfer Method-2
(1) Preparation of Primary Transfer Sheet
(a) Preparation of Primary Transfer Sheet for Blue Compound CP-2 (Mw of 50,000), and iridium complex (Ir-12) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick blue light emitting layer was prepared.

(b) Preparation of Primary Transfer Sheet for Green

Compound CP-2 (Mw of 50,000), and tris(2-phenylpyridine)iridium complex (Ir-1) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick green light emitting layer was prepared.

(c) Preparation of Red Primary Transfer Sheet

Compound CP-2 (Mw of 50,000), and iridium complex (Ir-9) as an orthometal complex at a weight ratio of 40:1 were dissolved in dichloromethane. The resulting liquid coating composition was applied onto a 5 μm thick temporary support composed of PET film (produced by Teijin Ltd.) via an extrusion type coating apparatus and dried, whereby a 40 nm thick red light emitting layer was prepared.

As described above, three types of primary transfer materials of blue, green, and red light emitting organic layers were prepared on the temporary support.

(2) Preparation of Transfer Sheet which were Subjected to B, G, and R Patterning.

Figure 24:
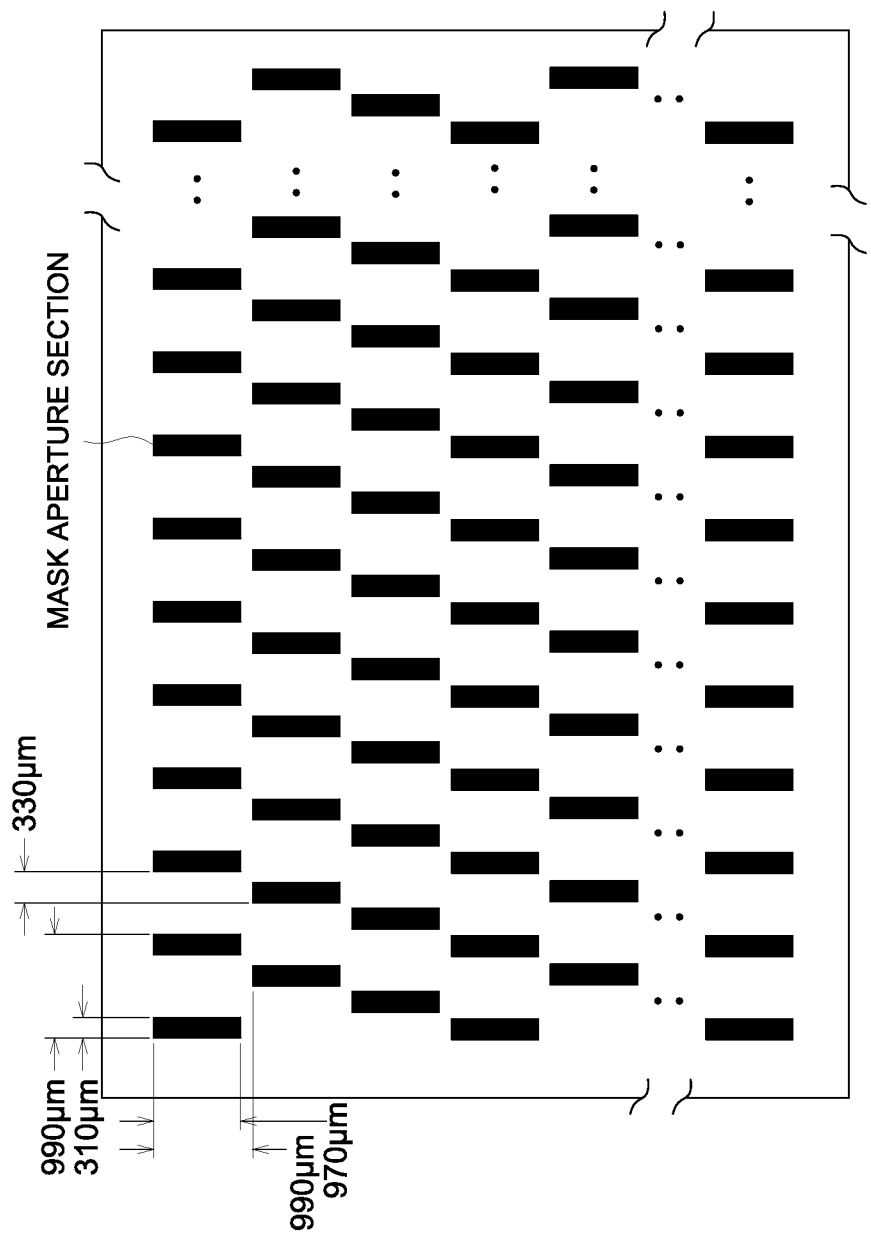
FIG. 24 is a structural view (stripe arrangement) of the mask for transferring a light emitting layer.
Figure 25:
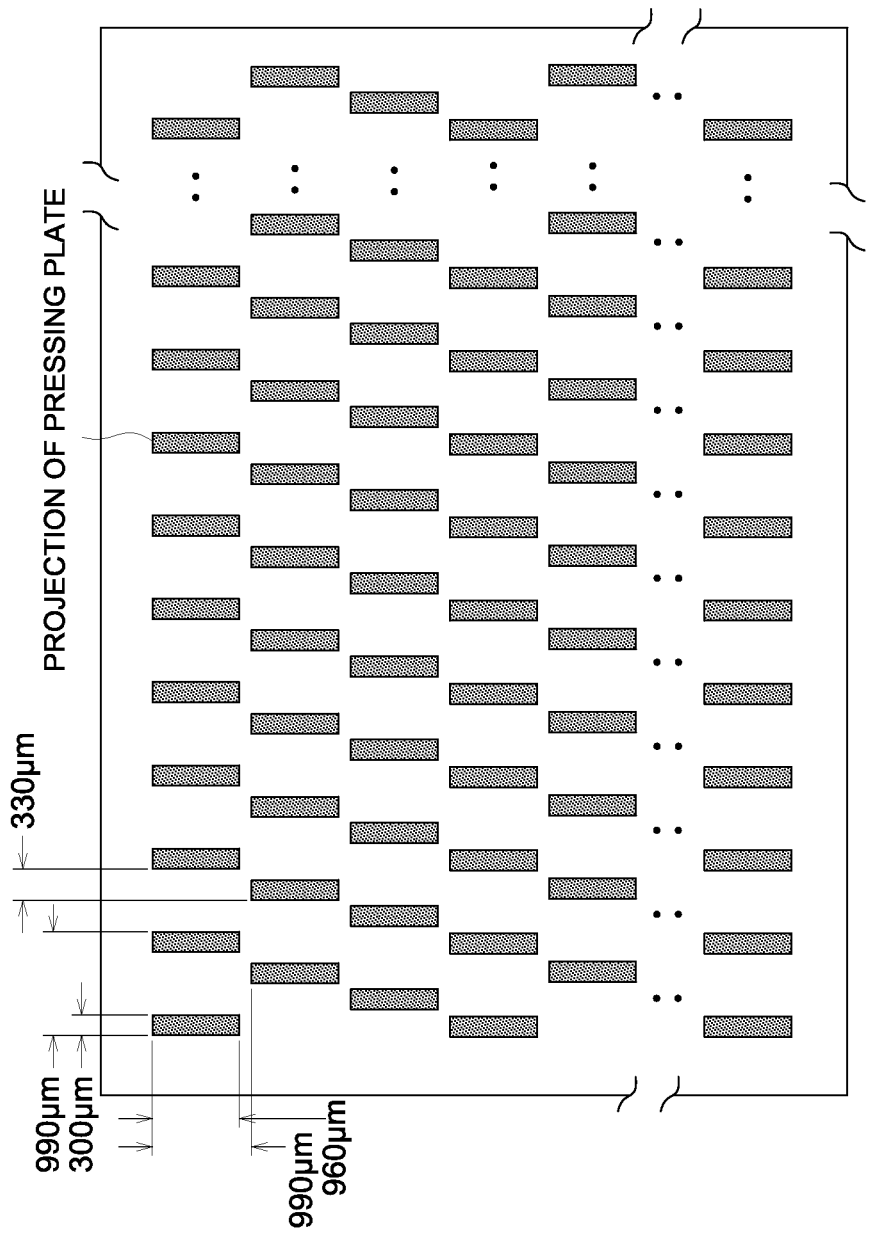
FIG. 25 is a constitutional view (stripe arrangement) of the pressing plate for transferring a light emitting layer.
Figure 26:
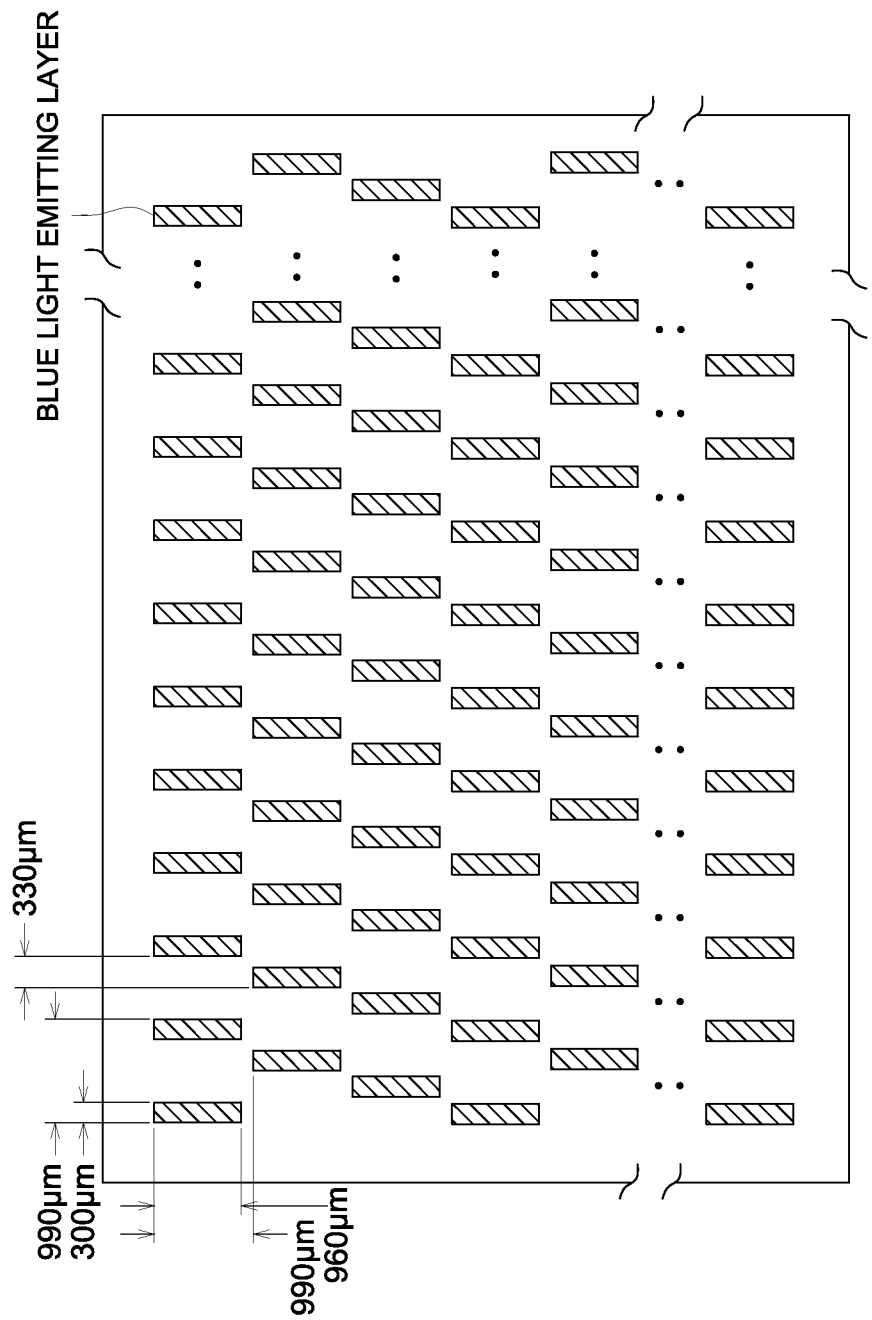
FIG. 26 is a structural view of the transfer sheet after completion of transfer from the primary transfer sheet for blue.
Figure 27:
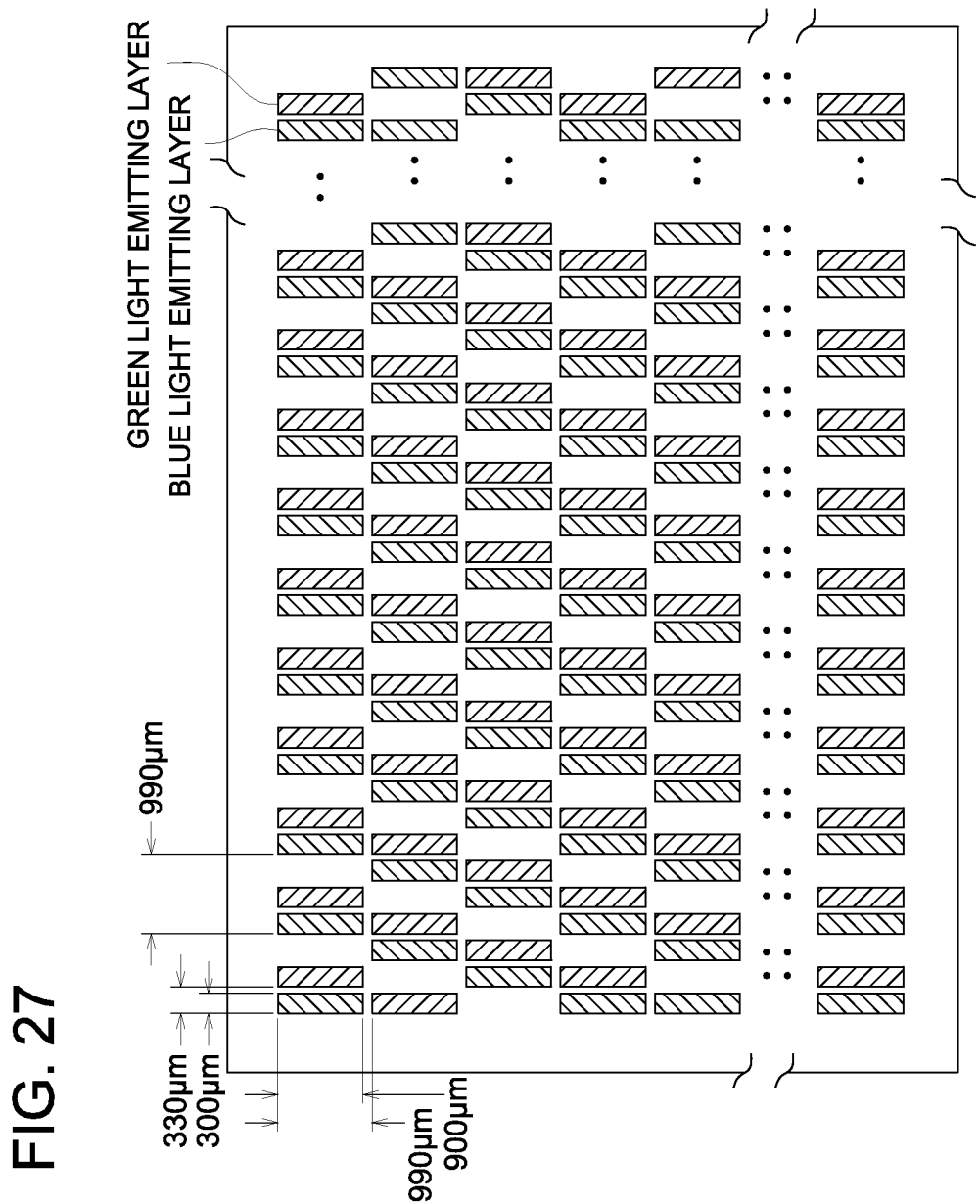
FIG. 27 is a structural view of the transfer sheet after completion of transfer from two types of primary transfer sheets for blue and green.

On the temporary support for a transfer sheet composed of 5 μm PET film (produced by Teijin Ltd.), sequentially overlapped were an oblique line arranged mask (of 50 mm×50 mm, and a thickness of 30 μm, a longitudinal length of 970 μm and a lateral length of 310 μm, longitudinal and lateral cycles of 990 μm, having holes in an oblique arrangement pattern which shifted in the longitudinal direction by one third cycle (330 μm) for every one longitudinal cycle, refer to FIG. 24), the organic layer side, of the primary transfer sheet for blue, and the pressing plate (50 mm×50 mm, a longitudinal length of 970 μm and a lateral length of 300 μm, a longitudinal and lateral cycle of 990 μm, having projections of a height of 30 μm in an oblique arrangement pattern which shifted in the longitudinal direction by one third cycle (330 μm) for every one longitudinal cycle (refer to FIG. 25), so that the center of the mask hole coincided with the projection of the pressing plate on the organic layer side. Subsequently, heat and pressure were applied onto the rear side of the primary transfer sheet via being conveyed at a rate of 0.05 m/minute between paired rollers exhibiting a pressing pressure of 0.3 MPa (one roller was a heating roller at 160° C.). Subsequently, by peeling the pressing plate, the primary transfer sheet, and the mask from the temporary support, a blue light emitting layer was transferred onto the transfer sheet (refer to FIG. 26). Subsequently, the mask, the primary transfer sheet for green, and the pressing plate were overlapped by a shift of one third cycle (330 μm) in the lateral direction of the pixels so that blue and green pixels were not overlapped, and the green light emitting layer was transferred onto a transfer sheet in the same manner as the blue light emitting layer (refer to FIG. 27).

Figure 28:
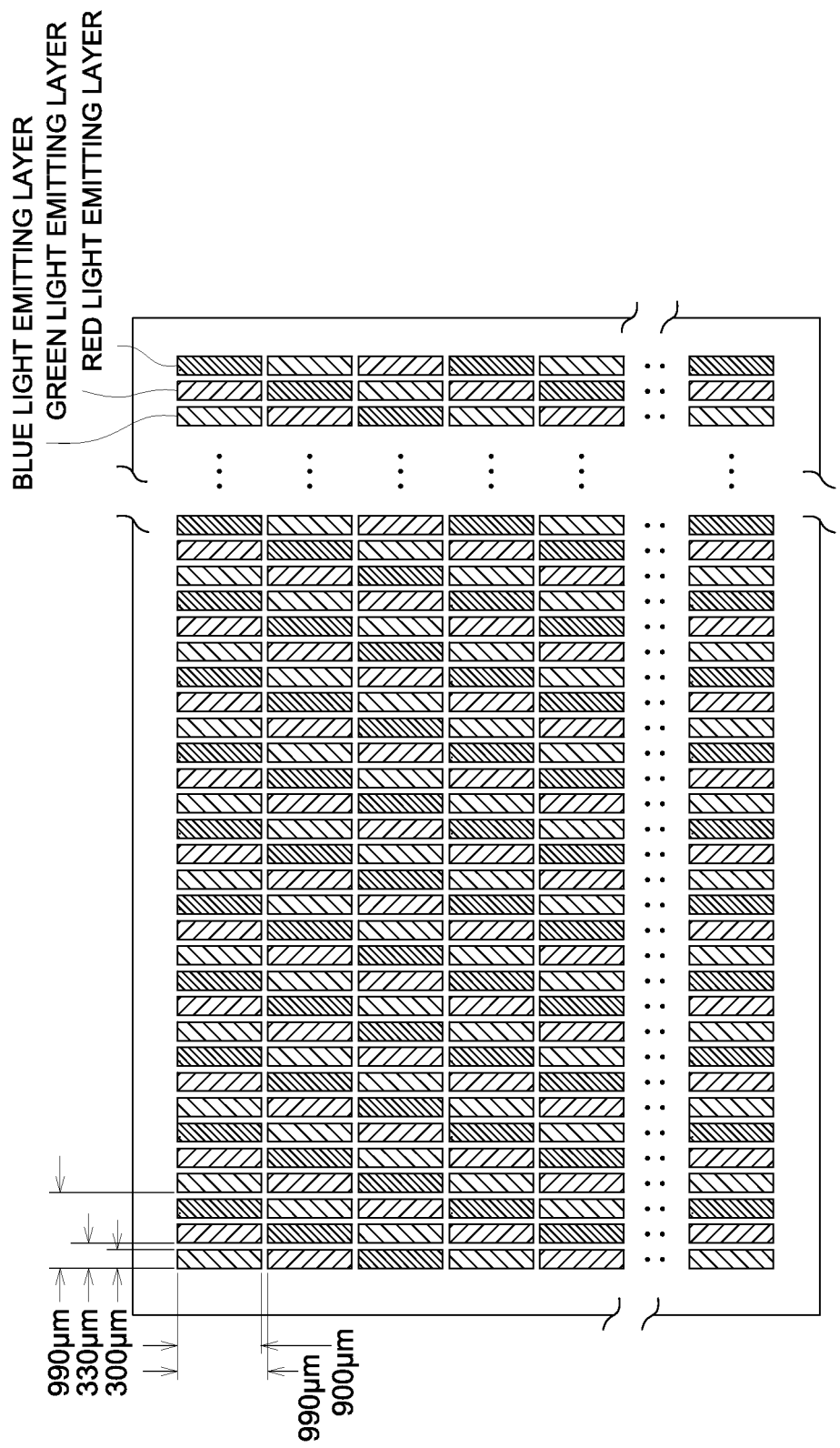
FIG. 28 is a structural view of the transfer sheet after completion of transfer from three types of primary transfer sheets for blue, green, and red.

Finally, the mask, the primary transfer sheet for red, and the pressing plate were overlapped by a shift of one third cycle (330 μm) in the lateral direction of the pixels so that blue, green, and red pixels were not overlapped, and the red light emitting layer was transferred in the same manner as the green light emitting layer, whereby a transfer sheet, which ad been subjected to B, G, and R patterning, was prepared (refer to FIG. 28).

(D) Transfer of Light Emitting Organic Layer to Cathode Laminated Body 3

Figure 29:
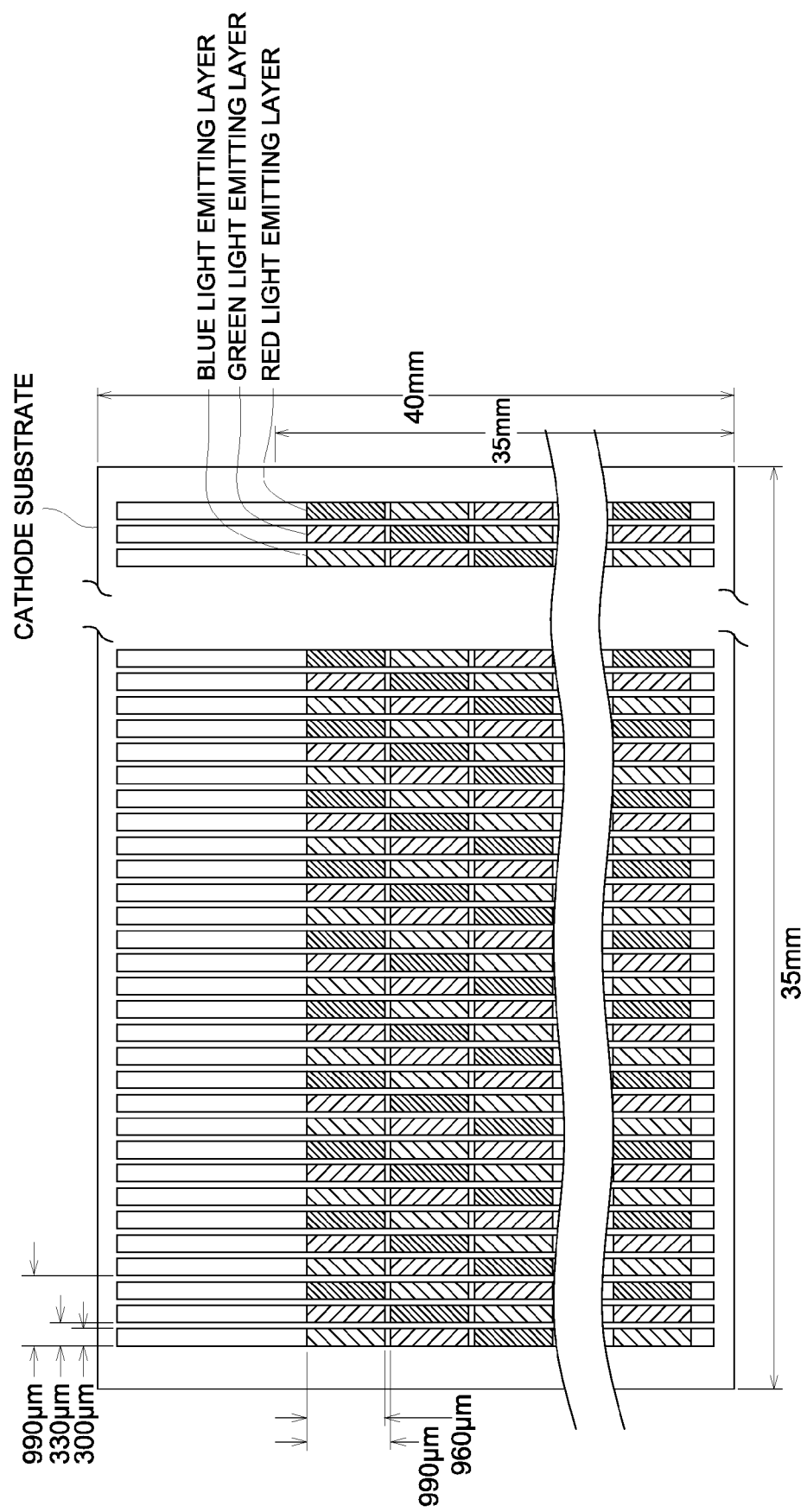
FIG. 29 is a structural view of the primary laminated body after completion of transfer to the cathode substrate from the transfer sheet.

The electron transporting side of Cathode Laminated Body 3, prepared in (A, was overlapped on the light emitting layer side of the transfer sheet prepared in (C) which had been subjected to B, G, and R patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto the electron transporting side of Cathode Laminated Body 3 (being a cathode substrate/cathode/electron transporting layer), prepared in (A), whereby First Laminated Body 3 (refer to FIG. 29) was prepared.

(E) Lamination of First Laminated Body 3 with Anode Laminated Body 3

Figure 30:
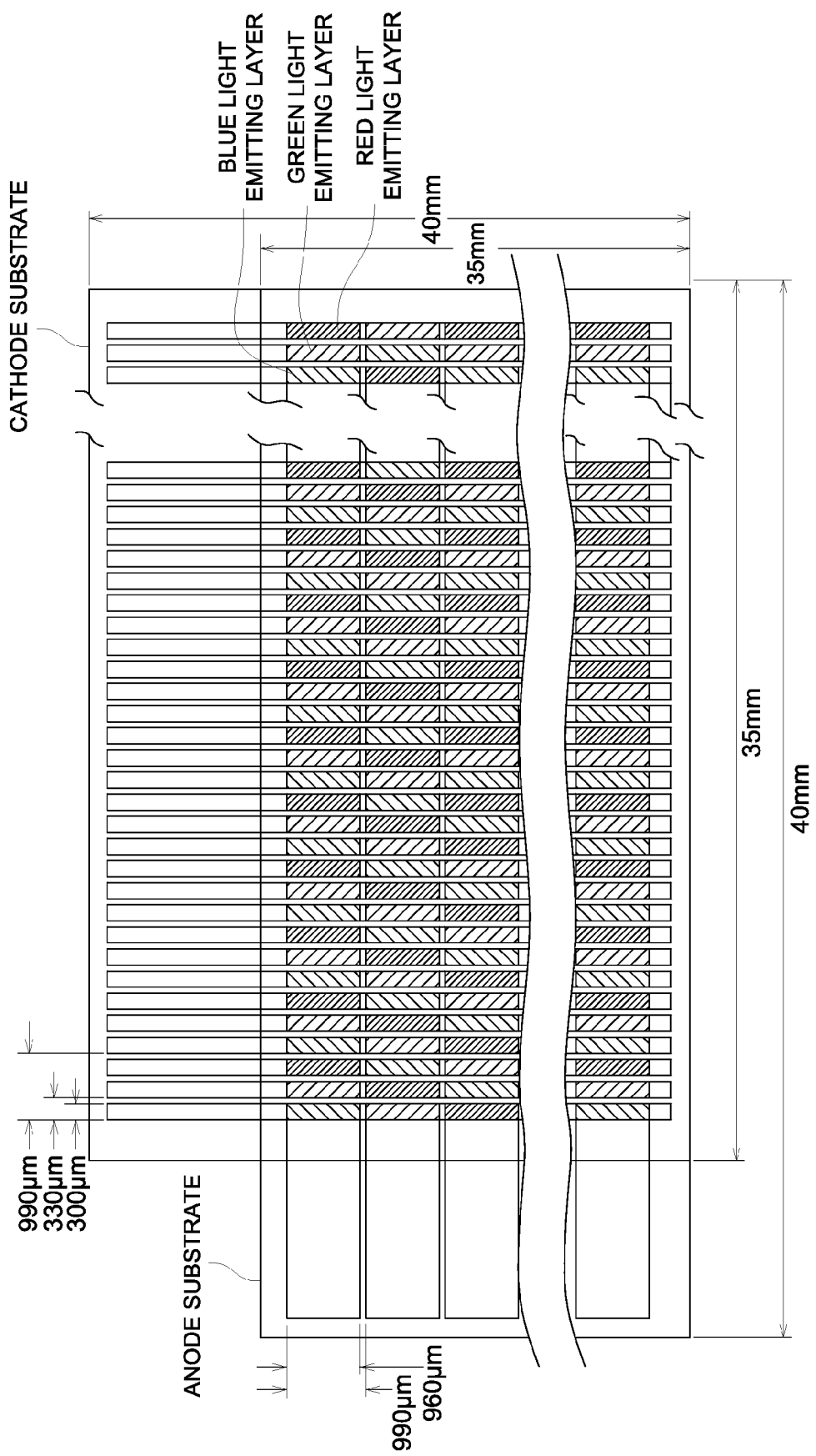
FIG. 30 is a structural view of the organic EL element after adhesion of the first laminated body to the anode substrate.

The light emitting side of First Laminated Body 3 prepared in (D) was made to face the positive hole transporting layer of Anode Laminated Body 3 and overlapped so that the striped pattern in the lateral direction of light emitting pixels coincided with the striped pattern of the anode. Subsequently, overlapping was carried out by rotating the long side direction by 90 degrees as shown in FIG. 30.

Heat and pressure were applied onto the support side of First Laminated Body 3 via conveyance at a rate of 0.05 m/minute between paired rollers exhibiting a pressing pressure of 0.3 MPa (one roller being a 160° C. heating roller), whereby First Laminated Body 3 and Anode Laminated Body 3 were laminated.

Subsequently, an aluminum lead was extended from each of the lines of the anode and the cathode, whereby a 32-pixel× 32-pixel passive driving type full-color organic EL element, composed of a cathode substrate/cathode/electron transporting layer/light emitting layer/positive hole transporting layer/ anode/anode substrate, was prepared.

(F) Sealing of Side Section

UV curing type epoxy based adhesive agent XNR5493T (produced by Nagase Ciba Co., Ltd.) was coated in the adhesive agent position, shown in FIG. 2, of the organic EL element prepared as above to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby Organic Element 2 of the present invention was prepared. The above sealing was carried out in the globe box in which ambient air was replaced with nitrogen. The dew point was −60° C., and oxygen concentration was 10 ppm.

Example 4

Preparation of Organic EL Element 4

As described below, full-color Organic EL Element 4 was prepared, which was composed of a cathode substrate/cathode/electron transporting layer/light emitting layer/positive hole transporting layer/anode/anode substrate.

(A) Preparation of Cathode Laminated Body 4 (Cathode Substrate/Cathode/Electron Transporting Layer/Positive Hole Blocking Layer)

Both sides of an Al foil (at a thickness of 30 μm) was laminated with a 50 μm thick polyimide sheet (UPILEX 50S, produced by Ube Industries, Ltd.), and the resulting foil was cut to 35 mm×40 mm, whereby a cathode substrate was prepared.

The above cathode substrate was placed in a cleaning vessel. After cleaning it with i-propyl alcohol (IPA), an oxygen plasma treatment was applied. Subsequently, a mask (a mask arranged with stripes of a line width of 300 μm and an interval of 30 μm, shown in FIG. 12) for deposition, which had been subjected to patterning, was arranged, and Al was vapor-deposited at a reduced pressure of about 0.1 mPa, whereby a striped cathode of a film thickness of 0.2 lam was formed (refer to FIG. 13).

Subsequently, as an electron injecting material, LIF was vapor-deposited in the same pattern as the Al layer, whereby a 3 nm thick electron injecting layer was formed.

Subsequently, the above mask was removed and an electron transporting organic layer liquid coating composition, formulated as described below, was applied employing a spin coater and the resulting coating was dried at 60° C., whereby a 40 nm thick electron transporting layer was prepared.

| | |
|---|---|
| Electron Transporting Compound 12-1 (Mw of 50,000) | 40 parts by weight |
| Dichloroethane | 3200 parts by weight |

Subsequently, the liquid coating composition for the organic layer of the positive hole blocking agent, as formulated below, was applied via a spray coating apparatus, and the resulting coating was dried at 60° C. to form a 10 nm thick positive hole blocking layer, whereby Cathode Laminated Body 4 was prepared.

| Positive hole blocking material | |
|---|---|
| BC | 40 parts by weight |
| Dichloroethane | 3200 parts by weight |

BC (B) Preparation of Anode Laminated Body 4 (Anode Substrate/Anode/Positive Hole Transporting Layer)

A 0.7 mm×35 mm×40 mm glass plate, employed as an anode substrate, was introduced into a vacuum chamber, and a mask (a mask arranged with stripes of a line width of 960 μm and an interval of 30 μm, shown in FIG. 14) for deposition, which had been subjected to patterning, was arranged. Subsequently, employing an ITO target (at a mole ratio of indium: tin of 95:5) containing 10% SnO$_2$ by weight, a striped anode composed of a 0.2 μm thick ITO thin layer was formed via DC magnetron sputtering (conditions: temperature of the substrate support of 250° C. and an oxygen pressure of 1×10$^{-4}$ Pa) (refer to FIG. 15).

The surface conductivity of the above anode was 10Ω/☐. The anode substrate on which the above anode was formed was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby Anode Laminated Body 4 was prepared.

| | |
|---|---|
| Positive hole transporting compound (PTPDES) | 40 parts by weight |
| Additive (TBPAH) | 10 parts by weight |
| Dichloroethane | 3200 pars by weight |

(C) Formation of Light Emitting Organic Layer which was subjected to pattering onto Transfer Sheet: Mask Transfer Method
(1) Preparation of Primary Transfer Sheet
(a) Preparation of Primary Transfer Sheet for Blue Compound CP-2 (of a molecular weight of 50,000), and iridium complex (Ir-12) as an orthometal complex at a weight ratio of 40:1 were dissolved in dichloromethane. The resulting liquid coating composition was applied onto a 5 µm thick temporary support composed of PET film (produced by Teijin Ltd.) via an extrusion type coating apparatus and dried, whereby a 40 nm thick blue light emitting layer was prepared.
(b) Preparation of Primary Transfer Sheet for Green Compound CP-2 (of an Mw of 50,000), and tris(2-phenylpyridine)iridium complex (Ir-1) as an orthometal complex at a weight ratio of 40:1 were dissolved in dichloromethane. The resulting liquid coating composition was applied onto a 5 µm thick temporary support composed of PET film (produced by Teijin Ltd.) via an extrusion type coating apparatus and dried, whereby a 40 nm thick green light emitting layer was prepared.
(c) Preparation of Red Primary Transfer Sheet Compound CP-2 (of an Mw of 50,000), and iridium complex (Ir-9) as an orthometal complex at a weight ratio of 40:1 were dissolved in dichloromethane. The resulting liquid coating composition was applied onto a 5 µm thick temporary support composed of PET film (produced by Teijin Ltd.) via an extrusion type coating apparatus and dried, whereby a 40 nm thick red light emitting layer was prepared.

As described above, three types of primary transfer materials of blue, green, and red light emitting organic layers were prepared on the temporary support.
(2) Preparation of Transfer Sheet which were Subjected to B, G, and R Patterning.

Figure 23:
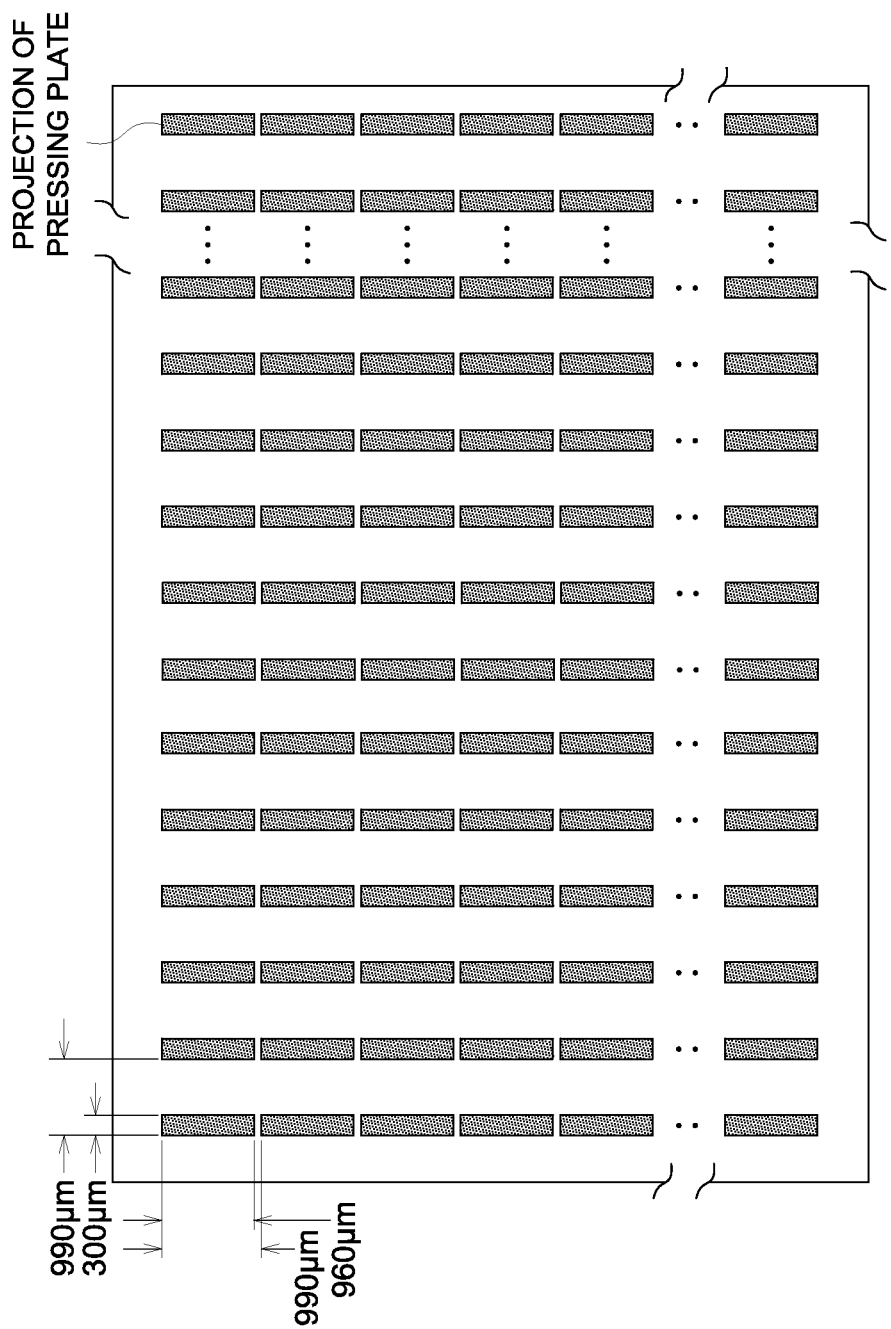
FIG. 23 is a structural view (stripe arrangement) of the pressing plate for transferring a light emitting layer.

On the temporary support for a transfer sheet composed of 5 µm thick PET film (produced by Teijin Ltd.), sequentially overlapped were a striped mask (of 50 mm×50 mm, and a thickness of 30 µm, having holes in a striped pattern of a longitudinal length of 970 µm and a lateral length of 310 µm and longitudinal and lateral cycles of 990 µm, refer to FIG. 22), the organic layer side of the primary transfer sheet for blue, and the pressing plate (50 mm×50 mm, a longitudinal length of 970 µm and a lateral length of 300 µm, a longitudinal and lateral cycle of 990 µm, having projections of a height of 30 µm (refer to FIG. 23)) so that the center of the mask hole coincided with the projection of the pressing plate. Subsequently, heat and pressure were applied onto the support side of the primary transfer sheet via conveyance at a rate of 0.05 m/minute between paired rollers exhibiting a pressing pressure of 0.3 MPa (one roller being a 160° C. heating roller). Subsequently, by peeling the pressing plate, the primary transfer sheet, and the mask from the temporary support, a blue light emitting layer was transferred onto the transfer sheet (refer to FIG. 17).

Subsequently, the mask, the primary transfer sheet for green, and the pressing plate were overlapped by a shift of one third cycle (330 µm) in the lateral direction of the pixels so that blue and green pixels were not overlapped, and the green light emitting layer was transferred onto a transfer sheet in the same manner as the blue light emitting layer (refer to FIG. 18).

Finally, the mask, the primary transfer sheet for red, and the pressing plate were overlapped by a shift of one third cycle (330 µm) in the lateral direction of the pixels so that blue, green, and red pixels were not overlapped, and the red light emitting layer was transferred in the same manner as the green light emitting layer, whereby a transfer sheet, which was subjected to B, G, and red patterning, was prepared (refer to FIG. 19).
(D) Transfer of Light Emitting Organic Layer to Cathode Laminated Body 4

The electron transporting side of cathode laminated body 4 prepared in (A) was overlapped on the light emitting layer side of the transfer sheet prepared in (C) which had been subjected to patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto cathode laminated body (cathode substrate/cathode/electron transporting layer/positive hole blocking layer), prepared in (A), whereby First Laminated Body 4 (refer to FIG. 20) was prepared.
(E) Lamination of First Laminated Body 4 with Anode Laminated Body 4

The light emitting layer side of First Laminated Body 1 prepared in (D) was made to face the positive hole transporting layer of Anode Laminated Body 4 and overlapped so that the striped pattern in the lateral direction of light emitting pixels coincided with the striped pattern of the anode. Subsequently, overlapping was carried out by rotating the long side direction by 90 degrees as shown in FIG. 21.

Heat and pressure were applied onto the support side of the first laminated body 4 via conveyance at a rate of 0.05 m/minute between paired rollers exhibiting a pressing pressure of 0.3 MPa (one roller being a 160° C. heating roller), whereby First Laminated Body 4 and Anode Laminated Body 4 were laminated.

Subsequently, an aluminum lead was extended from each of the lines of the anode and the cathode, whereby a 32-pixel× 32-pixel passive driving type full-color organic EL element, composed of a cathode substrate/cathode/electron transporting layer/positive hole blocking layer/light emitting layer/ positive hole transporting layer/anode/anode substrate, was prepared.
(F) Sealing of Side Section UV curing type epoxy based adhesive agent XNR5493T (produced by Nagase Ciba Co., Ltd.) was coated in the adhesive agent position, shown in FIG. 2, of the organic EL element prepared as above to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby Organic EL Element 4 of the present invention was prepared. The above sealing was carried out in the globe box in which ambient air was replaced with nitrogen. The dew point was −60° C., and oxygen concentration was 10 ppm.

Example 5

Preparation of Organic EL Element 5

As described below, full-color Organic EL Element 5 was prepared, which was composed of a cathode substrate/moisture-oxygen absorbing layer/cathode/electron transporting layer/light emitting layer/positive hole transporting layer/anode/anode substrate.

(A) Preparation of Cathode Laminated Body 5 (Cathode Substrate/Moisture-Oxygen Absorbing Layer/Cathode/Electron Transporting Layer/Cathode/Electron Transporting Layer)

Both sides of an Al foil (at a thickness of 30 μm) was laminated with a 50 μm thick polyimide sheet (UPILEX 50S, produced by Ube Industries, Ltd.), and the resulting foil was cut to 35 mm×40 mm, whereby a cathode substrate was prepared.

The above cathode substrate was placed in a cleaning vessel. After cleaning it with i-propyl alcohol (IPA), an oxygen plasma treatment was applied. Subsequently, $SiO_2$ was vapor-deposited at a pressure-reduced ambience of about 0.1 mPa, whereby a 0.1 μm thick moisture-oxygen absorbing layer was prepared.

Subsequently, a mask (a mask arranged with stripes of a line width of 300 μm and an interval of 30 μm, shown in FIG. 12) for deposition, which was subjected to patterning, was arranged, and Al was vapor-deposited at a reduced pressure of about 0.1 mPa, whereby a 0.2 μm thick cathode was formed. Further, as an electron injecting material, LiF was vapor-deposited in the same pattern as the Al layer, whereby a 3 nm thick electron injecting layer was formed.

Subsequently, the above mask was removed and an electron transporting organic layer liquid coating composition, formulated as described below, was applied employing a spin coater and the resulting coating was dried at 60° C., to form a 40 nm thick electron transporting layer, whereby Cathode Laminated Body 5 was prepared.

| Electron Transporting Compound 12-1 (of Mw of 50,000) | 40 parts by weight |
| --- | --- |
| Dichloroethane | 3200 parts by weight |

(B) Preparation of Anode Laminated Body 5 (Anode Substrate/Anode/Positive Hole Transporting Layer)

A 0.7 mm×35 mm×40 mm glass plate, employed as an anode substrate, was introduced into a vacuum chamber, and a mask (a mask arranged with stripes of a line width of 960 μm and an interval of 30 μm, shown in FIG. 14) for deposition, which has been subjected to patterning, was arranged. Subsequently, employing an ITO target (at a mole ratio of indium: tin of 95:5) containing 10% $SnO_2$ by weight, a striped anode composed of a 0.2 m thick ITO thin layer was formed via DC magnetron sputtering (conditions: temperature of the substrate support of 250° C. and an oxygen pressure of $1×10^{-3}$ Pa) (refer to FIG. 15).

The surface conductivity of the above anode was 10Ω/☐. The anode substrate on which the above anode was formed was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby Anode Laminated Body 5 was prepared.

| Positive hole transporting compound (PTPDES) | 40 parts by weight |
| --- | --- |
| Additive (TBPAH) | 10 parts by weight |
| Dichloroethane | 3200 pars by weight |

(C) Formation of Light Emitting Organic Layer which was Subjected to Patterning onto Transfer Sheet: Mask Transfer Method (1) Preparation of Primary Transfer Sheet (a) Preparation of Primary Transfer Sheet for Blue Compound CP-2 (Mw of 50,000), and iridium complex (Ir-12) as an orthometal complex at a weight ratio of 40:1 were dissolved in dichloromethane. The resulting liquid coating composition was applied onto a 5 μm thick temporary support composed of a PET film (produced by Teijin Ltd.) via an extrusion type coating apparatus and dried, whereby a 40 nm thick blue light emitting layer was prepared.

(b) Preparation of Primary Transfer Sheet for Green

Compound CP-2 (Mw of 50,000), and tris(2-phenylpyridine)iridium complex (Ir-1) as an orthometal complex at a weight ratio of 40:1 were dissolved in dichloromethane. The resulting liquid coating composition was applied onto a 5 μm thick temporary support composed of a PET film (produced by Teijin Ltd.) via an extrusion type coating apparatus and dried, whereby a 40 nm thick green light emitting layer was prepared.

(c) Preparation of Red Primary Transfer Sheet

Compound CP-2 (Mw of 50,000), and iridium complex (Ir-9) as an orthometal complex at a weight ratio of 40:1 were dissolved in dichloromethane. The resulting liquid coating composition was applied onto a 5 μm thick temporary support composed of a PET film (produced by Teijin Ltd.) via an extrusion type coating apparatus and dried, whereby a 40 nm thick red light emitting layer was prepared.

As described above, three types of primary transfer materials of blue, green, and red light emitting organic layers were prepared on the temporary support.

(2) Preparation of Transfer Sheet which were Subjected to B, G, and R Patterning.

On the temporary support for a transfer sheet composed of 5 μm thick PET film (produced by Teijin Ltd.), sequentially overlapped were a striped mask (of 50 mm×50 mm, and a thickness of 30 μm, having holes in a striped pattern of a longitudinal length of 970 μm and a lateral length of 310 μm and longitudinal and lateral cycles of 990 μm, refer to FIG. 22), the organic layer side of the primary transfer sheet for blue, and the pressing plate (50 mm×50 mm, a longitudinal length of 970 μm and a lateral length of 300 μm, a longitudinal and lateral cycle of 990 μm, having projections of a height of 30 μm (refer to FIG. 23)) so that the center of the mask hole coincided with the projection of the pressing plate. Subsequently, heat and pressure were applied onto the support side of the primary transfer sheet via conveyance at a rate of 0.05 m/minute between paired rollers exhibiting a pressing pressure of 0.3 MPa (one roller being a 160° C. heating roller). Subsequently, by peeling the pressing plate, the primary transfer sheet, and the mask from the temporary support, a blue light emitting layer was transferred onto the transfer sheet (refer to FIG. 17).

Subsequently, the mask, the primary transfer sheet for green, and the pressing plate were overlapped by a shift of one third cycle (330 µm) in the lateral direction of the pixels so that blue and green pixels were not overlapped, and the green light emitting layer was transferred onto a transfer sheet in the same manner as the blue light emitting layer (refer to FIG. 18).

Finally, the mask, the primary transfer sheet for red, and the pressing plate were overlapped by a shift of one third cycle (330 µm) in the lateral direction of the pixels so that blue, green, and red pixels were not overlapped, and the red light emitting layer was transferred in the same manner as the green light emitting layer, whereby a transfer sheet, which has been subjected to B, G, and red patterning, was prepared (refer to FIG. 19).

(D) Transfer of Light Emitting Organic Layer to Cathode Laminated Body 5

The electron transporting side of Cathode Laminated Body 5 prepared in (A) was overlapped on the light emitting layer side of the transfer sheet prepared in (C) which had been subjected to patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto Cathode Laminated Body 5 (cathode substrate/cathode/electron transporting layer), prepared in (A), whereby First Laminated Body 5 (refer to FIG. 20) was prepared.

(E) Lamination of First Laminated Body 5 with Anode Laminated Body 5

The light emitting layer side of the first laminated body prepared in (D) was made to faced the positive hole transporting layer of Anode Laminated Body 5 and overlapped so that the striped pattern in the lateral direction of light emitting pixels coincided with the striped pattern of the anode. Subsequently, overlapping was carried out by rotating the long side direction by 90 degrees as shown in FIG. 21.

Heat and pressure were applied onto the support side of the first laminated body 5 via conveyance at a rate of 0.05 m/minute between paired rollers exhibiting a pressing pressure of 0.3 MPa (one roller being a 160° C. heating roller), whereby First Laminated Body 5 and Anode Laminated Body 5 were laminated.

Subsequently, an aluminum lead was extended from each of the lines of the anode and the cathode, whereby a 32-pixel× 32-pixel passive driving type full-color organic EL element, composed of a cathode substrate/moisture-oxygen absorbing layer/cathode/electron transporting layer/light emitting layer/positive hole transporting layer/anode/anode substrate, was prepared.

(F) Sealing of Side Section

UV curing type epoxy based adhesive agent XNR5493T (produced by Nagase Ciba Co., Ltd.) was coated in the adhesive agent position, shown in FIG. 2 of the organic EL element prepared as above to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby Organic EL Element 5 of the present invention was prepared. The above sealing was carried out in the globe box in which ambient air was replaced with nitrogen. The dew point was −60° C., and oxygen concentration was 10 ppm.

(Preparation of Organic EL Element 6)

Full-color Organic EL Element 6 composed of a cathode substrate/cathode/electron transporting layer/light emitting layer/positive hole transporting layer/anode/anode substrate was prepared in the same manner as Example 1, except that an electron transporting layer was prepared via vapor deposition.

(A) Preparation of Cathode Laminated Body 6 (Cathode Substrate/Cathode/Electron Transporting Layer)

Both sides of an Al foil (at a thickness of 30 µm) was laminated with a 50 µm thick polyimide sheet (UPILEX 50S, produced by Ube Industries, Ltd.), and the resulting foil was cut to 35 mm×40 mm, whereby a cathode substrate was prepared.

The above cathode substrate was placed in a cleaning vessel. After cleaning it with i-propyl alcohol (IPA), an oxygen plasma treatment was applied. Subsequently, a mask (a mask arranged with stripes of a line width of 300 µm and an interval of 30 µm, shown in FIG. 12) for deposition, which had been subjected to patterning, was arranged, and Al was vapor-deposited at a reduced pressure of about 0.1 mPa, whereby a 0.2 µm thick striped cathode was formed (refer to FIG. 13).

Further, as an electron injecting material, LiF was vapor-deposited in the same pattern as the Al layer, whereby a 3 nm thick electron injecting layer was formed.

Subsequently, the above mask was removed, and an electron transporting material having the following structure was subjected to deposition at a reduced pressure of about 0.1 mPa to form a 40 nm thick electron transporting layer, whereby Cathode Laminated Body 6 was prepared.

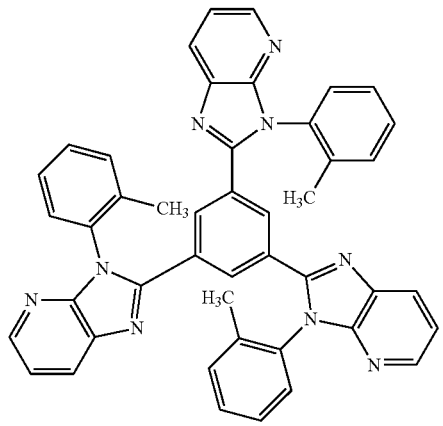 [SMILES: Cc1ccccc1-n1c(-c2cc(-c3nc4cccnc4n3-c3ccccc3C)cc(-c3nc4cccnc4n3-c3ccccc3C)c2)nc2cccnc21]

(B) Preparation of Anode Laminated Body 6 (Anode Substrate/Anode/Positive Hole Transporting Layer)

A 0.7 mm×35 mm×40 mm glass plate, employed as an anode substrate, was introduced into a vacuum chamber, and a mask (a mask arranged with stripes of a line width of 960 µm and an interval of 30 µm, shown in FIG. 14) for deposition, which had been subjected to patterning, was arranged. Subsequently, employing an ITO target (at a mole ratio of indium: tin of 95:5) containing 10% SnO$_2$ by weight, a striped anode composed of a 0.2 µm thick ITO thin layer was formed via DC magnetron sputtering (conditions: temperature of the substrate support of 250° C. and an oxygen pressure of 1×10$^{-3}$ Pa) (refer to FIG. 15).

The surface conductivity of the above node was 10Ω/□. The anode substrate, on which the above anode was formed, was placed in a cleaning vessel and cleaned with isopropyl alcohol, followed by an oxygen plasma treatment. The following composition was applied onto the surface of the treated transparent electrode via spin coating, and the resulting coating was dried at 40° C. to form a 100 nm thick positive hole transporting layer, whereby Anode Laminated Body B was prepared.

| | |
|---|---|
| Positive hole transporting compound (PTPDES) | 40 parts by weight |
| Additive (TBPAH) | 10 parts by weight |
| Dichloroethane | 3200 pars by weight |

(C) Formation of Light Emitting Organic Layer which was Subjected to Patterning onto Transfer Sheet: Mask Transfer Method
(1) Preparation of Primary Transfer Sheet
(a) Preparation of Primary Transfer Sheet for Blue Polyvinyl carbazole (Mw of 63,000, produced by Aldrich Co.), and iridium complex (Ir-12) as an orthometal complex at a weight ratio of 40:1 were dissolved in dichloromethane. The resulting liquid coating composition was applied onto a 5 µm thick temporary support composed of a PET film (produced by Teijin Ltd.) via an extrusion type coating apparatus and dried, whereby a 40 nm thick blue light emitting layer was prepared.

(b) Preparation of Primary Transfer Sheet for Green

Polyvinyl carbazole (Mw of 63,000, produced by Aldrich Co.), and tris(2-phenylpyridine)iridium complex (Ir-1) as an orthometal complex at a weight ratio of 40:1 were dissolved in dichloromethane. The resulting liquid coating composition was applied onto a 5 µm thick temporary support composed of a PET film (produced by Teijin Ltd.) via an extrusion type coating apparatus and dried, whereby a 40 nm thick green light emitting layer was prepared.

(c) Preparation of Red Primary Transfer Sheet

Polyvinyl carbazole (Mw of 63,000, produced by Aldrich Co.), and iridium complex (Ir-9) as an orthometal complex at a weight ratio of 40:1 were dissolved in dichloromethane. The resulting liquid coating composition was applied onto a 5 µm thick temporary support composed of a PET film (produced by Teijin Ltd.) via an extrusion type coating apparatus and dried, whereby a 40 nm thick red light emitting layer was prepared.

As described above, three types of primary transfer materials of blue, green, and red light emitting organic layers were prepared on the temporary support.

(2) Preparation of Transfer Sheet which were Subjected to B, G, and R Patterning.

On the temporary support for a transfer sheet composed of 5 µm thick PET film (produced by Teijin Ltd.), sequentially overlapped were a striped mask (of 50 mm×50 mm, and a thickness of 30 µm, having holes in a striped pattern of a longitudinal length of 970 µm and a lateral length of 310 µm and longitudinal and lateral cycles of 990 µm, refer to FIG. 22), the organic layer side of the primary transfer sheet for blue, and the pressing plate (50 mm×50 mm, a longitudinal length of 970 µm and a lateral length of 300 µm, a longitudinal and lateral cycle of 990 µm, having projections of a height of 30 µm (refer to FIG. 23)) so that the center of the mask hole coincided with the projection of the pressing plate. Subsequently, heat and pressure were applied onto the support side of the primary transfer sheet via conveyance at a rate of 0.05 m/minute between paired rollers exhibiting a pressing pressure of 0.3 MPa (one roller being a 160° C. heating roller). Subsequently, by peeling the pressing plate, the primary transfer sheet, and the mask from the temporary support, a blue light emitting layer was transferred onto the transfer sheet (refer to FIG. 17).

Subsequently, the mask, the primary transfer sheet for green, and the pressing plate were overlapped by a shift of one third cycle (330 µm) in the lateral direction of the pixels so that blue and green pixels were not overlapped, and the green light emitting layer was transferred onto a transfer sheet in the same manner as the blue light emitting layer (refer to FIG. 18).

Finally, the mask, the primary transfer sheet for red, and the pressing plate were overlapped by shifting by one third cycle (330 µm) in the lateral direction of the pixels so that blue, green, and red pixels were not overlapped, and the red light emitting layer was transferred in the same manner as the green light emitting layer, whereby a transfer sheet, which had been subjected to B, G, and R patterning, was prepared (refer to FIG. 19).

(D) Transfer of Light Emitting Organic Layer to Cathode Laminated Body 6

The electron transporting side of Cathode Laminated Body 6 prepared in (A) was overlapped on the light emitting layer side of the transfer sheet prepared in (C) which had been subjected to B, G, and R patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto Cathode Laminated Body 6 (cathode substrate/cathode/electron transporting layer), prepared in (A), whereby First Laminated Body 6 (refer to FIG. 20) was prepared.

(E) Lamination of First Laminated Body 6 with Anode Laminated Body 6

The light emitting layer side of First Laminated Body 6 prepared in (JD) was made to face the positive hole transporting layer of Anode Laminated Body 6 and overlapped so that the striped pattern in the lateral direction of light emitting pixels coincided with the striped pattern of the anode. Subsequently, overlapping was carried out by rotating the long side direction by 90 degrees as shown in FIG. 21.

Heat and pressure were applied onto the support side of the first laminated body 5 via conveyance at a rate of 0.05 m/minute between paired rollers exhibiting a pressing pressure of 0.3 MPa (one roller being a 160° C. heating roller), whereby First Laminated Body 6 and Anode Laminated Body 6 were laminated.

Subsequently, an aluminum lead was extended from each of the lines of the anode and the cathode, whereby a 32-pixel× 32-pixel passive driving type full-color organic EL element, composed of a cathode substrate/cathode/electron transporting layer/light emitting layer/positive hole transporting layer/anode/anode substrate, was prepared.

(F) Sealing of Side Section

UV curing type epoxy based adhesive agent XNR5493T (produced by Nagase Ciba Co., Ltd.) was coated in the adhesive agent position shown in FIG. 2 of the organic EL element, prepared as above, to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby Comparative organic EL Element 6 was prepared. The above sealing was carried out in the globe box in which ambient air was replaced with nitrogen. The dew point was −60° C., and oxygen concentration was 10 ppm.

(Preparation of Organic EL Element 7)

Full-color organic EL element 7 composed of a cathode substrate/cathode/electron transporting layer/positive hole blocking layer/light emitting layer/positive hole transporting layer/anode/anode substrate was prepared in the same manner as Example 1, except that organic layers other than the light emitting layer were prepared via vapor deposition.

(A) Preparation of Cathode Laminated Body 7 (Cathode Substrate/Cathode/Electron Transporting Layer/Positive Hole Blocking Layer)

Both sides of an Al foil (at a thickness of 30 μm) was laminated with a 50 μm thick polyimide sheet (UPILEX SOS, produced by Ube Industries, Ltd.), and the resulting foil was cut to 35 mm×40 mm, whereby a cathode substrate was prepared.

The above cathode substrate was placed in a cleaning vessel. After cleaning it with i-propyl alcohol (IPA), an oxygen plasma treatment was applied. Subsequently, a mask (a mask arranged with stripes of a line width of 300 μm and an interval of 30 μm, shown in FIG. 12) for deposition, which had been subjected to patterning, was arranged, and Al was vapor-deposited at a reduced pressure of about 0.1 mPa, whereby a 0.2 μm thick striped cathode was formed (refer to FIG. 13).

Further, as an electron injecting material, LiF was vapor-deposited in the same pattern as the Al layer, whereby a 3 nm thick electron injecting layer was formed.

Subsequently, the above mask was removed, and electron transporting material $Alq_3$ was vapor-deposited at a reduced pressure ambience of about 0.1 mPa to form a 40 nm thick electron transporting layer. Finally, positive hole blocking material $BAlq_3$ was vapor-deposited at a pressure reduced ambience of about 0.1 mPa to form a 10 nm thick positive hole blocking layer, whereby Cathode Laminated Body 7 was prepared.

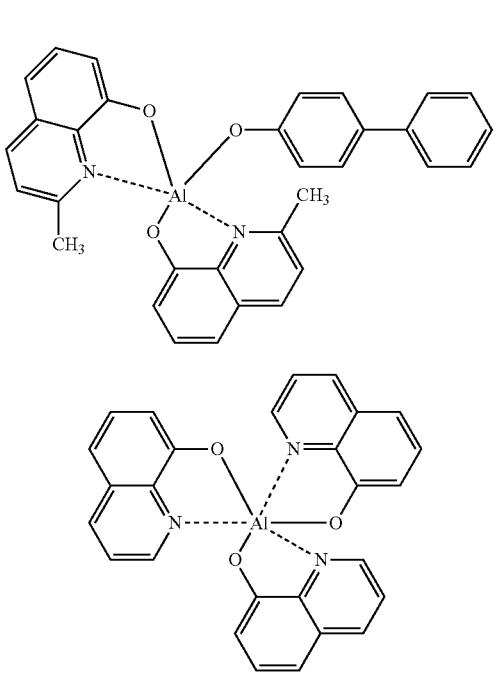

(B) Preparation of Anode Laminated Body 7 (Anode Substrate/Anode/Positive Hole Transporting Layer)

A 0.7 mm×35 mm×40 mm glass plate, employed as an anode substrate, was introduced into a vacuum chamber, and a mask (a mask arranged with stripes of a line width of 960 μm and an interval of 30 μm, shown in FIG. 14) for deposition, which had been subjected to patterning, was arranged. Subsequently, employing an ITO target (a mole ratio of indium: tin of 95:5) containing 10% $SnO_2$ by weight, a striped anode composed of a 0.2 μm thick ITO thin layer was formed via DC magnetron sputtering (conditions: temperature of the substrate support of 250° C. and an oxygen pressure of $1×10^{-3}$ Pa) (refer to FIG. 15).

The surface conductivity of the above node was 10Ω/□. The anode substrate, on which the above anode was formed, was placed in a cleaning vessel and cleaned with isopropyl alcohol, followed by an oxygen plasma treatment. N,N'-di-naphthyl-N,N' diphenylbendizine (α-NPD) underwent vacuum deposition on the surface of the treated transparent electrode to prepare a 40 nm thick positive hole transporting layer, whereby Anode Laminated Body B was prepared.

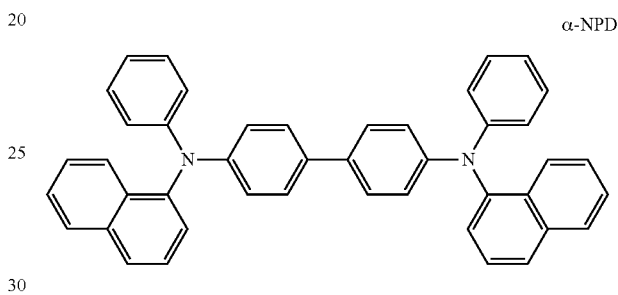

(C) Formation of Light Emitting Organic Layer which was Subjected to Patterning onto Transfer Sheet: Mask Transfer Method (1) Preparation of Primary Transfer Sheet (a) Preparation of Primary Transfer Sheet for Blue Polyvinyl carbazole (Mw of 63,000, produced by Aldrich Co.), and iridium complex (Ir-12) as an orthometal complex at a weight ratio of 40:1 were dissolved in dichloromethane. The resulting liquid coating composition was applied onto a 5 μm thick temporary support composed of a PET film (produced by Teijin Ltd.) via an extrusion type coating apparatus and dried, whereby a 40 nm thick blue light emitting layer was prepared.

(b) Preparation of Primary Transfer Sheet for Green

Polyvinyl carbazole (Mw of 63,000, produced by Aldrich Co.), and tris(2-phenylpyridine)iridium complex (Ir-1) as an orthometal complex at a weight ratio of 40:1 were dissolved in dichloromethane. The resulting liquid coating composition was applied onto a 5 m thick temporary support composed of a PET film (produced by Teijin Ltd.) via an extrusion type coating apparatus and dried, whereby a 40 nm thick green light emitting layer was prepared.

(c) Preparation of Red Primary Transfer Sheet

Polyvinyl carbazole (Mw of 63,000, produced by Aldrich Co.), and iridium complex (Ir-9) as an orthometal complex at a weight ratio of 40:1 were dissolved in dichloromethane. The resulting liquid coating composition was applied onto a 5 μm thick temporary support composed of a PET film (produced by Teijin Ltd.) via an extrusion type coating apparatus and dried, whereby a 40 nm thick red light emitting layer was prepared.

As described above, three types of primary transfer materials of blue, green, and red light emitting organic layers were prepared on the temporary support.

(2) Preparation of Transfer Sheet which were Subjected to B, G, and R Patterning.

On the temporary support for a transfer sheet composed of 5 μm thick PET film (produced by Teijin Ltd.), sequentially overlapped were a striped mask (of 50 mm×50 mm, and a thickness of 30 μm, having a holes in a striped pattern of a longitudinal length of 970 μm and a lateral length of 310 μm and longitudinal and lateral cycles of 990 μm, refer to FIG. 22), the organic layer side of the primary transfer sheet for blue, and the pressing plate (50 mm×50 mm, a longitudinal length of 970 μm and a lateral length of 300 μm, a longitudinal and lateral cycle of 990 μm, having projections of a height of 30 μm (refer to FIG. 23)) so that the center of the mask hole coincided with the projection of the pressing plate. Subsequently, heat and pressure were applied onto the support side of the primary transfer sheet via conveyance at a rate of 0.05 m/minute between paired rollers exhibiting a pressing pressure of 0.3 MPa (one roller being a 160° C. heating roller). Subsequently, by peeling the pressing plate, the primary transfer sheet, and the mask from the temporary support, a blue light emitting layer was transferred onto the transfer sheet (refer to FIG. 17).

Subsequently, the mask, the primary transfer sheet for green, and the pressing plate were overlapped by a shift of one third cycle (330 μm) in the lateral direction of the pixels so that blue and green pixels were not overlapped, and the green light emitting layer was transferred onto a transfer sheet in the same manner as the blue light emitting layer (refer to FIG. 18).

Finally, the mask, the primary transfer sheet for red, and the pressing plate were overlapped by a shift of one third cycle (330 μm) in the lateral direction of the pixels so that blue, green, and red pixels were not overlapped, and the red light emitting layer was transferred in the same manner as the green light emitting layer, whereby a transfer sheet, which had been subjected to B, G, and red patterning, was prepared (refer to FIG. 19).

(D) Transfer of Light Emitting Organic Layer to Cathode Laminated Body 7

The electron transporting side of Cathode Laminated Body 6 prepared in (A) was overlapped on the light emitting layer side of the transfer sheet prepared in (C) which had been subjected to B, G, and R patterning so that light emitting pixels and the striped pattern in the longitudinal direction of the cathode coincided. Heat and pressure were applied onto the rear side of the transfer sheet via conveyance at a rate of 0.05 m/minute between paired rollers exhibiting a pressing pressure of 0.3 MPa (one roller being a 160° C. heating roller). Subsequently, by peeling the transfer sheet from the cathode substrate, B, G, and R three-color light emitting layer was transferred onto Cathode Laminated Body 7 (cathode substrate/cathode/electron transporting layer), prepared in (A), whereby First Laminated Body 7 (refer to FIG. 20) was prepared.

(E) Lamination of First Laminated Body 7 with Anode Laminated Body 7

The light emitting layer side of First Laminated Body 7 prepared in (D) was made to face the positive hole transporting layer of Anode Laminated Body 7 and overlapped so that the striped pattern in the lateral direction of light emitting pixels coincided with the striped pattern of the anode. Subsequently, overlapping was carried out by rotating the long side direction by 90 degrees as shown in FIG. 21.

Heat and pressure were applied onto the support side of First Laminated Body 7 via conveyance at a rate of 0.05 m/minute between paired rollers exhibiting a pressing pressure of 0.3 MPa (one roller being a 160° C. heating roller), whereby First Laminated Body 7 and Anode Laminated Body 7 were laminated.

Subsequently, an aluminum lead was extended from each of the lines of the anode and the cathode, whereby a 32-pixel× 32-pixel passive driving type full-color organic EL element, composed of a cathode substrate/cathode/electron transporting layer/light emitting layer/positive hole transporting layer/anode/anode substrate, was prepared.

(F) Sealing of Side Section

UV curing type epoxy based adhesive agent XNR5493T (produced by Nagase Ciba Co., Ltd.) was coated in the adhesive agent position shown in FIG. 2 of the organic EL element, prepared as above, to reach a layer thickness of 1 mm, employing a dispenser. After coating, ultraviolet radiation at an intensity of 100 mW/cm$^2$ was exposed onto both sides of the organic EL element, employing a high pressure mercury lamp, to result in curing, whereby comparative organic EL element 7 was prepared. Meanwhile, the above sealing was carried out in the globe box in which ambient air was replaced with nitrogen. The dew point was −60° C., and oxygen concentration was 10 ppm.

(Evaluation of Organic EL Elements)

Organic EL elements 1-7, prepared as above, were evaluated via the following methods.

By employing SOURCE MAJOR UNIT TYPE 2400 (produced by Toyo Technica Inc.), direct current voltage was applied to each of the organic EL elements to achieve light emission. During the above light emission, voltage which resulted in maximum luminance Lmax (cd/m$^2$) was designated as Vmax(V). Further, luminous efficiency η200(%) was determined at 200 cd/m$^2$. Further, the lead line extended from each of the electrodes was connected to the external driving circuit and the light emitting state of each pixel was checked, followed by counting poor pixels.

Further, after storing the above organic EL elements at 85° C. and 95% relative humidity for 30 days, Lmax, Vmax, and η200 were determined. Still further, the light emission state of each pixel was checked, followed by counting the number of poor pixels.

Table 1 shows the evaluation results.

TABLE 1

| Organic EL Element No. | Wet Process Usage Rate of Non-light Emitting Organic Layer | Storage Duration | Lmax (cd/m$^2$) | Vmax (V) | η200 (%) | Poor Pixel (number of pieces) | Remarks |
|---|---|---|---|---|---|---|---|
| 1 | 100 | beginning | 48,000 | 12 | 13.5 | 0 | Inv. |
|   |     | after 30 days | 46,000 | 12 | 13.0 | 0 |  |
| 2 | 100 | beginning | 51,000 | 12 | 14.0 | 0 | Inv. |
|   |     | after 30 days | 47,000 | 12 | 13.5 | 0 |  |
| 3 | 100 | beginning | 52,000 | 12 | 14.1 | 0 | Inv. |
|   |     | after 30 days | 48,000 | 12 | 13.6 | 0 |  |
| 4 | 100 | beginning | 53,000 | 12 | 14.5 | 0 | Inv. |
|   |     | after 30 days | 50,000 | 12 | 14.0 | 0 |  |
| 5 | 100 | beginning | 51,000 | 12 | 14.1 | 0 | Inv. |
|   |     | after 30 days | 50,000 | 12 | 13.7 | 0 |  |
| 6 | 71  | beginning | 55,000 | 12 | 14.1 | 0 | Comp. |
|   |     | after 30 days | 42,000 | 12 | 12.5 | 3 |  |

TABLE 1-continued

| Organic EL Element No. | Wet Process Usage Rate of Non-light Emitting Organic Layer | Storage Duration | Lmax (cd/m$^2$) | Vmax (V) | η200 (%) | Poor Pixel (number of pieces) | Re- marks |
|---|---|---|---|---|---|---|---|
| 7 | 0 | beginning | 72,000 | 12 | 15.3 | 0 | Comp. |
|   |   | after 30 days | 45,000 | 20 | 12.1 | 7 |   |

Inv.: Present Invention, Comp.: Comparative Example

Organic EL Elements 1-5 of the present invention, even though all the primary transfer materials of the electron transporting layer on the cathode substrate, the positive hole transporting organic layer on the anode substrate, and the light emitting layer on the temporary support are prepared via wet processes, exhibit performance equal to better than Organic EL Elements 6 and 7 of Comparative Examples. According to the method of the present invention, it is found that by the production method in which wet processes of high production efficiency are mainly employed, it is possible to prepare a high performance full-color organic EL element.

According to the present invention, it is possible to efficiently produce organic EL elements at low cost employing wet processes and to easily prepare elements of a large area. Further, since the organic EL elements of the present invention have a laminated structure, advantages, such as high adhesion between layers, excellent durability, and minimal problems such as dark spots, are realized.

What is claimed is:

1. A method of producing an organic electroluminescent element comprising a laminated body incorporating an anode substrate, an anode, at least one non-light emitting organic layer A exhibiting positive hole transportability, at least one light emitting organic layer B, at least one non-light emitting organic layer C exhibiting electron transportability, a cathode, and a cathode substrate in the sequence set forth, the method comprising:

laminating, on the anode substrate, the anode and the organic layer A in that order to form a partially laminated body;

laminating, on the cathode substrate, the cathode and the organic layer C in that order to form a partially laminated body;

forming the organic layer B on a temporary support;

superposing the organic layer B side on the temporary support with the organic layer side of the partially laminated body on the anode substrate or the organic layer side of the partially laminated body on the cathode substrate, followed by subjecting to a heat treatment or a pressure treatment so as to transfer the organic layer B onto the organic layer side of the partially laminated body on the anode substrate or onto the organic layer side of the partially laminated body on the cathode substrate;

superposing the organic layer B side of the substrate to which the organic layer B has been transferred with the organic layer side of the partially laminated body on another substrate to which the organic layer B has not been transferred, followed by subjecting to a heat treatment or a pressure treatment so as to form the laminated body; and sealing an entire periphery of the side of the laminated body with an adhesive.

2. The method of producing the organic electroluminescent element of claim 1, further comprising:

forming three-color light emitting pixels of blue, green, and red, via a patterning method on at least one organic layer B formed on the temporary support.

3. An organic electroluminescent element formed by the method of claim 1.

* * * * *